US012155066B2

(12) United States Patent
Costantino et al.

(10) Patent No.: US 12,155,066 B2
(45) Date of Patent: *Nov. 26, 2024

(54) DECOMPOSITION OF SILICON-CONTAINING PRECURSORS ON POROUS SCAFFOLD MATERIALS

(71) Applicant: Group14 Technologies, Inc., Woodinville, WA (US)

(72) Inventors: Henry R. Costantino, Woodinville, WA (US); Aaron M. Feaver, Seattle, WA (US); Avery J. Sakshaug, Snohomish, WA (US); Christopher Timmons, Monroe, WA (US)

(73) Assignee: Group14 Technologies, Inc., Woodinville, WA (US)

( * ) Notice: Subject to any disclaimer, the term of this patent is extended or adjusted under 35 U.S.C. 154(b) by 45 days.

This patent is subject to a terminal disclaimer.

(21) Appl. No.: 18/156,926

(22) Filed: Jan. 19, 2023

(65) Prior Publication Data

US 2023/0327087 A1 Oct. 12, 2023

Related U.S. Application Data

(63) Continuation of application No. 16/491,423, filed as application No. PCT/US2018/021843 on Mar. 9, 2018, now Pat. No. 11,611,071.

(Continued)

(51) Int. Cl.

*H01M 4/36* (2006.01)
*B01J 23/34* (2006.01)

(Continued)

(52) U.S. Cl.

CPC ............ *H01M 4/366* (2013.01); *B01J 23/34* (2013.01); *B01J 23/72* (2013.01); *B01J 23/745* (2013.01);

(Continued)

(58) Field of Classification Search

CPC ............................ C23C 16/56; H01M 4/1393

See application file for complete search history.

(56) References Cited

U.S. PATENT DOCUMENTS 3,518,123 A 6/1970 Katsoulis et al.
3,582,288 A 6/1971 Taylor et al.

(Continued)

FOREIGN PATENT DOCUMENTS

CA 2176452 A1 11/1997
CN 1762900 A 4/2006

(Continued)

OTHER PUBLICATIONS

"A Basic Guide to Particle Characterization," Malvern Instruments Worldwide—White Paper, Retrieved from the Internet: URL:http://golik.co.il/Data/ABasicGuidtoParticleCharacterization(2)1962085150.pdf, XP55089322A, 2012. (26 Pages).

(Continued)

*Primary Examiner* — Robert A Vetere
(74) *Attorney, Agent, or Firm* — Seed IP Law Group LLP

(57) ABSTRACT

Composites of silicon and various porous scaffold materials, such as carbon material comprising micro-, meso- and/or macropores, and methods for manufacturing the same are provided. The compositions find utility in various applications, including electrical energy storage electrodes and devices comprising the same.

20 Claims, 7 Drawing Sheets

Related U.S. Application Data

(60) Provisional application No. 62/469,424, filed on Mar. 9, 2017.

(51) Int. Cl.

| | |
|---|---|
| ***B01J 23/72*** | (2006.01) |
| ***B01J 23/745*** | (2006.01) |
| ***B01J 23/755*** | (2006.01) |
| ***C23C 16/24*** | (2006.01) |
| ***C23C 16/56*** | (2006.01) |
| ***H01G 11/06*** | (2013.01) |
| ***H01G 11/24*** | (2013.01) |
| ***H01G 11/34*** | (2013.01) |
| ***H01G 11/38*** | (2013.01) |
| ***H01G 11/50*** | (2013.01) |
| ***H01G 11/86*** | (2013.01) |
| ***H01M 4/04*** | (2006.01) |
| ***H01M 4/1393*** | (2010.01) |
| ***H01M 4/1395*** | (2010.01) |
| ***H01M 4/38*** | (2006.01) |
| ***H01M 4/587*** | (2010.01) |

(52) U.S. Cl.

CPC ............. *B01J 23/755* (2013.01); *C23C 16/24* (2013.01); *C23C 16/56* (2013.01); *H01G 11/06* (2013.01); *H01G 11/24* (2013.01); *H01G 11/34* (2013.01); *H01G 11/38* (2013.01); *H01G 11/50* (2013.01); *H01G 11/86* (2013.01); *H01M 4/0428* (2013.01); *H01M 4/1393* (2013.01); *H01M 4/1395* (2013.01); *H01M 4/364* (2013.01); *H01M 4/386* (2013.01); *H01M 4/587* (2013.01)

(56) References Cited

U.S. PATENT DOCUMENTS 3,619,428 A 11/1971 David
3,876,505 A 4/1975 Stoneburner
3,892,580 A 7/1975 Messing
3,977,901 A 8/1976 Buzzelli
4,082,694 A 4/1978 Wennerberg et al.
4,159,913 A 7/1979 Birchall et al.
4,198,382 A 4/1980 Matsui
4,543,341 A 9/1985 Barringer et al.
4,580,404 A 4/1986 Pez et al.
4,769,197 A 9/1988 Kromrey
4,843,015 A 6/1989 Grubbs, Jr. et al.
4,862,328 A 8/1989 Morimoto et al.
4,873,218 A 10/1989 Pekala
4,954,469 A 9/1990 Robinson
4,997,804 A 3/1991 Pekala
4,999,330 A 3/1991 Bose et al.
5,061,416 A 10/1991 Willkens et al.
5,093,216 A 3/1992 Azuma et al.
5,260,855 A 11/1993 Kaschmitter et al.
5,294,498 A 3/1994 Omaru et al.
5,416,056 A 5/1995 Baker
5,420,168 A 5/1995 Mayer et al.
5,465,603 A 11/1995 Anthony et al.
5,508,341 A 4/1996 Mayer et al.
5,529,971 A 6/1996 Kaschmitter et al.
5,614,460 A 3/1997 Schwarz et al.
5,626,637 A 5/1997 Baker
5,626,977 A 5/1997 Mayer et al.
5,643,426 A * 7/1997 Imoto .................... H01M 4/13
252/502
5,670,571 A 9/1997 Gabrielson et al.
5,674,642 A 10/1997 Le et al.
5,710,092 A 1/1998 Baker
5,726,118 A 3/1998 Ivey et al.
5,744,258 A 4/1998 Bai et al.
5,789,338 A 8/1998 Kaschmitter et al.
5,834,138 A 11/1998 Yamada et al.
5,858,486 A 1/1999 Metter et al.
5,882,621 A 3/1999 Doddapaneni et al.
5,891,822 A 4/1999 Oyama et al.
5,908,896 A 6/1999 Mayer et al.
5,945,084 A 8/1999 Droege
5,965,483 A 10/1999 Baker et al.
6,006,797 A 12/1999 Bülow et al.
6,064,560 A 5/2000 Hirahara et al.
6,069,107 A 5/2000 Kuznetsov et al.
6,072,693 A 6/2000 Tsushima et al.
6,096,456 A 8/2000 Takeuchi et al.
6,117,585 A 9/2000 Anani et al.
6,147,213 A 11/2000 Poli et al.
6,153,562 A 11/2000 Villar et al.
6,205,016 B1 3/2001 Niu
6,225,257 B1 5/2001 Putyera et al.
6,242,127 B1 6/2001 Paik et al.
6,268,081 B1 7/2001 Clough
6,309,446 B1 10/2001 Nakanoya et al.
6,310,762 B1 10/2001 Okamura et al.
6,339,528 B1 1/2002 Lee et al.
6,509,119 B1 1/2003 Kobayashi et al.
6,574,092 B2 6/2003 Sato et al.
6,592,838 B1 7/2003 Nomoto et al.
6,631,072 B1 10/2003 Paul et al.
6,631,073 B1 10/2003 Sakata et al.
6,697,249 B2 2/2004 Maletin et al.
6,764,667 B1 7/2004 Steiner, III
6,815,105 B2 11/2004 Cooper et al.
6,865,068 B1 3/2005 Murakami et al.
7,245,478 B2 7/2007 Zhong et al.
7,419,649 B2 9/2008 Lundquist et al.
7,582,902 B2 9/2009 Tano et al.
7,626,804 B2 12/2009 Yoshio et al.
7,722,991 B2 5/2010 Zhang et al.
7,723,262 B2 5/2010 Feaver et al.
7,754,178 B2 7/2010 Tano et al.
7,785,495 B2 8/2010 Kikuchi et al.
7,816,413 B2 10/2010 Feaver et al.
7,835,136 B2 11/2010 Feaver et al.
8,158,556 B2 4/2012 Feaver et al.
8,293,818 B2 10/2012 Costantino et al.
8,329,252 B2 12/2012 Markavov et al.
8,361,659 B2 1/2013 Richard
8,366,979 B2 2/2013 Dai et al.
8,404,384 B2 3/2013 Feaver et al.
8,411,415 B2 4/2013 Yoshinaga et al.
8,467,170 B2 6/2013 Feaver et al.
8,480,930 B2 7/2013 Suh et al.
8,482,900 B2 7/2013 Gadkaree et al.
8,580,870 B2 11/2013 Costantino et al.
8,654,507 B2 2/2014 Costantino et al.
8,691,177 B2 4/2014 Pfeifer et al.
8,709,971 B2 4/2014 Feaver et al.
8,734,991 B2 5/2014 Takano et al.
8,797,717 B2 8/2014 Feaver et al.
8,906,978 B2 12/2014 Costantino et al.
8,916,296 B2 12/2014 Feaver et al.
8,999,202 B2 4/2015 Mulik et al.
9,005,812 B2 4/2015 Ma et al.
9,067,848 B2 6/2015 Stadie et al.
9,112,230 B2 8/2015 Feaver et al.
9,133,295 B2 9/2015 Qureshi et al.
9,133,337 B2 9/2015 Ludvik et al.
9,136,064 B2 9/2015 Gadkaree et al.
9,186,174 B2 11/2015 Krishnan
9,269,502 B2 2/2016 Chang et al.
9,287,556 B2 3/2016 Neumann et al.
9,409,777 B2 8/2016 Geramita et al.
9,412,523 B2 8/2016 Costantino et al.
9,464,162 B2 10/2016 Kron et al.
9,580,321 B2 2/2017 Feaver et al.
9,666,860 B2 5/2017 Lam et al.
9,680,159 B2 6/2017 Feaver et al.
9,704,685 B2 7/2017 Lozano et al.
9,714,172 B2 7/2017 Geramita et al.
9,985,289 B2 5/2018 Costantino et al.
10,008,338 B2 6/2018 Stadermann et al.

(56) References Cited

U.S. PATENT DOCUMENTS 10,049,824 B2 8/2018 Tsukada et al.
10,141,122 B2 11/2018 Feaver et al.
10,147,950 B2 12/2018 Sakshaug et al.
10,173,900 B2 1/2019 Ludvik et al.
10,195,583 B2 2/2019 Costantino et al.
10,273,328 B2 4/2019 Kron et al.
10,287,170 B2 5/2019 Feaver et al.
10,361,428 B2 7/2019 Kim et al.
10,454,094 B2 10/2019 Xia et al.
10,454,103 B2 10/2019 Sakshaug et al.
10,490,358 B2 11/2019 Feaver et al.
10,522,836 B2 12/2019 Thompkins et al.
10,590,277 B2 3/2020 Costantino et al.
10,600,581 B2 3/2020 Feaver et al.
10,608,254 B2 3/2020 Sakshaug et al.
10,711,140 B2 7/2020 Costantino et al.
10,714,744 B2 7/2020 Sakshaug et al.
10,756,347 B2 8/2020 Sakshaug et al.
10,763,501 B2 9/2020 Feaver et al.
10,784,512 B2 9/2020 Sakshaug et al.
10,814,304 B2 10/2020 Costantino et al.
10,923,722 B2 2/2021 Sakshaug et al.
11,174,167 B1 11/2021 Dhanabalan et al.
11,335,903 B2 5/2022 Costantino et al.
11,401,363 B2 8/2022 Geramita et al.
11,437,621 B2 9/2022 Sakshaug et al.
11,495,793 B2 11/2022 Sakshaug et al.
11,495,798 B1 11/2022 Sakshaug et al.
11,611,071 B2 * 3/2023 Costantino .......... H01M 4/1393
2001/0002086 A1 5/2001 Webb
2002/0031706 A1 3/2002 Dasgupta et al.
2002/0031710 A1 3/2002 Kezuka et al.
2002/0036885 A1 3/2002 Lee et al.
2002/0075627 A1 6/2002 Shinozaki et al.
2002/0104474 A1 8/2002 Wakamatsu et al.
2002/0114126 A1 8/2002 Hirahara et al.
2002/0122985 A1 9/2002 Sato et al.
2002/0168314 A1 11/2002 Roemmler
2002/0172637 A1 11/2002 Chesneau et al.
2003/0012722 A1 1/2003 Liu
2003/0013606 A1 1/2003 Hampden-Smith et al.
2003/0013804 A1 1/2003 Phillips et al.
2003/0064564 A1 4/2003 Lin
2003/0108785 A1 6/2003 Wu et al.
2003/0170548 A1 9/2003 Otsuki et al.
2004/0010090 A1 1/2004 Chino et al.
2004/0106040 A1 6/2004 Fukuoka et al.
2004/0132845 A1 7/2004 Rhine et al.
2004/0141963 A1 7/2004 Umekawa
2004/0180264 A1 9/2004 Honbo et al.
2004/0182711 A1 9/2004 Liang et al.
2004/0241237 A1 12/2004 Pirard et al.
2004/0248730 A1 12/2004 Kim et al.
2004/0248790 A1 12/2004 Hinuma et al.
2005/0014643 A1 1/2005 Lini et al.
2005/0041370 A1 2/2005 Wilk et al.
2005/0058589 A1 3/2005 Lundquist et al.
2005/0058907 A1 3/2005 Kurihara et al.
2005/0079349 A1 4/2005 Hampden-Smith et al.
2005/0079359 A1 4/2005 Fujita et al.
2005/0135993 A1 6/2005 Xu et al.
2005/0153130 A1 7/2005 Long et al.
2005/0196336 A1 9/2005 Chatterjee et al.
2005/0221981 A1 10/2005 Wagh et al.
2005/0233195 A1 10/2005 Arnold et al.
2005/0250011 A1 11/2005 Mitchell et al.
2005/0253220 A1 11/2005 Lin et al.
2005/0266990 A1 12/2005 Iwasaki et al.
2005/0282062 A1 12/2005 Manako et al.
2006/0008408 A1 1/2006 Ho Yoon et al.
2006/0057355 A1 3/2006 Suzuki et al.
2006/0079587 A1 4/2006 Albert et al.
2006/0093915 A1 5/2006 Lundquist et al.
2006/0223965 A1 10/2006 Trifu
2006/0240979 A1 10/2006 Hirahara et al.
2007/0002523 A1 1/2007 Ando
2007/0008677 A1 1/2007 Zhong et al.
2007/0048605 A1 3/2007 Pez et al.
2007/0104981 A1 5/2007 Lam et al.
2007/0142222 A1 6/2007 Erkey et al.
2007/0166602 A1 7/2007 Burchardt
2008/0011986 A1 1/2008 Yamakawa et al.
2008/0044726 A1 2/2008 Feng et al.
2008/0107804 A1 5/2008 Kondo
2008/0112876 A1 5/2008 Dailey
2008/0132632 A1 6/2008 Schiraldi et al.
2008/0145757 A1 6/2008 Mah et al.
2008/0145761 A1 6/2008 Petrat et al.
2008/0201925 A1 8/2008 Zhong et al.
2008/0204973 A1 8/2008 Zhong et al.
2008/0206638 A1 8/2008 Takahashi et al.
2008/0241640 A1 10/2008 Rajeshwar et al.
2008/0268297 A1 10/2008 Quayle et al.
2008/0293911 A1 11/2008 Qureshi et al.
2008/0297981 A1 12/2008 Endo et al.
2008/0299456 A1 12/2008 Shiga et al.
2009/0035344 A1 2/2009 Thomas et al.
2009/0053594 A1 2/2009 Johnson et al.
2009/0097189 A1 4/2009 Tasaki et al.
2009/0104509 A1 4/2009 Kwak et al.
2009/0104530 A1 4/2009 Shizuka et al.
2009/0114544 A1 5/2009 Rousseau et al.
2009/0117466 A1 5/2009 Zhamu et al.
2009/0145482 A1 6/2009 Mitzi et al.
2009/0185327 A1 7/2009 Seymour
2009/0213529 A1 8/2009 Gogotsi et al.
2009/0253248 A1 10/2009 Sun et al.
2009/0286160 A1 11/2009 Kozono et al.
2009/0305131 A1 12/2009 Kumar et al.
2010/0008021 A1 1/2010 Hu et al.
2010/0047671 A1 2/2010 Chiang et al.
2010/0051881 A1 3/2010 Ahn et al.
2010/0092370 A1 4/2010 Zhang et al.
2010/0097741 A1 4/2010 Zhong et al.
2010/0098615 A1 4/2010 Tennison et al.
2010/0110613 A1 5/2010 Zhong et al.
2010/0163791 A1 7/2010 Fukui et al.
2010/0215563 A1 8/2010 Yambayashi
2010/0279172 A1 11/2010 Hwang et al.
2010/0288970 A1 11/2010 Watanabe et al.
2010/0310941 A1 12/2010 Kumta et al.
2010/0316907 A1 12/2010 Yamamoto et al.
2011/0053765 A1 3/2011 Feaver et al.
2011/0111284 A1 5/2011 Maeshima et al.
2011/0159375 A1 6/2011 Feaver et al.
2011/0177393 A1 7/2011 Park et al.
2011/0200848 A1 8/2011 Chiang et al.
2011/0261501 A1 10/2011 Gadkaree et al.
2011/0281180 A1 11/2011 Kim et al.
2011/0287189 A1 11/2011 Shembel
2011/0300447 A1 12/2011 Archer
2011/0311873 A1 12/2011 Schultz et al.
2012/0045685 A1 2/2012 Seki et al.
2012/0129049 A1 5/2012 Rayner
2012/0156493 A1 6/2012 Maisels et al.
2012/0156567 A1 6/2012 Ayme-Perrot et al.
2012/0183856 A1 7/2012 Cui et al.
2012/0241691 A1 9/2012 Soneda et al.
2012/0251876 A1 10/2012 Jagannathan
2012/0262127 A1 10/2012 Feaver et al.
2012/0264020 A1 10/2012 Burton et al.
2012/0305651 A1 12/2012 Anderson et al.
2012/0308870 A1 12/2012 Okuda et al.
2012/0321959 A1 12/2012 Yushin et al.
2013/0082213 A1 4/2013 Duncan et al.
2013/0169238 A1 7/2013 Rojeski
2013/0189472 A1 7/2013 Takaoka
2013/0189575 A1 7/2013 Anguchamy et al.
2013/0196158 A1 8/2013 Yoshida et al.
2013/0244862 A1 9/2013 Ivanovici et al.
2013/0252082 A1 9/2013 Thompkins et al.
2013/0295462 A1 11/2013 Atanassova et al.
2013/0337334 A1 12/2013 Tao et al.
2013/0344363 A1 12/2013 Upadhyaya

(56) References Cited

U.S. PATENT DOCUMENTS

2013/0344391 A1* 12/2013 Yushin .................. H01M 4/366 429/218.1
2014/0038042 A1 2/2014 Rios et al.
2014/0057179 A1 2/2014 Yushin et al.
2014/0148560 A1 5/2014 Qureshi et al.
2014/0170482 A1 6/2014 Park et al.
2014/0272592 A1 9/2014 Thompkins et al.
2014/0287317 A1 9/2014 Tiquet et al.
2014/0302396 A1 10/2014 Lu et al.
2014/0335410 A1 11/2014 Loveridge et al.
2015/0037249 A1 2/2015 Fu
2015/0087731 A1 3/2015 Dong et al.
2015/0155546 A1 6/2015 Yushin et al.
2015/0162603 A1 6/2015 Yushin et al.
2015/0207148 A1 7/2015 Kimura et al.
2015/0238917 A1 8/2015 Mulik et al.
2015/0306570 A1 10/2015 Mayes et al.
2016/0010250 A1 1/2016 Taninaka et al.
2016/0039970 A1 2/2016 Kron et al.
2016/0043384 A1 2/2016 Zhamu et al.
2016/0104882 A1 4/2016 Yushin et al.
2016/0122185 A1 5/2016 Feaver et al.
2016/0133394 A1 5/2016 Sakshaug et al.
2016/0344030 A1 11/2016 Sakshaug et al.
2016/0372750 A1 12/2016 Chang et al.
2017/0152340 A1 6/2017 Geramita et al.
2017/0316888 A1 11/2017 Geramita et al.
2018/0097240 A1 4/2018 Feaver et al.
2018/0294484 A1 10/2018 Fredrick et al.
2018/0331356 A1 11/2018 Feaver et al.
2019/0088931 A1 3/2019 Abrahamson et al.
2019/0097222 A1 3/2019 Feaver et al.
2019/0103608 A1 4/2019 Costantino et al.
2019/0144287 A1 5/2019 Park et al.
2019/0259546 A1 8/2019 Kron et al.
2020/0020935 A1 1/2020 Costantino et al.
2020/0048098 A1 2/2020 Feaver et al.
2020/0144619 A1 5/2020 Hamilton et al.
2020/0259178 A1 8/2020 Chang et al.
2020/0259181 A1 8/2020 Thompkins et al.
2020/0280070 A1 9/2020 Sakshaug et al.
2020/0290882 A1 9/2020 Fredrick et al.
2020/0373561 A1 11/2020 Mason et al.
2021/0054213 A1 2/2021 Costantino et al.
2021/0057736 A1 2/2021 Feaver et al.
2021/0126251 A1 4/2021 Sakshaug et al.
2021/0175498 A1 6/2021 Feaver et al.
2021/0237029 A1 8/2021 Costantino et al.
2021/0276875 A1 9/2021 Mason et al.
2022/0055905 A1 2/2022 Dhanabalan et al.
2022/0055906 A1 2/2022 Costantino et al.
2022/0059818 A1 2/2022 Dhanabalan et al.
2022/0064008 A1 3/2022 Dhanabalan et al.
2022/0074045 A1 3/2022 Yilmaz et al.
2022/0246910 A1 8/2022 Mason et al.
2022/0246914 A1 8/2022 Costantino et al.
2022/0389146 A1 12/2022 Geramita et al.
2023/0016325 A1 1/2023 Geramita et al.
2023/0022154 A1 1/2023 Geramita et al.

FOREIGN PATENT DOCUMENTS

CN 1877888 A 12/2006
CN 1986401 A 6/2007
CN 101284665 A 10/2008
CN 101292389 A 10/2008
CN 101318648 A 12/2008
CN 101604743 A 12/2009
CN 101292389 B 9/2010
CN 101969120 A 2/2011
CN 102214817 A 10/2011
CN 102623680 A 8/2012
CN 102820455 A 12/2012
CN 103094528 A 5/2013
CN 103456929 A 12/2013
CN 103746098 A 4/2014
CN 104108698 A 10/2014
CN 102509781 B 11/2015
CN 105680023 A 6/2016
CN 106207108 A 12/2016
DE 10 2014 211012 A1 12/2015
EP 0 126 191 A2 11/1984
EP 0 649 815 A1 4/1995
EP 0 861 804 A1 9/1998
EP 0 891 943 A1 1/1999
EP 1 049 116 A1 11/2000
EP 1 052 716 A2 11/2000
EP 1 514 859 A2 3/2005
EP 2 117 068 A1 11/2009
EP 2 330 676 A1 6/2011
EP 2 983 186 A1 2/2016
JP 2-300222 A 12/1990
JP 3-90615 A 4/1991
JP H3-137010 A 6/1991
JP 4-59806 A 2/1992
JP 4-139174 A 5/1992
JP 5-117493 A 5/1993
JP 5-156121 A 6/1993
JP 5-311512 A 11/1993
JP 5-320955 A 12/1993
JP 8-59919 A 3/1996
JP 8-112539 A 5/1996
JP 9-63905 A 3/1997
JP 9-275042 A 10/1997
JP 10-297912 A 11/1998
JP 2001-89119 A 4/2001
JP 2001-278609 A 10/2001
JP 2003-303588 A 10/2003
JP 2004-67498 A 3/2004
JP 2004-203715 A 7/2004
JP 2004-221332 A 8/2004
JP 2004-315283 A 11/2004
JP 2005-132696 A 5/2005
JP 2005-136397 A 5/2005
JP 2005-187320 A 7/2005
JP 2006-117475 A 5/2006
JP 2006-248848 A 9/2006
JP 2006-264993 A 10/2006
JP 2007-039289 A 2/2007
JP 2007-115749 A 5/2007
JP 2008-7387 A 1/2008
JP 2008-8539 A 1/2008
JP 2008-94925 A 4/2008
JP 2009-259803 A 11/2009
JP 5339107 B1 11/2013
JP 2015-130287 A 7/2015
JP 5796263 B1 10/2015
JP 2016-27222 A 2/2016
JP 2016-100225 A 5/2016
JP 2016-100226 A 5/2016
JP 2016-132608 A 7/2016
KR 10-2004-0080010 A 9/2004
KR 10-2007-0030881 A 3/2007
KR 10-2011-0130628 A 12/2011
KR 10-2014-0112451 A 9/2014
WO 95/01165 A1 1/1995
WO 02/39468 A2 5/2002
WO 2004/087285 A1 10/2004
WO 2004/099073 A2 11/2004
WO 2005/043653 A1 5/2005
WO 2009/032104 A2 3/2009
WO 2010/138760 A2 12/2010
WO 2011/157013 A1 12/2011
WO 2013/140937 A1 9/2013
WO 2022/035879 A1 2/2022
WO 2022/040327 A1 2/2022
WO 2022/040328 A1 2/2022

(56) References Cited

FOREIGN PATENT DOCUMENTS

WO 2022/067030 A1 3/2022
WO 2022/072715 A1 4/2022

OTHER PUBLICATIONS

"Chemical Basics of Polymer Insulation Materials: 3.6 Implementation Method of Stepwise Polymerization," in Changming Li (eds.), *HITP Harbin Institute of Technology Press*, 2007, pp. 73 (With English Translation) (4 Pages).
"Determination of density by volumetric displacement—Skeleton density by gas pycnometry," International Standard 1(ISO 12154):2014, (17 pages).
Abánades et al., "Experimental Analysis of Direct Thermal Methane Cracking," *International Journal of Hydrogen Energy* 36(20):12877-12886, 2011.
Abraham et al., "A Polymer Electrolyte-Based Rechargeable Lithium/Oxygen Battery," *J. Electrochem. Soc.* 143(1):1-5, Jan. 1996.
Alcañiz-Monge et al., "Methane Storage in Activated Carbon Fibres," *Carbon* 35(2):291-297, 1997.
Alias et al., "Silicon/graphite nanocomposite electrodes prepared by low pressure chemical vapor deposition," *Journal of Power Sources* 174:900-904, 2007.
Al-Muhtaseb et al., "Preparation and Properties of Resourcinol Formaldehyde Organic and carbon Gels," Advanced Materials 15(2):101-114, 2003.
Anderegg, "Grading Aggregates: II—The Application of Mathematical Formulas to Mortars," *Industrial and Engineering Chemistry* 23(9):1058-1064, 1931.
Andreasen et al., "Ueber die Beziehung zwischen Kornabstufung und Zwischenraum in Produkten aus losen Körnern (mit einigen Experimenten)," *Kolloid-Zeitschrift* 50(3):217-228, Mar. 1930, with translation of summary. (17 pages).
Babić et al., "Carbon cryogel as support of platinum nano-sized electrocatalyst for the hydrogen oxidation reaction," *Electrochimica Acta* 51:3820-3826, 2006.
Babić et al., "Characterization of carbon cryogel synthesized by sol-gel polycondensation and freeze-drying," *Carbon* 42:2617-2624, 2004.
Babić et al., "Characterization of carbon cryogels synthesized by sol-gel polycondensation," *J. Serb. Chem. Soc.* 70(1):21-31, 2005.
Barbieri et al., "Capacitance limits of high surface area activated carbons for double layer capacitors," *Carbon* 43:1303-1310, 2005.
Barton et al., "Tailored Porous Materials," *Chem. Mater.* 11:2633-2656, 1999.
Beattie et al., "High-Capacity Lithium-Air Cathodes," *J. Electrochem. Soc.* 156(1):A44-A47, 2009.
Besenhard, "Handbook of battery materials," Weinheim, Wiley—VCH, Weinheim, New York, 398-401, Dec. 31, 1999.
Bock et al., "Structural Investigation of Resorcinol Formaldehyde and Carbon Aerogels Using SAXS and BET," *Journal of Porous Materials* 4:287-294, 1997.
Buiel et al., "Li-insertion in hard carbon anode materials for Li-ion batteries," *Electrochimica Acta* 45:121-130, 1999.
Burchell et al., "Low Pressure Storage of Natural Gas for Vehicular Applications," *The Engineering Society for Advancing Mobility Land Sea Air and Space, Government/Industry Meeting*, Washington D.C., Jun. 19-21, 2000, 7 pages.
Cao et al., "Li-ion capacitors with carbon cathode and hard carbon/stabilized lithium metal powder anode electrodes," *Journal of Power Sources* 213:180-185, Apr. 2012.
Chang et al., "Carbon Materials Comprising Enhanced Electrochemical Properties," U.S. Appl. No. 14/988,625, filed Jan. 5, 2016, 112 pages.
Chmiola et al., "Anomalous Increase in Carbon Capacitance at Pore Sizes Less Than 1 Nanometer," *Science* 313:1760-1763, Sep. 22, 2006.
Constantino et al., "Carbon-Based Compositions With Highly Efficient Volumetric Gas Sorption," filed Nov. 5, 2014, U.S. Appl. No. 14/533,956, 90 pages.
Conway et al., "Partial Molal Volumes of Tetraalkylammonium Halides and Assignment of Individual Ionic Contributions," *Trans. Faraday Soc.* 62:2738-2749, 1966.
Coppey et al., "Fluidized Bed Chemical Vapor Deposition of Silicon on Carbon Nanotubes for Li-Ion Batteries," *Journal of Nanoscience and Nanotechnology* 11(9):8392-8395, 2011.
Costantino et al., "Enhanced Packing of Energy Storage Particles," U.S. Appl. No. 14/150,547, filed Jan. 8, 2014.
Costantino et al., "Enhanced Packing of Energy Storage Particles," U.S. Appl. No. 15/199,343, filed Jun. 30, 2016, 97 pages.
Costantino et al., "Manufacturing Methods for the Production of Carbon Materials," U.S. Appl. No. 14/047,935, filed Oct. 7, 2013, 72 pages.
Czakkel et al., "Influence of drying on the morphology of resorcinol-formaldehyde-based carbon gels," *Microporous and Mesoporous Materials* 86:124-133, 2005.
Débart et al., "α-MnO2 Nanowires: A Catalyst for the O2 Electrode in Rechargeable Lithium Batteries," *Agnew. Chem. Int. Ed.* 47:4521-4524, 2008.
De Lange et al., "Adsorptive characterization of porous solids: Error analysis guides the way," *Microporous and Mesoporous Materials* 200:199-215, Sep. 2014.
Ding et al., "How Conductivities and Viscosities of PC-DEC and PC-EC Solutions of LiBF4, LiPF6, LiBOB, Et4NBF4, and Et4NBF6 Differ and Why," *Journal of The Electrochemical Society* 151(12):A2007-A2015, 2004.
Dinger et al., "Particle Packing III—Discrete versus Continuous Particle Sizes," *Interceram* 41(5):332-334, 1992.
Dinger et al., "Particle Packing IV—Computer Modelling of Particle Packing Phenomena," *Interceram* 42(3):150-152, 1993.
Edward, "Molecular Volumes and the Stokes-Einstein Equation," *Journal of Chemical Education* 47(4):261-270, Apr. 1970.
Eikerling et al., "Optimized Structure of Nanoporous Carbon-Based Double-Layer Capacitors," *Journal of The Electrochemical Society* 152(1):E24-E33, 2005.
Endo et al., "Morphology and organic EDLC applications of chemically activated AR-resin-based carbons," *Carbon* 40:2613-2626, 2002.
Feaver et al., "Activated carbon cryogels for low pressure methane storage," *Carbon* 44:590-593, 2006.
Feaver et al., "Electric Double Layer Capacitance Device," filed Jul. 31, 2014, U.S. Appl. No. 14/448,853, 75 pages.
Feaver et al., "Mesoporous Carbon Materials Comprising Bifunctional Catalysts," filed Nov. 17, 2014, U.S. Appl. No. 14/543,587, 102 pages.
Fotouhi et al., "A Low Cost, Disposable Cable-Shaped AI-Air Battery for Portable Biosensors," *J. Micromech. Microeng.* 26:055011, 2016. (8 pages).
Fraas, "Using vibrations in fluidized beds for processes that do not require a high flow rate of sweep gas, the complex-mode vibration fluidized bed offers lower power needs, attrition rates, and elutriation rates than gas-fluidized beds or rotary kilns," *Mechanical Engineering*:76-79, Jan. 7, 1998.
Fu et al., "Accurate characterization of full pore size distribution of tight sandstones by low-temperature nitrogen gas adsorption and high-pressure mercury intrusion combination method," *Energy Science & Engineering* 9(1):80-100, Sep. 2020.
Furnas, "Grading Aggregates I—Mathematical Relations for Beds of Broken Solids of Maximum Density," *Industrial and Engineering Chemistry* 23(9):1052-1058, 1931.
Gao et al., "Nitrogen-rich graphene from small molecules as high performance anode material," *Nanotechnology* 25:415402, 2014, 8 pages.
Geramita et al., "Preparation of Polymeric Resins and Carbon Materials," U.S. Appl. No. 15/199,318, filed Jun. 30, 2016, 134 pages.
Hahn et al., "A dilatometric study of the voltage limitation of carbonaceous electrodes in aprotic EDLC type electrolytes by charge-induced strain," *Carbon* 44:2523-2533, 2006.

(56) References Cited

OTHER PUBLICATIONS

Hasegawa et al., "Preparation of carbon gel microspheres containing silicon powder for lithium ion battery anodes," *Carbon* 42:2573-2579, 2004.
Hirscher et al., "Are carbon nanostructures an efficient hydrogen storage medium?" *Journal of Alloys and Compounds* 356-357:433-437, 2003.
Hogness et al. "The Thermal Decomposition of Silane," *J. Am. Chem. Soc.* 58(1):108-112, 1936.
Hong et al., "Hydrogen evolution inhibition with diethylenetriamine modification of activated carbon for a lead-acid battery," *RSC Adv.* 4:33574-33577, 2014.
Hsieh et al., "Synthesis of mesoporous carbon composite and its electric double-layer formation behavior," *Microporous and Mesoporous Materials* 93:232-239, 2006.
Hu et al., "Effects of electrolytes and electrochemical pretreatments on the capacitive characteristics of activated carbon fabrics for supercapacitors," *Journal of Power Sources* 125:299-308, 2004.
Huang et al., "Nitrogen-containing mesoporous carbons prepared from melamine formaldehyde resins with $CaCl_2$ as a template," *J. Colloid Interface Sci.* 363(1):193-198, 2011.
Indo German Carbons Limited, "Activated Carbon," Apr. 2009, URL=http://www.igcl.com/php/activated_carbon.php, download date Nov. 29, 2018, 3 pages.
Inomata et al., "Natural gas storage in activated carbon pellets without a binder," *Carbon* 40:87-93, 2002.
Job et al., "Carbon aerogels, cryogels and xerogels: Influence of the drying method on the textural properties of porous carbon materials," *Carbon* 43:2481-2494, 2005.
Job et al., "Highly dispersed platinum catalysts prepared by impregnation of texture-tailored carbon xerogels," *Journal of Catalysis* 240:160-171, 2006.
Job et al., "Synthesis of transition metal-doped carbon xerogels by solubilization of metal salts in resorcinol-formaldehyde aqueous solution," *Carbon* 42:3217-3227, 2004.
Katsaros et al., "Preparation and characterisation of gas selective microporous carbon membranes," *Microporous and Mesoporous Materials* 99:181-189, 2007.
Kim et al., "Correlation between the capacitor performance and pore structure," *Tanso* 221:31-39, 2006 (English Abstract).
Kim et al., "Adsorption of phenol and reactive dyes from aqueous solution on carbon cryogel microspheres with controlled porous structure," *Microporous and Mesoporous Materials* 96:191-196, 2006.
Kocklenberg et al., "Texture control of freeze-dried resorcinol-formaldehyde gels," *Journal of Non-Crystalline Solids* 225:8-13, 1998.
Kowalczyk et al., "Estimation of the pore-size distribution function from the nitrogen adsorption isotherm. Comparison of density functional theory and the method of Do and co-workers," *Carbon* 41:1113-1125, 2003.
Lozano-Castelló et al., "Influence of pore structure and surface chemistry on electric double layer capacitance in non-aqueous electrolyte," *Carbon* 41:1765-1775, 2003.
Lozano-Castelló et al., "Powdered Activated Carbons and Activated Carbon Fibers for Methane Storage: A Comparative Study," *Energy & Fuels* 16:1321-1328, 2002.
McEwen et al., "Nonaqueous Electrolytes and Novel Packaging Concepts for Electrochemical Capacitors," The 7th International Seminar on Double Layer capacitors and Similar Energy Storage Devices, Deerfield Beach, FL Dec. 8-10, 1997, 56 pages.
Miller, "Pulse Power Performance of Electrochemical Capacitors: Technical Status of Present Commercial Devices," Proceedings of the 8th International Seminar on Double Layer Capacitors and Similar Energy Storage Devices, Deerfield Beach, Florida, Dec. 7-9, 1998, 9 pages.
Naoi et al., "Second generation 'nanohybrid supercapacitor': Evolution of capacitive energy storage devices," *Energy Environ. Sci.* 5:9363-9373, 2012.
Nishihara et al., "Preparation of resorcinol—formaldehyde carbon cryogel microhoneycombs," *Carbon* 42:899-901, 2004.
Ogasawara et al., "Rechargeable Li2O2 Electrode for Lithium Batteries," *Journal of the American Chemical Society* 128(4):1390-1393, 2006.
Otowa et al., "Production and adsorption characteristics of MAXSORB: High-surface-area active carbon," *Gas Separation and Purification* 7(4):241-245, 1993.
Pääkkö, "Long and entangled native cellulose I nanofibers allow flexible aerogels and hierarchically porous templates for functionalities," *Soft Matter* 4:2492-2499, 2008.
Pekala et al., "Aerogels derived from multifunctional organic monomers," *Journal of Non-Crystalline Solids* 145:90-98, 1992.
Pekala et al., "Structure of Organic Aerogels. 1. Morphology and Scaling," *Macromolecules* 26:5487-5493, 1993.
Pekala, "Organic aerogels from the polycondensation of resorcinol with formaldehyde," *Journal of Materials Science* 24:3221-3227, 1989.
Perrin et al., "Methane Storage within Dry and Wet Active Carbons: A Comparative Study," *Energy & Fuels* 17:1283-1291, 2003.
Pimenta et al., "Studying disorder in graphite-based systems by Raman spectroscopy," *Phys. Chem. Chem. Phys.* 9:1276-1291, 2007.
Pojanavaraphan et al., "Prevulcanized natural rubber latex/clay aerogel nanocomposites," *European Polymer Journal* 44:1968-1977, 2008.
Qu et al., "Studies of activated carbons used in double-layer capacitors," *Journal of Power Sources* 74:99-107, 1998.
Ravikovitch et al., "Unified Approach to Pore Size Characterization of Microporous Carbonaceous Materials from N2, Ar, and CO2 Adsorption Isotherms," *Langmuir* 16:2311-2320, 2000.
Read, "Ether-Based Electrolytes for the Lithium/Oxygen Organic Electrolyte Battery," *J. Electrochem. Soc.* 153(1):A96-A100, 2006.
Read et al., "Oxygen Transport Properties of Organic Electrolytes and Performance of Lithium/Oxygen Battery," *J. Electrochem. Soc.* 150(10):A1351-A1356, 2003.
Read, "Characterization of the Lithium/Oxygen Organic Electrolyte Battery," *J. Electrochemical Soc.* 149(9):A1190-A1195, 2002.
Reichenauer et al., "Microporosity in carbon aerogels," *Journal of Non-Crystalline Solids* 225:210-214, 1998.
Robinson, R.A., Stokes, R.H., Electrolyte Solutions 2nd Ed., revised, Butterworths, London (1970). (Book).
Salitra et al., "Carbon Electrodes for Double-Layer Capacitors I. Relations Between Ion and Pore Dimensions," *Journal of The Electrochemical Society* 147(7):2486-2493, 2000.
Setoyama et al., "Simulation Study on the Relationship Between a High Resolution αs-Plot and the Pore Size Distribution for Activated Carbon," *Carbon* 36(10):1459-1467, 1998.
Simon et al., "Materials for electrochemical capacitors," *Nature Materials* 7:845-854, Nov. 2008.
Sivakkumar et al., "Evaluation of Lithium-ion capacitors assembled with pre-lithiated graphite anode and activated carbon cathode," *Electrochimica Acta* 65:280-287, Jan. 2012.
Takeuchi et al., "Removal of single component chlorinated hydrocarbon vapor by activated carbon of very high surface area," *Separation and Purification Technology* 15:79-90, 1999.
Tamon et al., "Influence of freeze-drying conditions on the mesoporosity of organic gels as carbon precursors," *Carbon* 38:1099-1105, 2000.
Tamon et al., "Preparation of mesoporous carbon by freeze drying," *Carbon* 37:2049-2055, 1999.
Tonanon et al., "Influence of surfactants on porous properties of carbon cryogels prepared by sol-gel polycondensation of resorcinol and formaldehyde," *Carbon* 41:2981-2990, 2003.
Toyo Tanso Carbon Products, "Special Graphite and Compound Material Products," Toyo Tanso Co., Ltd. Catalog published 2008.
Toyo Tanso, "Graphite Applications," Toyo Tanso Co., Ltd. Catalog published 1998. (Machine Translation Attached).
Toyo Tanso, "Isotropic Graphite Engineering Data," Toyo Tanso Co., Ltd. Catalog published 1994.
Toyo Tanso, "Isotropic Graphite Technical Data," Toyo Tanso Co., Ltd. Catalog published 1997.

(56) References Cited

OTHER PUBLICATIONS

Ue, "Mobility and Ionic Association of Lithium and Quaternary Ammonium Salts in Propylene Carbonate and γ-Butyrolactone," *J. Electrochem. Soc.* 141(12):3336-3342, Dec. 1994.
Wang et al., "MnO Nanoparticles Interdispersed in 3D Porous Carbon Framework for High Performance Lithium-Ion Batteries," ACS Applied Materials & Interfaces 3:12713-12718, 2014.
Webb, "Volume and Density Determinations for Particle Technologists," Micromeritics Instrument Corp., Feb. 16, 2001, Retrieved from http://www.micormeritics.com/pdf/app_articles/density_determinations.pdf (15 pages).
WebElements, "Lead: the essentials," attached as a PDF showing the webpage availability date as of Aug. 14, 2009 (via the Wayback Machine), web URL is http://www.webelements.com/lead/, pp. 1-3.
Wei et al., "A novel electrode material for electric double-layer capacitors," *Journal of Power Sources* 141:386-391, 2005.
Williford et al., "Air electrode design for sustained high power operation of Li/air batteries," *Journal of Power Sources* 194:1164-1170, 2009.
Woo et al., "Silicon Embedded Nanoporous Carbon Composite for the Anode of Li Ion Batteries," *Journal of The Electrochemical Society* 159(8):A1273-A1277, 2012.
Wu et al., "Fabrication and nano-structure control of carbon aerogels via a microemulsion-templated sol-gel polymerization method," *Carbon* 44:675-681, 2006.
Xiang et al., "Beneficial effects of activated carbon additives on the performance of negative lead-acid battery electrode for high-rate partial-state-of-charge operation," *Journal of Power Sources* 241:150-158, 2013.
Xie et al., "Pore size control of Pitch-based activated carbon fibers by pyrolytic deposition of propylene," *Applied Surface Science* 250:152-160, 2005.
Xu et al., "Comparison of sizing small particles using different technologies," *Powder Technology* 132:145-153, 2003.
Xu et al., "Optimization of Nonaqueous Electrolytes for Primary Lithium/Air Batteries Operated in Ambient Environment," *Journal of the Electrochemical Society* 156(10):A773-A779, 2009.
Xu et al., "Synthesis of mesoporous carbon and its adsorption property to biomolecules," *Microporous and Mesoporous Materials* 115:461-468, 2008.
Yamamoto et al., "Porous properties of carbon gel microspheres as adsorbents for gas separation," *Carbon* 42:1671-1676, 2004.
Yamamoto et al., "Control of mesoporosity of carbon gels prepared by sol-gel polycondensation and freeze drying," *Journal of Non-Crystalline Solids* 288:46-55, 2001.
Yamamoto et al., "Preparation and characterization of carbon cryogel microspheres," *Carbon* 40:1345-1351, 2002.
Yang et al., "Preparation of highly microporous and mesoporous carbon from the mesophase pitch and its carbon foams with KOH," *Carbon* 42:1872-1875, 2004.
Zhang et al., "Discharge characteristic of non-aqueous electrolyte Li/O2 battery," *Journal of Power Sources* 195:1235-1240, 2010.
Zhao et al., "Highly-Ordered Mesoporous Carbon Nitride with Ultrahigh Surface Area and Pore Volume as a Superior Dehydrogenation Catalyst," *Chem. Mater.* 26(10):3151-3161, 2014.

* cited by examiner

DECOMPOSITION OF SILICON-CONTAINING PRECURSORS ON POROUS SCAFFOLD MATERIALS

CROSS-REFERENCE TO RELATED APPLICATIONS

This application is a continuation of U.S. patent application Ser. No. 16/491,423 filed on Sep. 5, 2019 (now issued as U.S. Pat. No. 11,611,071), which is a National Stage of PCT/US2018/021843 filed on Mar. 9, 2018, which claims the benefit of priority to U.S. Provisional Application No. 62/469,424 filed Mar. 9, 2017, each of which is hereby incorporated by reference herein in its entirety.

STATEMENT REGARDING FEDERALLY SPONSORED RESEARCH OR DEVELOPMENT

This invention was made with government support under DE-EE0007312 awarded by the Department of Energy. The government has certain rights in the invention.

BACKGROUND

Technical Field

Embodiments of the present invention generally relate to methods of manufacturing novel materials exhibiting extremely durable intercalation of lithium. The novel materials comprise a porous scaffold, for example a carbon having a pore volume comprising micropores, mesopores, and/or macropores, wherein said volume is impregnated with silicon. Suitable precursors for the carbon scaffold include, but are not limited to, sugars and polyols, organic acids, phenolic compounds, and amine compounds. Suitable precursors for the silicon include, but are not limited to, silane, disilane, trisilane, and tetrasilane. The silicon-impregnated porous scaffold can be further coated to reduce any remaining surface area, for example, coated with carbon or conductive polymer. Such silicon-impregnated carbon materials and carbon- or conductive polymer-coated silicon-impregnated carbon materials exhibit remarkable durability with respect to their intercalation of lithium.

Description of the Related Art

Lithium-based electrical storage devices have potential to replace devices currently used in any number of applications. For example, current lead acid automobile batteries are not adequate for next generation all-electric and hybrid electric vehicles due to irreversible, stable sulfate formations during discharge. Lithium ion batteries are a viable alternative to the lead-based systems currently used due to their capacity, and other considerations. Carbon is one of the primary materials used in both lithium secondary batteries and hybrid lithium-ion capacitors (LIC). The carbon anode typically stores lithium in between layered graphite sheets through a mechanism called intercalation. Traditional lithium ion batteries are comprised of a graphitic carbon anode and a metal oxide cathode; however such graphitic anodes typically suffer from low power performance and limited capacity.

Silicon, tin, and other lithium alloying electrochemical modifiers have also been proposed based on their ability to store very large amounts of lithium per unit weight. However, these materials are fundamentally limited by the substantial swelling that occurs when they are fully intercalated with lithium. This swelling and shrinkage when the lithium is removed results in an electrode that has limited cycle life and low power. The solution thus far has been to use very small amounts of alloying electrochemical modifier in a largely carbon electrode, but this approach does not impart the desired increase in lithium capacity. Finding a way to increase the alloying electrochemical modifier content in an anode composition while maintaining cycle stability is desired to increase capacity. A number of approaches have been utilized involving nano-structured alloying electrochemical modifier, blends of carbon with alloying electrochemical modifier, or deposition of alloying electrochemical modifier onto carbon using vacuum or high temperature. However none of these processes has proven to combine a scalable process that results in the desired properties.

The aforementioned swelling associated with certain materials, for example silicon materials, upon their intercalation of lithium is a critical factor in the stability, i.e., cycle life of said materials with regards to their application for energy storage and distribution, for example, use in rechargeable batteries. Over many cycles, the capacity of said materials is susceptible to fading. This capacity fade may be precipitated by a variety of different mechanisms, and one of the critical mechanisms thus described related to the formation of a solid-electrolyte interphase (SEI) in the negative electrode, with competes with reversible lithium intercalation. It is known in the art that SEI is a critical component of capacity fade as the canonical degradation mechanism, which can be modeled over long times, based on accelerated aging for short times and elevated temperatures.

It is described in the art that SEI layer plays an important role in the safety, power capability, and cyclic life of Li-ion batteries. It is also described that formation of a chemically and mechanically stable SEI layer is important for improving the cycle life of lithium-ion batteries. The SEI layer on silicon in an anode forms due to reduction of organic solvents and anions at the electrode surface during charging and discharging cycles of batteries, with a substantial degree of the formation happening during the first cycle. Furthermore, certain electrolyte additives, such as vinylene carbonate, propylene carbonate, lithium difluoro-oxalatoborate, and fluoro-ethylene carbonate, and other species known in the art, and combinations thereof, can dramatically improve the cyclic efficiency of silicon-based anodes. SEI layers can comprise fluorinated carbon and silicon species, besides the usual Li2CO3, alkyl Li carbonates (ROCO2Li), LiF, ROLi, and polyethylene oxides that are found on graphite electrodes. SEI formation on the negative electrode is an irreversible reaction that consumes cyclable Li-ions from the positive electrode leading to most of the capacity loss observed in the first lithiation/delithiation cycle of secondary lithium-ion batteries. Besides capacity loss in the first cycle, continuous formation of this layer also increases resistance to Li-ion diffusion (i.e., internal impedance of a battery).

The repeated expansion and contraction of silicon-based anode materials leads to instability of SEI, for example, cracking and reformation, concomitantly contributing to the capacity fade of the anode. To this end, the art describes a variety of different silicon size and geometries that are preferred in order to avert fracture and mitigate the propensity for chemical and mechanical degradation that can occur upon cycling in a lithium-ion battery. To this end, the art (RSC Advances, 2013, 3, 7398, “Critical silicon-anode size for averting lithiation-induced mechanical failure of lithium-ion batteries, Ma et al.) describes 90 nm as a critical size for nanoparticles, 70 nm for nanowires, and 33 nm for nano-films, below these dimensions (for their respective geometries) the silicon nanostructures remain undamaged upon lithiation. Another report in the art (DOI: 10.1002/anie.200906287, "A Critical Size of Silicon Nano-Anodes for Lithium Rechargeable Batteries," Angewandte Chemie, Vol 49, Iss 12, U.S. Plant Pat. No. 2,146-2149, 2010, Kim et al.) describes for well-dispersed silicon nanocrystals that an approximate size of 10 nm showed higher capacity retention compared to 5 nm or 20 nm sizes.

Additionally, nano features are important to both prevent pulverization of silicon during expansion and contraction as well as retain an amorphous structure throughout cycling. Pulverization is identified as a mechanical failure of silicon due to extreme strain gradients through the bulk structure. As silicon is lithiated, it will expand in volume (upwards 300%). Lithium ions move very slowly through solid silicon. During lithium insertion, a silicon particle may hold large amounts of lithium near the surface and none in the center of the particle. The concentration gradient creates a non-uniform expansion through the cross section. The extreme surface volume expansion will cause the silicon particle to tear apart away from the inside, cracking and fracturing. Once silicon has pulverized the cell will fail, as there is no known method to salvage the performance.

Current technology for achieving nano sized silicons are expensive and difficult to scale. For instance, the first commonly recognized successful production of Si nanoclusters was reported by Heath and co-workers (Science 1992, 258, 1131; P. E. Batson, J. R. Heath, Phys. Rev. Lett. 1993, 71, 911) involving reduction of SiCl4 at high temperature and high pressure in a bomb fitted into a heating mantle. In another example, a process utilized SiCl4 reduction at room temperature under an inert atmosphere, however the product obtained at room temperature was not fully crystallized, requiring further high temperature annealing. Similar solution syntheses have been reported at low or high temperature after reducing silicon salts with LiAlH4 or alkyl silanes, however, all such methods produce a broad particle size distribution or involve aggregation of the nanoparticles. Furthermore, these approaches are not suitable for enabling commercial utility; the scalability and material yields are insufficient to allow for their use in anode production for lithium secondary batteries.

Therefore, the need remains in the art for easily scalable, inexpensive, and improved processes for producing porous silicon materials comprising nano-sized particles and/or exhibiting nano-features that, upon combination with a suitable hard carbon material, can generate the desired electrochemical properties. Embodiments of the disclosed invention meet this need, and provide further related advantages.

BRIEF SUMMARY

In general terms, embodiments of the current invention are directed to manufacturing composite materials wherein silicon is deposited into the pore volume of a porous scaffold material. The porous scaffold material can comprise a variety of different materials. In certain embodiments, the porous scaffold material is porous carbon material comprising micropore, mesopore, and/or macropores. Specifically, the porous carbon material provides pores in the range of 5 to 1000 nm, which are subsequently filled with silicon. Accordingly, this disclosure also concerns methods for manufacturing composite materials wherein silicon is deposited into the pore volume of a porous scaffold material. These composites exhibit remarkably durable intercalation of lithium, and therefore provide optimized lithium storage and utilization properties. These novel composites find utility in any number of electrical energy storage devices, for example as electrode material in lithium-based electrical energy storage devices (e.g., lithium ion batteries). Electrodes comprising the novel composites disclosed herein display high reversible capacity, high first cycle efficiency, high power performance or any combination thereof. The present inventors have discovered that such improved electrochemical performance is related to the size of the silicon, the integrity of the silicon and carbon material during cycling, formation of a stable SEI layer, the physicochemical properties of the scaffold materials, for example the surface area and pore volume characteristics of the carbon scaffold, and other properties, as well as the approaches used to manufacture and compound the materials.

Accordingly, in one embodiment, the present disclosure provides a method for the manufacturing of a novel composite material with durable intercalation of lithium, wherein the composite comprises carbon and silicon. For example, in some embodiments the process comprises the following steps:

a) mixing polymer(s) and/or polymer precursor(s) and storing the resulting mixture for a period of time at sufficient temperature to allow for polymerization of the precursors;
b) carbonizing the resulting polymer material to create a porous carbon material; and
c) subjecting the porous carbon material to elevated temperature in the presence of a silicon-containing precursor, resulting in a silicon-impregnated carbon material.

Accordingly, in one embodiment, the present disclosure provides a method for manufacturing a novel composite material with durable intercalation of lithium, wherein the composite comprises a layer of carbon surrounding the silicon-impregnated carbon material. For example, in some embodiments the method comprises the following steps:

a) mixing polymer and/or polymer precursor(s) and storing the resulting mixture for a period of time at sufficient temperature to allow for polymerization of the precursors;
b) carbonizing the resulting polymer material to create a porous carbon material;
c) subjecting the porous carbon material to elevated temperature in the presence of a silicon-containing precursor, resulting in a silicon-impregnated carbon material; and
d) applying a carbon layer on the silicon-impregnated carbon material to yield a carbon-coated, silicon-impregnated carbon material Accordingly, in one embodiment, the present disclosure provides a method for manufacturing a novel composite material with durable intercalation of lithium, wherein the composite comprises a layer of conductive polymer surrounding the silicon-impregnated carbon material. For example, in some embodiments the method comprises the following steps:

a) mixing polymer(s) and/or polymer precursor(s) and storing the resulting mixture for a period of time at sufficient temperature to allow for polymerization of the precursors;
b) carbonizing the resulting polymer material to create a porous carbon material;

c) subjecting the porous carbon material to elevated temperature in the presence of a silicon-containing precursor, resulting in a silicon-impregnated carbon material; and d) applying conductive polymer around the silicon-impregnated carbon material to yield a silicon-impregnated carbon material further embedded within a conductive polymer network.

Accordingly, in one embodiment, the present disclosure provides a method for manufacturing of a novel composite material with durable intercalation of lithium, wherein the composite comprises a layer of conductive polymer surrounding a carbon-coated, silicon-impregnated carbon material. For example, in some embodiments the method comprises the following steps:

a) mixing polymer(s) and/or polymer precursor(s) materials and storing the resulting mixture for a period of time at sufficient temperature to allow for polymerization of the precursors;

b) carbonizing the resulting polymer material to create a porous carbon material;

c) subjecting the porous carbon material to elevated temperature in the presence of a silicon-containing precursor, resulting in a silicon-impregnated carbon material;

d) applying a carbon layer on the silicon-impregnated carbon material to yield a carbon-coated, silicon-impregnated carbon material; and e) applying conductive polymer around the carbon-coated, silicon-impregnated carbon material to yield a carbon-coated, silicon-impregnated carbon material further embedded within a conductive polymer network Accordingly, embodiments of the present disclosure provide both novel compositions of matter in addition to manufacturing methods thereof, wherein said materials exhibit remarkably durable intercalation of lithium when incorporated into an electrode of a lithium based energy storage device. In some embodiments, the lithium based electrical energy storage device is a lithium ion battery or lithium ion capacitor.

These and other aspects of embodiments of the invention will be apparent upon reference to the following detailed description. To this end, various references are set forth herein which describe in more detail certain background information, procedures, compounds and/or compositions, and are each hereby incorporated by reference in their entirety.

DETAILED DESCRIPTION

Figure 1:
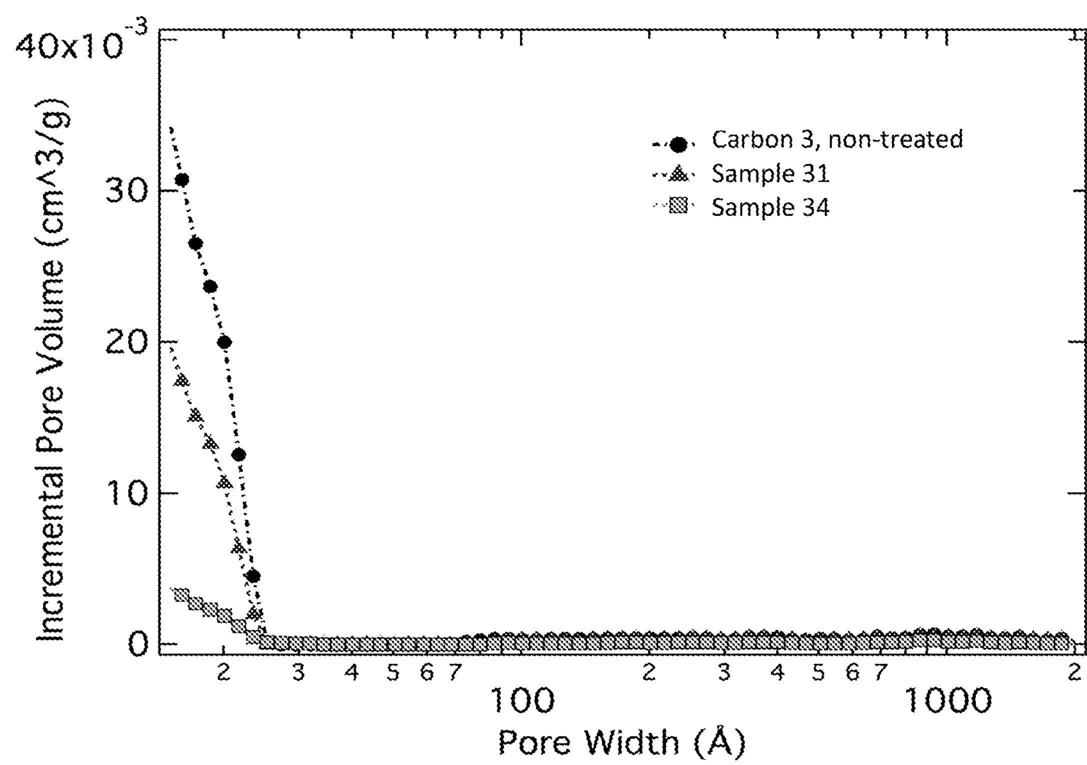
FIG. 1. Pore volume distribution for microporous carbon scaffold and silicon-containing composites derived from same.

In the following description, certain specific details are set forth in order to provide a thorough understanding of various embodiments. However, one skilled in the art will understand that the invention may be practiced without these details. In other instances, well-known structures have not been shown or described in detail to avoid unnecessarily obscuring descriptions of the embodiments. Unless the context requires otherwise, throughout the specification and claims which follow, the word “comprise” and variations thereof, such as, “comprises” and “comprising” are to be construed in an open, inclusive sense, that is, as “including, but not limited to.” Further, headings provided herein are for convenience only and do not interpret the scope or meaning of the claimed invention.

Reference throughout this specification to “one embodiment” or “an embodiment” means that a particular feature, structure or characteristic described in connection with the embodiment is included in at least one embodiment. Thus, the appearances of the phrases “in one embodiment” or “in an embodiment” in various places throughout this specification are not necessarily all referring to the same embodiment. Furthermore, the particular features, structures, or characteristics may be combined in any suitable manner in one or more embodiments. Also, as used in this specification and the appended claims, the singular forms “a,” “an,” and “the” include plural referents unless the content clearly dictates otherwise. It should also be noted that the term “or” is generally employed in its sense including “and/or” unless the content clearly dictates otherwise.

Definitions

As used herein, and unless the context dictates otherwise, the following terms have the meanings as specified below.

“Energy storage material” refers to a material capable of storing electrical charge, for example in the form of physically entrained electrolytes. Energy storage materials are capable of being charged and discharged. Examples of energy storage materials include, but are not limited to, carbon, for example activated carbon, silicon, sulfur, lithium, and combinations thereof. Energy storage materials may be used in the form of particles, or combinations of inter- and/or intra-particle blends of particles. Energy storage particles can be assembled into electrodes employing dry processing or aqueous or non-aqueous slurry processing as described in the art.

“Carbon material” refers to a material or substance comprised substantially of carbon. Examples of carbon materials include, but are not limited to, activated carbon, pyrolyzed carbon, hard carbon, graphite, and other allotropes of carbon.

“Impurity” or “impurity element” refers to a foreign substance (e.g., a chemical element) within a material, which differs from the chemical composition of the base material. For example, an impurity in a carbon material refers to any element or combination of elements, other than carbon, which is present in the carbon material. Impurity levels are typically expressed in parts per million (ppm).

“TXRF impurity” is any impurity element as detected by total x-ray fluorescence (TXRF). The phrases “total TXRF impurity content” and “total TXRF impurity level” both refer to the sum of all XTRF impurities present in a sample, for example, a polymer gel or a carbon material, or a silicon material, or a composite material comprising carbon and silicon.

"Ash content" refers to the nonvolatile inorganic matter that remains after subjecting a substance to a high decomposition temperature. Herein, the ash content of a carbon material is calculated from the total PIXE impurity content as measured by proton induced x-ray emission, assuming that nonvolatile elements are completely converted to expected combustion products (i.e., oxides).

"Polymer" refers to a molecule comprised of two or more structural repeating units.

"Synthetic polymer precursor material" or "polymer precursor" refers to the compounds used in the preparation of a synthetic polymer. Examples of polymer precursors that can be used in the preparations disclosed herein include, but are not limited to aldehydes (i.e., HC(=O)R, where R is an organic group), such as for example, methanal (formaldehyde); ethanal (acetaldehyde); propanal (propionaldehyde); butanal (butyraldehyde); glucose; benzaldehyde and cinnamaldehyde. Other exemplary polymer precursors include, but are not limited to, phenolic compounds such as phenol and polyhydroxy benzenes, such as dihydroxy or trihydroxy benzenes, for example, resorcinol (i.e., 1,3-dihydroxy benzene), catechol, hydroquinone, and phloroglucinol. Mixtures of two or more polyhydroxy benzenes are also contemplated within the meaning of polymer precursor.

"Sol" refers to a colloidal suspension of precursor particles (e.g., polymer precursors), and the term "gel" refers to a wet three-dimensional porous network obtained by condensation or reaction of the precursor particles.

"Polymer gel" refers to a gel in which the network component is a polymer; generally a polymer gel is a wet (aqueous or non-aqueous based) three-dimensional structure comprised of a polymer formed from synthetic precursors or polymer precursors.

"Sol gel" refers to a sub-class of polymer gel where the polymer is a colloidal suspension that forms a wet three-dimensional porous network obtained by reaction of the polymer precursors.

"Polymer hydrogel" or "hydrogel" refers to a subclass of polymer gel or gel wherein the solvent for the synthetic precursors or monomers is water or mixtures of water and one or more water-miscible solvent.

"Acid" refers to any substance that is capable of lowering the pH of a solution. Acids include Arrhenius, Brønsted and Lewis acids. A "solid acid" refers to a dried or granular compound that yields an acidic solution when dissolved in a solvent. The term "acidic" means having the properties of an acid.

"Base" refers to any substance that is capable of raising the pH of a solution. Bases include Arrhenius, Brønsted and Lewis bases. A "solid base" refers to a dried or granular compound that yields basic solution when dissolved in a solvent. The term "basic" means having the properties of a base.

"Catalyst" is a substance which alters the rate of a chemical reaction. Catalysts participate in a reaction in a cyclic fashion such that the catalyst is cyclically regenerated. The present disclosure contemplates catalysts which are sodium free. The catalyst used in the preparation of a polymer gel as described herein can be any compound that facilitates the polymerization of the polymer precursors to form a polymer gel. A "volatile catalyst" is a catalyst which has a tendency to vaporize at or below atmospheric pressure. Exemplary volatile catalysts include, but are not limited to, ammoniums salts, such as ammonium bicarbonate, ammonium carbonate, ammonium hydroxide, and combinations thereof.

"Carbonizing", "pyrolyzing", "carbonization" and "pyrolysis" each refer to the process of heating a carbon-containing substance at a pyrolysis dwell temperature in an inert atmosphere (e.g., argon or nitrogen) or in a vacuum such that the targeted material collected at the end of the process is primarily carbon. "Pyrolyzed" refers to a material or substance, for example a carbon material, which has undergone the process of pyrolysis. "Activated carbon" refers to carbon produced as a result of pyrolysis, physical or chemical activation, or combination thereof, in a single process step or sequential process steps.

"Dwell temperature" refers to the temperature of the furnace during the portion of a process which is reserved for maintaining a relatively constant temperature (i.e., neither increasing nor decreasing the temperature). For example, the pyrolysis dwell temperature refers to the relatively constant temperature of the furnace during pyrolysis, and the activation dwell temperature refers to the relatively constant temperature of the furnace during activation.

"Pore" refers to an opening or depression in the surface, or a tunnel in a carbon material, such as for example activated carbon, pyrolyzed dried polymer gels, pyrolyzed polymer cryogels, pyrolyzed polymer xerogels, pyrolyzed polymer aerogels, activated dried polymer gels, activated polymer cryogels, activated polymer xerogels, activated polymer aerogels and the like. A pore can be a single tunnel or connected to other tunnels in a continuous network throughout the structure.

"Pore structure" refers to the layout of the surface of the internal pores within a carbon material, such as an activated carbon material. Components of the pore structure include pore size, pore volume, surface area, density, pore size distribution, and pore length. Generally the pore structure of activated carbon material comprises micropores and mesopores.

"Mesopore" generally refers to pores having a diameter between about 2 nanometers and about 50 nanometers while the term "micropore" refers to pores having a diameter less than about 2 nanometers. Mesoporous carbon materials comprise greater than 50% of their total pore volume in mesopores while microporous carbon materials comprise greater than 50% of their total pore volume in micropores. Pores larger than about 50 nanometers are referred to as "macropores".

"Surface area" refers to the total specific surface area of a substance measurable by the BET technique. Surface area is typically expressed in units of m2/g. The BET (Brunauer/Emmett/Teller) technique employs an inert gas, for example nitrogen, to measure the amount of gas adsorbed on a material and is commonly used in the art to determine the accessible surface area of materials.

"Connected" when used in reference to mesopores and micropores refers to the spatial orientation of such pores.

"Binder" refers to a material capable of holding individual particles of carbon together such that after mixing a binder and carbon together the resulting mixture can be formed into sheets, pellets, disks or other shapes. Non-exclusive examples of binders include fluoro polymers, such as, for example, PTFE (polytetrafluoroethylene, Teflon), PFA (perfluoroalkoxy polymer resin, also known as Teflon), FEP (fluorinated ethylene propylene, also known as Teflon), ETFE (polyethylenetetrafluoroethylene, sold as Tefzel and Fluon), PVF (polyvinyl fluoride, sold as Tedlar), ECTFE (polyethylenechlorotrifluoroethylene, sold as Halar), PVDF (polyvinylidene fluoride, sold as Kynar), PCTFE (polychlorotrifluoroethylene, sold as Kel-F and CTFE), trifluoroethanol and combinations thereof.

"Composite material" refers to a composition comprising multiple (i.e., 2 or more) distinct, chemical species within the same particle, for example particles that comprise both porous carbon materials and silicon materials.

"Allotrope" refers to a material which can exists in different forms. C60, graphene, diamond, hard carbon, soft carbon, graphite, and carbon nanotubes are all examples of carbon allotropes. "Hard Carbon" refers to a non-graphitizable carbon material. At elevated temperatures (e.g., >1500° C.) a hard carbon remains substantially amorphous, whereas a "soft" carbon will undergo crystallization and become graphitic.

"Lithium uptake" refers to a carbon's ability to intercalate, absorb, or store lithium as measured as a ratio between the maximum number of lithium atoms to 6 carbon atoms.

"SEI," as known in the art, refers to solvent-electrolyte interphase.

"Young's modulus," also known as the tensile modulus or elastic modulus, is a mechanical property of linear elastic solid materials. It measures the force (per unit area) that is needed to stretch (or compress) a material.

"Bulk modulus," describes volumetric elasticity, or the tendency of an object to deform in all directions when uniformly loaded in all directions; it is defined as volumetric stress over volumetric strain, and is the inverse of compressibility. The bulk modulus is an extension of Young's modulus to three dimensions.

"Coulombic efficiency," herein refers to the amount of capacitive discharge achieved as a result of lithium extraction from the anode of a lithium ion based energy storage device divided by the amount of capacitive charge or uptake achieved as a result of lithium insertion.

A. Porous Scaffold Materials

For the purposes of embodiments of the current invention, a porous scaffold may be used, into which silicon is to be impregnated. In this context, the porous scaffold can comprise various materials. In some embodiments the porous scaffold material primarily comprises carbon, for example hard carbon. Other allotropes of carbon are also envisioned in other embodiments, for example, graphite, amorphous carbon, diamond, C60, carbon nanotubes (e.g., single and/or multi-walled), graphene and/or carbon fibers. The introduction of porosity into the carbon material can be achieved by a variety of means. For instance, the porosity in the carbon material can be achieved by modulation of polymer precursors, and/or processing conditions to create said porous carbon material, and described in detail in the subsequent section.

In other embodiments, the porous scaffold comprises a polymer material. To this end, a wide variety of polymers are envisioned in various embodiments to have utility, including, but not limited to, inorganic polymer, organic polymers, and addition polymers. Examples of inorganic polymers in this context includes, but are not limited to homochain polymers of silicon-silicon such as polysilanes, silicon carbide, polygermanes, and polystannanes. Additional examples of inorganic polymers includes, but are not limited to, heterochain polymers such as polyborazylenes, polysiloxanes like polydimethylsiloxane (PDMS), polymethylhydrosiloxane (PMHS) and polydiphenylsiloxane, polysilazanes like perhydridopolysilazane (PHPS), polyphosphazenes and poly(dichlorophosphazenes), polyphosphates, polythiazyls, and polysulfides. Examples of organic polymers includes, but are not limited to, low density polyethylene (LDPE), high density polyethylene (HDPE), polypropylene (PP), polyvinyl chloride (PVC), polystyrene (PS), nylon, nylon 6, nylon 6,6, teflon (Polytetrafluoroethylene), thermoplastic polyurethanes (TPU), polyureas, poly(lactide), poly(glycolide) and combinations thereof, phenolic resins, polyamides, polyaramids, polyethylene terephthalate, polychloroprene, polyacrylonitrile, polyaniline, polyimide, poly(3,4-ethylenedioxythiophene) polystyrene sulfonate (PDOT:PSS), and others known in the arts. The organic polymer can be synthetic or natural in origin. In some embodiments, the polymer is a polysaccharide, such as starch, cellulose, cellobiose, amylose, amylpectin, gum Arabic, lignin, and the like. In some embodiments, the polysaccharide is derived from the carmelization of mono- or oligomeric sugars, such as fructose, glucose, sucrose, maltose, raffinose, and the like.

In certain embodiments, the porous scaffold polymer material comprises a coordination polymer. Coordination polymers in this context include, but are not limited to, metal organic frameworks (MOFs). Techniques for production of MOFs, as well as exemplary species of MOFs, are known and described in the art ("The Chemistry and Applications of Metal-Organic Frameworks, Hiroyasu Furukawa et al. Science 341, (2013); DOI: 10.1126/science.1230444). Examples of MOFs in the context include, but are not limited to, Basolite™ materials and zeolitic imidazolate frameworks (ZIFs).

Concomitant with the myriad variety of polymers envisioned with the potential to provide a porous substrate, various processing approaches are envisioned in various embodiments to achieve said porosity. In this context, general methods for imparting porosity into various materials are myriad, as known in the art, including, but certainly not limited to, methods involving emulsification, micelle creation, gasification, dissolution followed by solvent removal (for example, lyophilization), axial compaction and sintering, gravity sintering, powder rolling and sintering, isostatic compaction and sintering, metal spraying, metal coating and sintering, metal injection molding and sintering, and the like. Other approaches to create a porous polymeric material, including creation of a porous gel, such as a freeze dried gel, aerogel, and the like are also envisioned.

In certain embodiments, the porous scaffold material comprises a porous ceramic material. In certain embodiments, the porous scaffold material comprises a porous ceramic foam. In this context, general methods for imparting porosity into ceramic materials are varied, as known in the art, including, but certainly not limited to, creation of porous In this context, general methods and materials suitable for comprising the porous ceramic include, but are not limited to, porous aluminum oxide, porous zirconia toughened alumina, porous partially stabilized zirconia, porous alumina, porous sintered silicon carbide, sintered silicon nitride, porous cordierite, porous zirconium oxide, clay-bound silicon carbide, and the like.

In certain embodiments, the porous scaffold comprises porous silica or other silicon material containing oxygen. The creation of silicon gels, including sol gels, and other porous silica materials is known in the art.

In certain embodiments, the porous material comprises a porous metal. Suitable metals in this regard include, but are not limited to porous aluminum, porous steel, porous nickel, porous Inconcel, porous Hasteloy, porous titanium, porous copper, porous brass, porous gold, porous silver, porous germanium, and other metals capable of being formed into porous structures, as known in the art. In some embodiments, the porous scaffold material comprises a porous metal foam. The types of metals and methods to manufacture related to same are known in the art. Such methods include, but are not limited to, casting (including foaming, infiltration, and lost-foam casting), deposition (chemical and physical), gas-eutectic formation, and powder metallurgy techniques (such as powder sintering, compaction in the presence of a foaming agent, and fiber metallurgy techniques).

B. Porous Carbon Materials

Methods for preparing porous carbon materials from polymer precursors are known in the art. For example, methods for preparation of carbon materials are described in U.S. Pat. Nos. 7,723,262, 8,293,818, 8,404,384, 8,654,507, 8,916,296, 9,269,502, U.S. patent application Ser. Nos. 12/965,709 and 13/486,731, and international patent application PCT/US2014/029106, the full disclosures of which are hereby incorporated by reference in their entireties for all purposes. Accordingly, in one embodiment the present disclosure provides a method for preparing any of the carbon materials or polymer gels described above. The carbon materials may be synthesized through pyrolysis of either a single precursor, for example a saccharide material such as sucrose, fructose, glucose, dextrin, maltodextrin, starch, amylopectin, amlyose, lignin, gum Arabic, and other saccharides known in the art, and combinations thereof. Alternatively, the carbon materials may be synthesized through pyrolysis of a complex resin, for instance formed using a sol-gel method using polymer precursors such as phenol, resorcinol, bisphenol A, urea, melamine, and other suitable compounds known in the art, and combinations thereof, in a suitable solvent such as water, ethanol, methanol, and other solvents known in the art, and combinations thereof, with cross-linking agents such as formaldehyde, furfural, and other cross-lining agents known in the art, and combinations thereof. The resin may be acid or basic, and may contain a catalyst. The catalyst may be volatile or non-volatile. The pyrolysis temperature and dwell time can vary as known in the art.

In some embodiments, the methods comprise preparation of a polymer gel by a sol gel process, condensation process or crosslinking process involving monomer precursor(s) and a crosslinking agent, two existing polymers and a crosslinking agent or a single polymer and a crosslinking agent, followed by pyrolysis of the polymer gel. The polymer gel may be dried (e.g., freeze dried) prior to pyrolysis; however drying is not necessarily required.

In some embodiments, the polymer gel is freeze dried, or lyophilized, in order to leave porosity of the desired extent and nature, for example, macroporosity. Without being bound by theory, the porosity in the lyophilized gel, or cryolyogel. In some embodiments, the gel in freeze dried by first reducing the size of monolithic material into particles, then extremely rapid freezing, the drying under vacuum, in order to achieve a cryolyogel. The particle size reduction can be accomplished by various methods as known in the art, for example by crushing, grinding, milling by various means, and the like. Such methods are suitable to create particles with a volume average particle (Dv50) of less than a 10 cm, for example less than 5 cm, for example less than 2 cm, for example less than 1 cm, for example less than 5 mm, for example less than 1 mm, for example less than 100 microns, for example less than 10 microns. The extremely rapid freezing can be accomplished by subjecting the particles to extremely cold liquid, for example liquid nitrogen, or otherwise rapidly frozen as known in the art. Without being bound by theory, the extremely rapid freezing creates a large extent of ice surface area, and, upon sublimation under vacuum as known in the art, results in a large surface area in the freeze dried polymer, or cryolyogel.

The sol gel process provides significant flexibility for incorporation of various electrochemical modifiers, which can be incorporated at any number of steps. In one embodiment, a method for preparing a polymer gel comprising an electrochemical modifier is provided. In another embodiment, methods for preparing pyrolyzed polymer gels are provided. Details of the variable process parameters of the various embodiments of the disclosed methods are described below.

The target carbon properties can be derived from a variety of polymer chemistries provided the polymerization reaction produces a resin/polymer with the necessary carbon backbone. Different polymer families include novolacs, resoles, acrylates, styrenics, ureathanes, rubbers (neoprenes, styrene-butadienes, etc.), nylons, etc. The preparation of any of these polymer resins can occur via a number of different processes including sol gel, emulsion/suspension, solid state, solution state, melt state, etc for either polymerization and crosslinking processes.

The polymer gel may be prepared by a sol gel process. For example, the polymer gel may be prepared by co-polymerizing one or more polymer precursors in an appropriate solvent. In one embodiment, the one or more polymer precursors are co-polymerized under acidic conditions. In some embodiments, a first polymer precursor is a phenolic compound and a second polymer precursor is an aldehyde compound. In one embodiment, of the method the phenolic compound is phenol, resorcinol, catechol, hydroquinone, phloroglucinol, or a combination thereof; and the aldehyde compound is formaldehyde, acetaldehyde, propionaldehyde, butyraldehyde, benzaldehyde, cinnamaldehyde, or a combination thereof. In a further embodiment, the phenolic compound is resorcinol, phenol or a combination thereof, and the aldehyde compound is formaldehyde. In yet further embodiments, the phenolic compound is resorcinol and the aldehyde compound is formaldehyde. Other polymer precursors include nitrogen containing compounds such as melamine, urea and ammonia.

In some embodiments an electrochemical modifier is incorporated into the material as polymer. For example, the organic or carbon containing polymer, RF for example, is copolymerized with the polymer, which contains the electrochemical modifier. In one embodiment, the electrochemical modifier-containing polymer contains silicon. In one embodiment the polymer is tetraethylorthosiliane (TEOS). In one embodiment, a TEOS solution is added to the RF solution prior to or during polymerization. In another embodiment the polymer is a polysilane with organic side groups. In some cases these side groups are methyl groups, in other cases these groups are phenyl groups, in other cases the side chains include phenyl, pyrol, acetate, vinyl, siloxane fragments. In some cases the side chain includes a group 14 element (silicon, germanium, tin or lead). In other cases the side chain includes a group 13 element (boron, aluminum, boron, gallium, indium). In other cases the side chain includes a group 15 element (nitrogen, phosphorous, arsenic). In other cases the side chain includes a group 16 element (oxygen, sulfur, selenium).

In another embodiment the electrochemical modifier comprises a silole. In some cases it is a phenol-silole or a silafluorene. In other cases it is a poly-silole or a poly-silafluorene. In some cases the silicon is replaced with germanium (germole or germafluorene), tin (stannole or stannaflourene) nitrogen (carbazole) or phosphorous (phosphole, phosphafluorene). In all cases the heteroatom containing material can be a small molecule, an oligomer or a polymer. Phosphorous atoms may or may not be also bonded to oxygen.

In some embodiments the reactant comprises phosphorous. In certain other embodiments, the phosphorus is in the form of phosphoric acid. In certain other embodiments, the phosphorus can be in the form of a salt, wherein the anion of the salt comprises one or more phosphate, phosphite, phosphide, hydrogen phosphate, dihydrogen phosphate, hexafluorophosphate, hypophosphite, polyphosphate, or pyrophosphate ions, or combinations thereof. In certain other embodiments, the phosphorus can be in the form of a salt, wherein the cation of the salt comprises one or more phosphonium ions. The non-phosphate containing anion or cation pair for any of the above embodiments can be chosen for those known and described in the art. In the context, exemplary cations to pair with phosphate-containing anions include, but are not limited to, ammonium, tetraethylammonium, and tetramethylammonium ions. In the context, exemplary anions to pair with phosphate-containing cations include, but are not limited to, carbonate, dicarbonate, and acetate ions.

In some cases the crosslinker is important because of its chemical and electrochemical properties. In other cases the crosslinker is important because it locks in the polymer geometry. In other cases both polymer geometry and chemical composition are important.

The crosslinker can react at either low or high temperatures. In some cases a portion of the reaction will occur at low temperatures with the rest of the reaction occurring at higher temperatures. Both extent of crosslinking and reaction kinetics can be measured by a variety of chemical techniques (TGA, FTIR, NMR, XRD, etc.) and physical techniques (indentation, tensile testing, modulus, hardness, etc.).

In some cases it will be favorable to have the electrochemical modifier and/or crosslinker evenly distributed throughout the initial co-polymer—a homogenous mixture. In other cases it is important to have an uneven distribution of crosslinker and/or electrochemical modified throughout the initial copolymer.

The structure of the polymer precursors is not particularly limited, provided that the polymer precursor is capable of reacting with another polymer precursor or with a second polymer precursor to form a polymer. In some embodiments the polymer precursors are selected from an alcohol, a phenol, a polyalcohol, a sugar, an alkyl amine, an aromatic amine, an aldehyde, a ketone, a carboxylic acid, an ester, a urea, an acid halide, an alkene, an alkyne, an acrylate, an epoxide and an isocyanate.

Various monomers, molecular components, oligomers and polymeric materials may be combined to make a variety of polymers including, novolacs, resoles, novolac epoxides (comprised of one or more of phenol, resorcinol, formaldehyde, epichlorohydrin, bisphenol-A, bisphenol-F, epoxide), rubbers (isoprene, styrene-butadiene, styrene-butadiene-styrene, isobutylene, polyacrylate rubber, ethylenene-acrylate rubber, bromo-isobutylene, isoprene, polybutadiene, chloro isobutadiene isoprene, polychloroprene, epichlorohydrin, ethylene propylene, ethylene propylene diene monomer, polyether urethane, perfluorocarbon rubber, fluorosilicone, hydrogenated nitrile butadiene, acrylonitrile butadiene, polyurethane), nylons (including nylon-6; nylon-6,6; nylon-6,9; nylon-6,10; nylon-6,12; nylon-11, nylon-12; and nylon-4,6), acrylates (methylacrylate, ethyl acrylate, 2-Chloro-ethyl-vinyl ether, 2-Ethylehexyl acrylate, hydroyethyl methacrylate, butyl acrylate, butyl methacrylate, acrylonitrile), polystyrene, and polyurethanes (composed of ethylene glycol, diethylene glycol, triethylene glycol, tetraethylene glycol, propylene glycol, tripropylene glycol, 1,3-propanediol, 1,3-butanediol, 1,4-butanediol, neopentyl glycol, 1,6-hexanediol, ethanolamine, diethanolamine, methyldiethanolamine, pehnyldiethanolamine, glycerol, trimethylolpropane, 1,2,6-hexanetriol, triethanolamine, pentaerythritol, diethyltoluenediamine, dimethylthiotoluenediamine).

In some cases the polymer precursor materials include (a) alcohols, phenolic compounds, and other mono- or polyhydroxy compounds and (b) aldehydes, ketones, and combinations thereof. Representative alcohols in this context include straight chain and branched, saturated and unsaturated alcohols. Another exemplary phenol compound is bispehnol A and related bisphenol molecules. Suitable phenolic compounds include polyhydroxy benzene, such as a dihydroxy or trihydroxy benzene. Another exemplary phenol compound is bispehnol A and related bisphenol molecules. Representative polyhydroxy benzenes include resorcinol (i.e., 1,3-dihydroxy benzene), catechol, hydroquinone, and phloroglucinol. Mixtures of two or more polyhydroxy benzenes can also be used. Phenol (monohydroxy benzene) can also be used. Representative polyhydroxy compounds include sugars, such as glucose, and other polyols, such as mannitol. Aldehydes in this context include: straight chain saturated aldeydes such as methanal (formaldehyde), ethanal (acetaldehyde), propanal (propionaldehyde), butanal (butyraldehyde), and the like; straight chain unsaturated aldehydes such as ethenone and other ketenes, 2-propenal (acrylaldehyde), 2-butenal (crotonaldehyde), 3 butenal, and the like; branched saturated and unsaturated aldehydes; and aromatic-type aldehydes such as benzaldehyde, salicylaldehyde, hydrocinnamaldehyde, and the like. Suitable ketones include: straight chain saturated ketones such as propanone and 2 butanone, and the like; straight chain unsaturated ketones such as propenone, 2 butenone, and 3-butenone (methyl vinyl ketone) and the like; branched saturated and unsaturated ketones; and aromatic-type ketones such as methyl benzyl ketone (phenylacetone), ethyl benzyl ketone, and the like. The polymer precursor materials can also be combinations of the precursors described above.

In one embodiment, the method comprises use of a first and second polymer precursor, and in some embodiments the first or second polymer precursor is a carbonyl containing compound and the other of the first or second polymer precursor is an alcohol-containing compound. In some embodiments, a first polymer precursor is a phenolic compound and a second polymer precursor is an aldehyde compound (e.g., formaldehyde). In one embodiment, of the method the phenolic compound is phenol, resorcinol, catechol, hydroquinone, phloroglucinol, or a combination thereof; and the aldehyde compound is formaldehyde, acetaldehyde, propionaldehyde, butyraldehyde, benzaldehyde, cinnamaldehyde, or a combination thereof. In a further embodiment, the phenolic compound is resorcinol, phenol or a combination thereof, and the aldehyde compound is formaldehyde. In yet further embodiments, the phenolic compound is resorcinol and the aldehyde compound is formaldehyde. In some embodiments, the polymer precursors are alcohols and carbonyl compounds (e.g., resorcinol and aldehyde) and they are present in a ratio of about 0.5:1.0, respectively.

In some embodiments, one polymer precursor is an alcohol-containing species and another polymer precursor is a carbonyl-containing species. The relative amounts of alcohol-containing species (e.g., alcohols, phenolic compounds and mono- or poly-hydroxy compounds or combinations thereof) reacted with the carbonyl containing species (e.g. aldehydes, ketones or combinations thereof) can vary substantially. In some embodiments, the ratio of alcohol-containing species to aldehyde species is selected so that the total moles of reactive alcohol groups in the alcohol-containing species is approximately the same as the total moles of reactive carbonyl groups in the aldehyde species. Similarly, the ratio of alcohol-containing species to ketone species may be selected so that the total moles of reactive alcohol groups in the alcohol containing species is approximately the same as the total moles of reactive carbonyl groups in the ketone species. The same general 1:1 molar ratio holds true when the carbonyl-containing species comprises a combination of an aldehyde species and a ketone species.

In other embodiments, the polymer precursor is a urea or an amine-containing compound. For example, in some embodiments the polymer precursor is urea or melamine. Other embodiments include polymer precursors selected from isocyanates or other activated carbonyl compounds such as acid halides and the like. Yet other embodiments employ phenolic precursors, including but not limited to phenol, resorcinol, and other hydroxy- and aromatic-ring containing molecules.

In some embodiments of the methods described herein, the molar ratio of phenolic precursor to catalyst is from about 5:1 to about 2000:1 or the molar ratio of phenolic precursor to catalyst is from about 20:1 to about 200:1. In further embodiments, the molar ratio of phenolic precursor to catalyst is from about 25:1 to about 100:1. In further embodiments, the molar ratio of phenolic precursor to catalyst is from about 5:1 to about 10:1. In further embodiments, the molar ratio of phenolic precursor to catalyst is from about 100:1 to about 5:1.

In one specific embodiment wherein one of the polymer precursors is resorcinol and/or phenol, and another polymer precursor is formaldehyde, the resorcinol and/or phenol to catalyst ratio can be varied to obtain the desired properties of the resultant polymer gel and carbon materials. In some embodiments of the methods described herein, the molar ratio of resorcinol and/or phenol to catalyst is from about 10:1 to about 2000:1 or the molar ratio of resorcinol and/or phenol to catalyst is from about 20:1 to about 200:1. In further embodiments, the molar ratio of resorcinol and/or phenol to catalyst is from about 25:1 to about 100:1. In further embodiments, the molar ratio of resorcinol and/or phenol to catalyst is from about 5:1 to about 10:1. In further embodiments, the molar ratio of resorcinol and/or phenol to catalyst is from about 100:1 to about 5:1.

The total solids content in the solution or suspension prior to polymer gel formation can be varied. The weight ratio of resorcinol to water is from about 0.05 to 1 to about 0.70 to 1. Alternatively, the ratio of resorcinol to water is from about 0.15 to 1 to about 0.6 to 1. Alternatively, the ratio of resorcinol to water is from about 0.15 to 1 to about 0.35 to 1. Alternatively, the ratio of resorcinol to water is from about 0.25 to 1 to about 0.5 to 1. Alternatively, the ratio of resorcinol to water is from about 0.3 to 1 to about 0.35 to 0.6.

Examples of solvents useful in the preparation of the polymer gels disclosed herein include but are not limited to water or alcohols such as, for example, ethanol, t-butanol, methanol or combinations thereof as well as aqueous mixtures of the same. Such solvents are useful for dissolution of the polymer precursor materials, for example dissolution of the phenolic compound. In addition, in some processes such solvents are employed for solvent exchange in the polymer gel (prior to freezing and drying), wherein the solvent from the polymerization of the precursors, for example, resorcinol and formaldehyde, is exchanged for a pure alcohol. In one embodiment of the present application, a polymer gel is prepared by a process that does not include solvent exchange.

Suitable catalysts in the preparation of the polymer gels include volatile basic catalysts that facilitate polymerization of the precursor materials into a monolithic polymer. The catalyst can also comprise various combinations of the catalysts described above. In embodiments comprising phenolic compounds, or other polymer precursors, such catalysts can be used in the range of molar ratios of 5:1 to 200:1 phenolic compound:catalyst. For example, in some specific embodiments such catalysts can be used in the range of molar ratios of 5:1 to 10:1 phenolic compound:catalyst.

In some embodiments, the gel polymerization process is performed under catalytic conditions. Accordingly, in some embodiments, the method comprises admixing a catalyst with the solvent-free mixture. In some embodiments, the catalyst is a solid at room temperature and pressure.

In some embodiments, the catalyst is a liquid at room temperature and pressure. In some embodiments, the catalyst is a liquid at room temperature and pressure that does not provide dissolution of one or more of the other polymer precursors.

In some embodiments, the catalyst comprises a basic volatile catalyst. For example, in one embodiment, the basic volatile catalyst comprises ammonium carbonate, ammonium bicarbonate, ammonium acetate, ammonium hydroxide, or combinations thereof. In a further embodiment, the basic volatile catalyst is ammonium carbonate. In another further embodiment, the basic volatile catalyst is ammonium acetate.

The molar ratio of catalyst to polymer precursor (e.g., phenolic compound) may have an effect on the final properties of the polymer gel as well as the final properties of the carbon materials. Thus, in some embodiments such catalysts are used in the range of molar ratios of 5:1 to 2000:1 polymer precursor:catalyst. In some embodiments, such catalysts can be used in the range of molar ratios of 10:1 to 400:1 polymer precursor:catalyst. For example in other embodiments, such catalysts can be used in the range of molar ratios of 5:1 to 100:1 polymer precursor:catalyst. For example, in some embodiments the molar ratio of catalyst to polymer precursor is about 400:1. In other embodiments the molar ratio of catalyst to polymer precursor is about 100:1. In other embodiments the molar ratio of catalyst to polymer precursor is about 50:1. In other embodiments the molar ratio of catalyst to polymer precursor is about 10:1. In certain of the foregoing embodiments, the polymer precursor is a phenolic compound such as resorcinol or phenol.

In still other embodiments, the method comprises admixing an acid. In certain embodiments, the acid is a solid at room temperature and pressure. In some embodiments, the acid is a liquid at room temperature and pressure. In some embodiments, the acid is a liquid at room temperature and pressure that does not provide dissolution of one or more of the other polymer precursors.

The acid may be selected from any number of acids suitable for the polymerization process. For example, in some embodiments the acid is acetic acid and in other embodiments the acid is oxalic acid. In further embodiments, the acid is mixed with the first or second solvent in a ratio of acid to solvent of 99:1, 90:10, 75:25, 50:50, 25:75, 20:80, 10:90 or 1:90. In other embodiments, the acid is acetic acid and the first or second solvent is water. In other embodiments, acidity is provided by adding a solid acid.

The total content of acid in the mixture can be varied to alter the properties of the final product. In some embodiments, the acid is present from about 1% to about 50% by weight of mixture. In other embodiments, the acid is present from about 5% to about 25%. In other embodiments, the acid is present from about 10% to about 20%, for example about 10%, about 15% or about 20%.

In certain embodiments, the polymer precursor components are blended together and subsequently held for a time and at a temperature sufficient to achieve polymerization. One or more of the polymer precursor components can have particle size less than about 20 mm in size, for example less than 10 mm, for example less than 7 mm, for example, less than 5 mm, for example less than 2 mm, for example less than 1 mm, for example less than 100 microns, for example less than 10 microns. In some embodiments, the particle size of one or more of the polymer precursor components is reduced during the blending process.

The blending of one or more polymer precursor components in the absence of solvent can be accomplished by methods described in the art, for example ball milling, jet milling, Fritsch milling, planetary mixing, and other mixing methodologies for mixing or blending solid particles while controlling the process conditions (e.g., temperature). The mixing or blending process can be accomplished before, during, and/or after (or combinations thereof) incubation at the reaction temperature.

Reaction parameters include aging the blended mixture at a temperature and for a time sufficient for the one or more polymer precursors to react with each other and form a polymer. In this respect, suitable aging temperature ranges from about room temperature to temperatures at or near the melting point of one or more of the polymer precursors. In some embodiments, suitable aging temperature ranges from about room temperature to temperatures at or near the glass transition temperature of one or more of the polymer precursors. For example, in some embodiments the solvent free mixture is aged at temperatures from about 20° C. to about 600° C., for example about 20° C. to about 500° C., for example about 20° C. to about 400° C., for example about 20° C. to about 300° C., for example about 20° C. to about 200° C. In certain embodiments, the solvent free mixture is aged at temperatures from about 50 to about 250° C.

The reaction duration is generally sufficient to allow the polymer precursors to react and form a polymer, for example the mixture may be aged anywhere from 1 hour to 48 hours, or more or less depending on the desired result. Typical embodiments include aging for a period of time ranging from about 2 hours to about 48 hours, for example in some embodiments aging comprises about 12 hours and in other embodiments aging comprises about 4-8 hours (e.g., about 6 hours).

In certain embodiments, an electrochemical modifier is incorporated during the above described polymerization process. For example, in some embodiments, an electrochemical modifier in the form of metal particles, metal paste, metal salt, metal oxide or molten metal can be dissolved or suspended into the mixture from which the gel resin is produced Exemplary electrochemical modifiers for producing composite materials may fall into one or more than one of the chemical classifications. In some embodiments, the electrochemical modifier is a saccharide, including but not limited to, chitin, chitosan, glucose, sucrose, fructose, cellulose, and combinations thereof. In one embodiment, the electrochemical modifier is a biopolymer such as lignin. In one embodiment, the electrochemical modifier is a protein such as gelatin. In one embodiment, the electrochemical modifier is a biopolymer such as lignin. In one embodiment, the electrochemical modifier is an amine compound such as urea or melamine, or combinations thereof. In certain embodiments, the electrochemical modifier is a halogen salt, including but not limited to sodium chloride, lithium bromide, potassium fluoride, and combinations thereof. In certain embodiments, the electrochemical modifier is a nitrate salt, including but not limited to lithium nitrate, sodium nitrate, and combinations thereof. In certain embodiments, the electrochemical modifier is a carbide compound, including but not limited to calcium carbide, silicon carbide, and combinations thereof. In certain embodiments, the electrochemical modifier comprises a metal, and exemplary species includes, but are not limited to aluminum isoproproxide, manganese acetate, nickel acetate, iron acetate, tin chloride, silicon chloride, and combinations thereof. In certain embodiments, the electrochemical modifier is a phosphate compound, including but not limited to phytic acid, phosphoric acid, ammonium dihydrogenphosphate, and combinations thereof. In certain embodiments, the electrochemical modifier comprises silicon, and exemplary species includes, but are not limited to silicon powders, silicon nanotubes, polycrystalline silicon, nanocrystalline silicon, amorpohous silicon, porous silicon, nano sized silicon, nano-featured silicon, nano-sized and nano-featured silicon, silicyne, and black silicon, and combinations thereof.

Electrochemical modifiers can be combined with a variety of polymer systems through either physical mixing or chemical reactions with latent (or secondary) polymer functionality. Examples of latent polymer functionality include, but are not limited to, epoxide groups, unsaturation (double and triple bonds), acid groups, alcohol groups, amine groups, basic groups. Crosslinking with latent functionality can occur via heteroatoms (e.g. vulcanization with sulfur, acid/base/ring opening reactions with phosphoric acid), reactions with organic acids or bases (described above), coordination to transition metals (including but not limited to Ti, Cr, Mn, Fe, Co, Ni, Cu, Zn, Zr, Nb, Mo, Ag, Au), ring opening or ring closing reactions (rotaxanes, spiro compounds, etc).

Polymerization to form a polymer gel can be accomplished by various means described in the art and may include addition of an electrochemical modifier. For instance, polymerization can be accomplished by incubating suitable polymer precursor materials, and optionally an electrochemical modifier, in the presence of a suitable catalyst for a sufficient period of time. The time for polymerization can be a period ranging from minutes or hours to days, depending on the temperature (the higher the temperature the faster, the reaction rate, and correspondingly, the shorter the time required). The polymerization temperature can range from room temperature to a temperature approaching (but lower than) the boiling point of the starting solution. For example, in some embodiments the polymer gel is aged at temperatures from about 20° C. to about 120° C., for example about 20° C. to about 100° C. Other embodiments include temperature ranging from about 30° C. to about 90° C., for example about 45° C. or about 85° C. In other embodiments, the temperature ranges from about 65° C. to about 80° C., while other embodiments include aging at two or more temperatures, for example about 45° C. and about 75-85° C. or about 80-85° C.

Electrochemical modifiers can also be added to the polymer system through physical blending. Physical blending can include but is not limited to melt blending of polymers and/or co-polymers, the inclusion of discrete particles, chemical vapor deposition of the electrochemical modifier and coprecipitation of the electrochemical modifier and the main polymer material.

In another embodiment the electrochemical modifier is a particle. The particles of electrochemical modifier can be added with differing particle size distributions. In one embodiment the electrochemical modifier particles have a D50 of 10 nm or 50 nm or 100 nm or 150 nm or 200 nm or 500 nm or 1 μm or 1.5 μm or 2 μm or 3 μm or 5 μm or 10 μm or 20 μm or 40 μm or up to 50 μm, or up to 100 μm. In some embodiments the polymer and particle form a mixture. In other embodiments the particle is covalently bonded to the polymer. In other embodiments the particle is ironically bonded to the polymer. In some cases the particle is silicon, in other cases the particles are a different Group 14 elements (Ge, Sn, Pb), Group 15 elements (P, As, Sb), Group 16 elements (S, Se, Te). In some cases the particle is comprised of a single element, in other cases it is comprised of a mixture of two or more elements.

Accordingly, for some embodiments of energy storage applications, the preferred electrochemical modifier particle size (e.g., silicon particle size) is less than 1 micron, preferable less than 800 nm, preferably less than 300 nm, preferably less than 150 nm, preferably less than 100 nm, preferably less than 90 nm, preferably less than 70 nm, preferably less than 50 nm, preferably less than 33 nm, preferably less than 20 nm. In certain instances, the electrochemical modifier particle size is between 5 and 20 nm. In specific instances, the electrochemical modifier particle size is less than 90 nm for a nanoparticle. In specific instances, the electrochemical modifier particle size is less than 70 nm for a nanowire. In specific instances, the electrochemical modifier particle size is less than 33 nm for a nanofilm.

A silicon particle of the dimensions described above is generally referred to as a nano-sized silicon particle. The particle size is typically described as the (Dv50) or silicon particle size at 50% of the volume distribution, as measured by various methods known in the art, for instance by laser diffraction particle sizing techniques.

Alternatively, or in addition the silicon having a primary particle size in the ranges described above, the silicon particle can also exhibit nano features. The silicon nanofeatures preferably comprise a nano feature size less than 1 micron, preferably less than 300 nm, preferably less than 150 nm, preferably less than 100 μm, preferably less than 50 nm, preferably less than 30 nm, preferably less than 15 nm. A silicon particle with the features described above is generally referred to as a silicon particle with nano-sized features. The nano-sized features can be discerned by various methods known in the art, for instance by scanning electron microscopy. Electrochemical modifier particles can be dispersed in the organic polymer solution or pre-polymer in a variety of ways. In one embodiment, the particles are dispersed by sonication. In another embodiment, the particles are dispersed by mixing. In another embodiment, the particles are dispersed by modifying the surface chemistry of the particles or the pH of the solution. In another embodiment, the particles are dispersed by use of a surfactant. In one embodiment, the surfactant is SPAN 80. In another embodiment the particles are dispersed in an emulsion or suspension. In one embodiment the surfactant is used in combination with a hydrocarbon solvent. In one embodiment, the hydrocarbon is cyclohexane. In one embodiment the hydrocarbon is mineral oil. In another embodiment the hydrocarbon is vegetable oil.

In some instances the electrochemical modifier can be added via a metal salt solution. The metal salt solution or suspension may comprise acids and/or alcohols to improve solubility of the metal salt. In yet another variation, the polymer gel (either before or after an optional drying step) is contacted with a paste comprising the electrochemical modifier. In yet another variation, the polymer gel (either before or after an optional drying step) is contacted with a metal or metal oxide sol comprising the desired electrochemical modifier.

In addition to the above exemplified electrochemical modifiers, the composite materials may comprise one or more additional forms (i.e., allotropes) of carbon. In this regard, it has been found that inclusion of different allotropes of carbon such as graphite, amorphous carbon, diamond, C60, carbon nanotubes (e.g., single and/or multi-walled), graphene and/or carbon fibers into the composite materials is effective to optimize the electrochemical properties of the composite materials. The various allotropes of carbon can be incorporated into the carbon materials during any stage of the preparation process described herein. For example, during the solution phase, during the gelation phase, during the curing phase, during the pyrolysis phase, during the milling phase, or after milling. In some embodiments, the second carbon form is incorporated into the composite material by adding the second carbon form before or during polymerization of the polymer gel as described in more detail herein. The polymerized polymer gel containing the second carbon form is then processed according to the general techniques described herein to obtain a carbon material containing a second allotrope of carbon.

In some embodiments the organic polymer and the electrochemical modifier have different solvents, ratios of solvents, mixtures of solvents, catalysts type, catalyst ratios, solvent pH, type of acid, or base.

By changing either the relative solids concentration of the carbon containing polymer solution and/or the relative solids concentration of the electrochemical modifier containing polymer solution, the electrochemical modifier content of the final composite can be varied. In one embodiment the solids concentration of the organic polymer solution can be varied between 1% to 99% solids or from 10% to 90% solids, or from 20% to 80% solids or from 20% to 50% or from 30% to 40% solids. In one embodiment the solids concentration of the polymer solution is 35%. In one embodiment the solids concentration of the electrochemical modifier polymer solution can be varied between 1% to 99% solids or from 10% to 90% solids, or from 20% to 80% solids or from 20% to 50% or from 30% to 40% solids. In one embodiment the solids concentration of the electrochemical modifier solution is 35%. In one embodiment the electrochemical modifier is a TEOS polymer is mixed with ethanol. In other embodiments, the TEOS polymer is mixed with acetone, or isopropyl alcohol.

Changing the ratio of organic polymer to the electrochemical modifier polymer solutions in any given mixture may alter the final ratio of the carbon to electrochemical modifier in the final composite. In one embodiment the ratio of organic polymer to electrochemical modifier polymer is about 10:1 or 9:1 or 8:1 or 7:1 or 6:1 or 5:1 or 4:1 or 3:1 or 2:1, or 1:1, or 1:2, or 1:3 or 1:4 or 1:5, or 1:6 or 1:7 or 1:8 or 1:9 or 1:10.

In one embodiment the organic polymer/electrochemical modifier polymer solution is heated until a gel is formed. In one embodiment a TEOS/RF solution is heated until a gel is formed. In one embodiment the heating is carried out in a sealed container. In one embodiment the heating is carried out in a polymer reactor. For example, a stirred polymer reactor. In one embodiment the solution is heated in an emulsion, or in an inverse emulsion or in a suspension. The temperature at which gelation takes place is known to impact the structure of the polymer and can be modified to control the structure of the final composite material. In one embodiment the gel is formed at 40 C or 50 C or 60 C or 70 C or 80 C or 90 C or 100 C or 110 C or 120 C or 130 C. In one embodiment the gel is formed in a two-step reaction. For example one temperature to cause the organic polymer to gel and a different temperature to cause the electrochemical modifier polymer to gel. In one embodiment the two step polymerization is carried out at 40 C or 50 C or 60 C or 70 C or 80 C or 90 C or 100 C or 110 C or 120 C or 130 C and then the second step is carried out at 40 C or 50 C or 60 C or 70 C or 80 C or 90 C or 100 C or 110 C or 120 C or 130 C. In some embodiments the organic polymer is fully gelled and then an electrochemical modifier polymer solution is added through a solvent exchange to dope the organic polymer. In some embodiments the electrochemical modifier polymer is fully gelled and then an organic polymer solution is added through a solvent exchange to dope the electrochemical modifier polymer. In some embodiments, the fraction of solvent in the reaction mixture is low or the reaction can be essentially solvent free. For example, the fraction of solvent in the reaction mixture can be can less than 80% of the total mass of reaction mixture, for example less than 70%, for example less than 60%, for example less than 50%, for example less than 40%, for example less than 30%, for example less than 20%, for example less than 10%, for example less than 5%, for example less than 1%, for example less than 0.1%, for example less than 0.01%. Without being bound by theory, a pyrolyzed carbon yield from a polymeric material can be about 50%. Accordingly, the ratio of pyrolzyed carbon produced per unit mass of polymer processed can be less than about 10, less than about 7, less than about 5, less than about 4, less than about 3, less than about 2.5, less than about 2.1. In some embodiments, the ratio of pyrolzyed carbon produced per unit mass of polymer processed is about 2. In some embodiments, the ratio of pyrolzyed carbon produced per unit mass of polymer processed is less than 2.

The pyrolzyed carbon produced from low solvent or essentially solvent-free reaction mixtures can be activated, and the ratio of activated carbon to polymer processed is higher than the ratio of pyrolzyed carbon to polymer processed, depending on the level of activation desired. Without being bound by theory, a activated carbon yield from a pyrolzyed carbon material can be about 50%. Accordingly, the ratio of activated carbon produced per unit mass of polymer processed can be less than about 14, less than about 10, less than about 8, less than about 6, less than about 5, less than about 4.5, less than about 4.1. In some embodiments, the ratio of activated carbon produced per unit mass of polymer processed is about 4 or lower.

The structure of the polymer precursors suitable for use in a low solvent or essentially solvent free reaction mixture is not particularly limited, provided that the polymer precursor is capable of reacting with another polymer precursor or with a second polymer precursor to form a polymer. Polymer precursors include amine-containing compounds, alcohol-containing compounds and carbonyl-containing compounds, for example in some embodiments the polymer precursors are selected from an alcohol, a phenol, a polyalcohol, a sugar, an alkyl amine, an aromatic amine, an aldehyde, a ketone, a carboxylic acid, an ester, a urea, an acid halide and an isocyanate.

In one embodiment employing a low or essentially solvent free reaction mixture, the method comprises use of a first and second polymer precursor, and in some embodiments the first or second polymer precursor is a carbonyl containing compound and the other of the first or second polymer precursor is an alcohol containing compound. In some embodiments, a first polymer precursor is a phenolic compound and a second polymer precursor is an aldehyde compound (e.g., formaldehyde). In one embodiment, of the method the phenolic compound is phenol, resorcinol, catechol, hydroquinone, phloroglucinol, or a combination thereof; and the aldehyde compound is formaldehyde, acetaldehyde, propionaldehyde, butyraldehyde, benzaldehyde, cinnamaldehyde, or a combination thereof. In a further embodiment, the phenolic compound is resorcinol, phenol or a combination thereof, and the aldehyde compound is formaldehyde. In yet further embodiments, the phenolic compound is resorcinol and the aldehyde compound is formaldehyde. In some embodiments, the polymer precursors are alcohols and carbonyl compounds (e.g., resorcinol and aldehyde) and they are present in a ratio of about 0.5:1.0, respectively.

The polymer precursor materials suitable for low or essentially solvent free reaction mixture as disclosed herein include (a) alcohols, phenolic compounds, and other mono- or polyhydroxy compounds and (b) aldehydes, ketones, and combinations thereof. Representative alcohols in this context include straight chain and branched, saturated and unsaturated alcohols. Suitable phenolic compounds include polyhydroxy benzene, such as a dihydroxy or trihydroxy benzene. Representative polyhydroxy benzenes include resorcinol (i.e., 1,3-dihydroxy benzene), catechol, hydroquinone, and phloroglucinol. Other suitable compounds in this regard are bisphenols, for instance, bisphenol A. Mixtures of two or more polyhydroxy benzenes can also be used. Phenol (monohydroxy benzene) can also be used. Representative polyhydroxy compounds include sugars, such as glucose, sucrose, fructose, chitin and other polyols, such as mannitol. Aldehydes in this context include: straight chain saturated aldeydes such as methanal (formaldehyde), ethanal (acetaldehyde), propanal (propionaldehyde), butanal (butyraldehyde), and the like; straight chain unsaturated aldehydes such as ethenone and other ketenes, 2-propenal (acrylaldehyde), 2-butenal (crotonaldehyde), 3 butenal, and the like; branched saturated and unsaturated aldehydes; and aromatic-type aldehydes such as benzaldehyde, salicylaldehyde, hydrocinnamaldehyde, and the like. Suitable ketones include: straight chain saturated ketones such as propanone and 2 butanone, and the like; straight chain unsaturated ketones such as propenone, 2 butenone, and 3 butenone (methyl vinyl ketone) and the like; branched saturated and unsaturated ketones; and aromatic-type ketones such as methyl benzyl ketone (phenylacetone), ethyl benzyl ketone, and the like. The polymer precursor materials can also be combinations of the precursors described above.

In some embodiments, one polymer precursor in the low or essentially solvent free reaction mixture is an alcohol-containing species and another polymer precursor is a carbonyl-containing species. The relative amounts of alcohol-containing species (e.g., alcohols, phenolic compounds and mono- or poly-hydroxy compounds or combinations thereof) reacted with the carbonyl containing species (e.g. aldehydes, ketones or combinations thereof) can vary substantially. In some embodiments, the ratio of alcohol-containing species to aldehyde species is selected so that the total moles of reactive alcohol groups in the alcohol-containing species is approximately the same as the total moles of reactive carbonyl groups in the aldehyde species. Similarly, the ratio of alcohol-containing species to ketone species may be selected so that the total moles of reactive alcohol groups in the alcohol containing species is approximately the same as the total moles of reactive carbonyl groups in the ketone species. The same general 1:1 molar ratio holds true when the carbonyl-containing species comprises a combination of an aldehyde species and a ketone species.

In other embodiments, the polymer precursor in the low or essentially solvent free reaction mixture is a urea or an amine containing compound. For example, in some embodiments the polymer precursor is urea, melamine, hexamethylenetetramine (HMT) or combination thereof. Other embodiments include polymer precursors selected from isocyanates or other activated carbonyl compounds such as acid halides and the like.

Some embodiments of the disclosed methods include preparation of low or solvent-free polymer gels (and carbon materials) comprising electrochemical modifiers. Such electrochemical modifiers include, but are not limited to, nitrogen, silicon, and sulfur. In other embodiments, the electrochemical modifier comprises fluorine, iron, tin, silicon, nickel, aluminum, zinc, or manganese. The electrochemical modifier can be included in the preparation procedure at any step. For example, in some the electrochemical modifier is admixed with the mixture, the polymer phase or the continuous phase.

The blending of one or more polymer precursor components in the absence of solvent can be accomplished by methods described in the art, for example ball milling, jet milling, Fritsch milling, planetary mixing, and other mixing methodologies for mixing or blending solid particles while controlling the process conditions (e.g., temperature). The mixing or blending process can be accomplished before, during, and/or after (or combinations thereof) incubation at the reaction temperature.

Reaction parameters include aging the blended mixture at a temperature and for a time sufficient for the one or more polymer precursors to react with each other and form a polymer. In this respect, suitable aging temperature ranges from about room temperature to temperatures at or near the melting point of one or more of the polymer precursors. In some embodiments, suitable aging temperature ranges from about room temperature to temperatures at or near the glass transition temperature of one or more of the polymer precursors. For example, in some embodiments the solvent free mixture is aged at temperatures from about 20° C. to about 600° C., for example about 20° C. to about 500° C., for example about 20° C. to about 400° C., for example about 20° C. to about 300° C., for example about 20° C. to about 200° C. In certain embodiments, the solvent free mixture is aged at temperatures from about 50 to about 250° C.

The porous carbon material can be achieved via pyrolysis of a polymer produced from precursors materials as described above. In some embodiments, the porous carbon material comprises an amorphous activated carbon that is produced by pyrolysis, physical or chemical activation, or combination thereof in either a single process step or sequential process steps.

The temperature and dwell time of pyrolysis can be varied, for example the dwell time van vary from 1 min to 10 min, from 10 min to 30 min, from 30 min to 1 hour, for 1 hour to 2 hours, from 2 hours to 4 hours, from 4 hours to 24 h. The temperature can be varied, for example, the pyrolysis temperature can vary from 200 to 300 C, from 250 to 350 C, from 350 C to 450 C, from 450 C to 550 C, from 540 C to 650 C, from 650 C to 750 C, from 750 C to 850 C, from 850 C to 950 C, from 950 C to 1050 C, from 1050 C to 1150 C, from 1150 C to 1250 C. The pyrolysis can be accomplished in an inert gas, for example nitrogen, or argon. In some embodiments, an alternate gas is used, or a mixture of an inert gas such as nitrogen with the alternate gas. Suitable alternate gases in this context include, but are not limited to, carbon dioxide, carbon monoxide, water (steam), air, oxygen, and further combinations thereof.

Either prior to the pyrolysis, and/or after pyrolysis, the porous carbon particle may be subjected to a particle size reduction. The particle size reduction can be accomplished by a variety of techniques known in the art, for example by jet milling in the presence of various gases including air, nitrogen, argon, helium, supercritical steam, and other gases known in the art. Other particle size reduction methods, such as grinding, ball milling, jet milling, water jet milling, and other approaches known in the art are also envisioned.

In some embodiments, the surface area of the porous carbon material can comprise a surface area greater than 500 m2/g, for example greater than 750 m2/g, for example greater than 1000 m2/g, for example greater than 1250 m2/g, for example greater than 1500 m2/g, for example greater than 1750 m2/g, for example greater than 2000 m2/g, for example greater than 2500 m2/g, for example greater than 3000 m2/g. In other embodiments, the surface area of the porous carbon material can be less than 500 m2/g. In some embodiments, the surface area of the porous carbon material is between 200 and 500 m2/g. In some embodiments, the surface area of the porous carbon material is between 100 and 200 m2/g. In some embodiments, the surface area of the porous carbon material is between 50 and 100 m2/g. In some embodiments, the surface area of the porous carbon material is between 10 and 50 m2/g. In some embodiments, the surface area of the porous carbon material can be less than 10 m2/g.

In some embodiments, the pore volume of the porous carbon material is greater than 0.5 cm3/g, for example greater than 0.6 cm3/g, for example greater than 0.7 cm3/g, for example greater than 0.8 cm3/g, for example greater than 0.9 cm3/g, for example greater than 1.0 cm3/g, for example greater than 1.1 cm3/g, for example greater than 1.2 cm3/g, for example greater than 1.4 cm3/g, for example greater than 1.6 cm3/g, for example greater than 1.8 cm3/g, for example greater than 2.0 cm3/g. In other embodiments, the pore volume of the porous silicon material is less than 0.5 cm3, for example between 0.1 cm3/g and 0.5 cm3/g. In certain other embodiments, the pore volume of the porous silicon material is between 0.01 cm3/g and 0.1 cm3/g.

In some other embodiments, the carbon is an amorphous activated carbon with a pore volume between 0.2 and 2.0 cm3/g. In certain embodiments, the carbon is an amorphous activated carbon with a pore volume between 0.4 and 1.5 cm3/g. In certain embodiments, the carbon is an amorphous activated carbon with a pore volume between 0.5 and 1.2 cm3/g. In certain embodiments, the carbon is an amorphous activated carbon with a pore volume between 0.6 and 1.0 cm3/g.

In some other embodiments, the porous carbon material comprises a tap density of less than 1.0 g/cm$^3$, for example less than 0.8 g/cm$^3$, for example less than 0.6 g/cm$^3$, for example less than 0.5 g/cm$^3$, for example less than 0.4 g/cm$^3$, for example less than 0.3 g/cm$^3$, for example less than 0.2 g/cm$^3$, for example less than 0.1 g/cm3.

The surface functionality of the porous carbon material can vary. One property which can be predictive of surface functionality is the pH of the porous carbon material. The presently disclosed porous carbon materials comprise pH values ranging from less than 1 to about 14, for example less than 5, from 5 to 8 or greater than 8. In some embodiments, the pH of the porous carbon is less than 4, less than 3, less than 2 or even less than 1. In other embodiments, the pH of the porous carbon is between about 5 and 6, between about 6 and 7, between about 7 and 8 or between 8 and 9 or between 9 and 10. In still other embodiments, the pH is high and the pH of the porous carbon ranges is greater than 8, greater than 9, greater than 10, greater than 11, greater than 12, or even greater than 13.

The pore volume distribution of the porous carbon scaffold can vary. For example, the % micropores can comprise less than 30%, for example less than 20%, for example less than 10%, for example less than 5%, for example less than 4%, for example less than 3%, for example less than 2%, for example less than 1%, for example less than 0.5%, for example less than 0.2%, for example, less than 0.1%. In certain embodiments, there is no detectable micropore volume in the porous carbon scaffold.

The mesopores comprising the porous carbon scaffold material can vary. For example, the % mesopores can comprise less than 30%, for example less than 20%, for example less than 10%, for example less than 5%, for example less than 4%, for example less than 3%, for example less than 2%, for example less than 1%, for example less than 0.5%, for example less than 0.2%, for example, less than 0.1%. In certain embodiments, there is no detectable mesopore volume in the porous carbon scaffold.

In some embodiments, the pore volume distribution of the porous carbon scaffold material comprises more than 50% macropores, for example more than 60% macropores, for example more than 70% macropores, for example more than 80% macropores, for example more than 90% macropores, for example more than 95% macropores, for example more than 98% macropores, for example more than 99% macropores, for example more than 99.5% macropores, for example more than 99.9% macropores.

In certain preferred embodiments, the pore volume of the porous carbon scaffold comprises a blend of micropores, mesopores, and macropores. Accordingly, in certain embodiments, the porous carbon scaffold comprises 0-20% micropores, 30-70% mesopores, and less than 10% macropores. In certain other embodiments, the porous carbon scaffold comprises 0-20% micropores, 0-20% mesopores, and 70-95% macropores. In certain other embodiments, the porous carbon scaffold comprises 20-50% micropores, 50-80% mesopores, and 0-10% macropores. In certain other embodiments, the porous carbon scaffold comprises 40-60% micropores, 40-60% mesopores, and 0-10% macropores. In certain other embodiments, the porous carbon scaffold comprises 80-95% micropores, 0-10% mesopores, and 0-10% macropores. In certain other embodiments, the porous carbon scaffold comprises 0-10% micropores, 30-50% mesopores, and 50-70% macropores. In certain other embodiments, the porous carbon scaffold comprises 0-10% micropores, 70-80% mesopores, and 0-20% macropores. In certain other embodiments, the porous carbon scaffold comprises 0-20% micropores, 70-95% mesopores, and 0-10% macropores. In certain other embodiments, the porous carbon scaffold comprises 0-10% micropores, 70-95% mesopores, and 0-20% macropores.

In certain embodiments, the % of pore volume in the porous carbon scaffold representing pores between 100 and 1000 A (10 and 100 nm) comprises greater than 30% of the total pore volume, for example greater than 40% of the total pore volume, for example greater than 50% of the total pore volume, for example greater than 60% of the total pore volume, for example greater than 70% of the total pore volume, for example greater than 80% of the total pore volume, for example greater than 90% of the total pore volume, for example greater than 95% of the total pore volume, for example greater than 98% of the total pore volume, for example greater than 99% of the total pore volume, for example greater than 99.5% of the total pore volume, for example greater than 99.9% of the total pore volume.

In certain embodiments, the pore volume in the porous carbon scaffold representing pores between 100 and 1000 A (10 and 100 nm) is greater than 0.1 cm3/g, for example greater than 0.2 cm3/g, for example greater than 0.3 cm3/g, for example greater than 0.4 cm3/g, for example greater than 0.5 cm3/g, for example greater than 0.6 cm3/g, for example greater than 0.7 cm3/g, for example greater than 0.8 cm3/g, for example greater than 0.9 cm3/g, for example greater than 1.0 cm3/g, for example greater than 1.1 cm3/g, for example greater than 1.2 cm3/g, for example greater than 1.3 cm3/g, for example greater than 1.4 cm3/g, for example greater than 1.5 cm3/g, for example greater than 2.0 cm3/g.

In certain embodiments, the porous carbon scaffold comprises a total pore volume greater than 0.5 cm3/g and the % macropores is greater than 80%. In certain other embodiments, the porous carbon scaffold comprises a total pore volume is greater than 1.0 cm3/g and the % macropores is greater than 90%. In certain embodiments, the porous carbon scaffold comprises a total pore volume greater than 0.5 cm3/g and the % pore between 100 and 1000 A is greater than 80%. In certain other embodiments, the porous carbon scaffold comprises a total pore volume is greater than 1.0 cm3/g and the % pore between 100 and 1000 A is greater than 90%.

The porous carbon scaffold, i.e., the carbon without electrochemical modifier may comprise a majority (e.g., >50%) of the total pore volume residing in pores of certain diameter. For example, in some embodiments greater than 50%, greater than 60%, greater than 70%, greater than 80%, greater than 90% or even greater than 95% of the total pore volume resides in pores having a diameter of 1 nm or less. In other embodiments greater than 50%, greater than 60%, greater than 70%, greater than 80%, greater than 90% or even greater than 95% of the total pore volume resides in pores having a diameter of 100 nm or less. In other embodiments greater than 50%, greater than 60%, greater than 70%, greater than 80%, greater than 90% or even greater than 95% of the total pore volume resides in pores having a diameter of 0.5 nm or less.

In some embodiments, the tap density of the carbon without electrochemical modifier may be predictive of their ability to incorporate electrochemical modifiers and hence electrochemical performance, for example the volumetric capacity. While not limiting in any way, the pore volume of a carbon without electrochemical modifier material may be related to its tap density and carbon without electrochemical modifiers having low pore volume are sometimes found to have high tap density (and vice versa). Accordingly, carbon without electrochemical modifier having low tap density (e.g., <0.3 g/cc), medium tap density (e.g., from 0.3 to 0.5 g/cc) or high tap density (e.g., >0.5 g/cc) are provided.

In yet some other embodiments, the carbon without electrochemical modifier comprises a tap density greater than or equal to 0.3 g/cc. In yet some other embodiments, the carbon without electrochemical modifier comprise a tap density ranging from about 0.3 g/cc to about 0.5 g/cc. In some embodiments, the carbon without electrochemical modifier comprise a tap density ranging from about 0.35 g/cc to about 0.45 g/cc. In some other embodiments, the carbon without electrochemical modifier comprise a tap density ranging from about 0.30 g/cc to about 0.40 g/cc. In some embodiments, the carbon without electrochemical modifier comprise a tap density ranging from about 0.40 g/cc to about 0.50 g/cc. In some embodiments of the foregoing, the carbon without electrochemical modifier comprises a medium total pore volume (e.g., from about 0.1 cc/g to about 0.6 cc/g).

In yet some other embodiments, the carbon without electrochemical modifier can comprise a tap density greater than about 0.5 g/cc. In some other embodiments, the carbon without electrochemical modifier comprises a tap density ranging from about 0.5 g/cc to about 2.0 g/cc. In some other embodiments, the carbon without electrochemical modifier comprise a tap density ranging from about 0.5 g/cc to about 1.0 g/cc. In some embodiments, the carbon without electrochemical modifier comprise a tap density ranging from about 0.5 g/cc to about 0.75 g/cc. In some embodiments, the carbon without electrochemical modifier comprise a tap density ranging from about 0.75 g/cc to about 1.0 g/cc, for example from about 0.75 g/cc to about 0.95 g/cc, for example, from about 0.75 to about 1.2 g/cc. In some embodiments of the foregoing, the carbon without electrochemical modifier comprises a low, medium or high total pore volume.

Their skeletal density as measured by helium pycnometry can also characterize the density of the carbon without electrochemical modifier. In certain embodiments, the skeletal density of the carbon without electrochemical modifier ranges from about 1 g/cc to about 3 g/cc, for example from about 1.5 g/cc to about 2.3 g/cc. In other embodiments, the skeletal density ranges from about 1.5 cc/g to about 1.6 cc/g, from about 1.6 cc/g to about 1.7 cc/g, from about 1.7 cc/g to about 1.8 cc/g, from about 1.8 cc/g to about 1.9 cc/g, from about 1.9 cc/g to about 2.0 cc/g, from about 2.0 cc/g to about 2.1 cc/g, from about 2.1 cc/g to about 2.2 cc/g or from about 2.2 cc/g to about 2.3 cc/g, from about 2.3 cc to about 2.4 cc/g, for example from about 2.4 cc/g to about 2.5 cc/g.

In all cases the properties of the carbon without electrochemical modifier can easily be measured before incorporation of the electrochemical modifier. The properties of the carbon without electrochemical modifier can also be measured by removal of the electrochemical modifier after the fact. In the case of silicon this can easily be accomplished by dissolving the silicon with a solvent that does not impact the carbon and then measuring the properties of the carbon without electrochemical modifier.

C. Introduction of Silicon into Scaffold Materials to Create Composite Materials Nano-sized silicon is difficult to handle and to process in traditional electrodes. Due to the high surface area and preference to agglomerate, uniform dispersion and coating requires special procedures and/or binder systems. To truly be a drop in replacement for existing graphite anode materials, the next generation Si—C material needs to be micron-sized. In an embodiment, the size distribution for the composite is relatively uniform, with upper and lower bounds within a range, for example, Dv10 of no less than 5 nm, a Dv50 between 500 nm and 5 μm, and a Dv90 no greater than 50 μm. In certain embodiments, the composite particles are comprised of the following size distribution: Dv10 of no less than 50 nm, a Dv50 between 1 μm and 10 μm, and a Dv90 no greater than 30 μm. In certain other embodiments, the composite particles are comprised of the following size distribution: Dv10 of no less than 100 nm, a Dv50 between 2 μm and 8 μm, and a Dv90 no greater than 20 μm. In certain further embodiments, the composite particles comprise the following size distribution: Dv10 of no less than 250 nm, a Dv50 between 4 μm and 6 μm, and a Dv90 no greater than 15 μm.

In certain embodiments, the silicon is introduced into the porous carbon by nanoparticle impregnation. Accordingly, a nano-sized or nano-sized and nano-featured silicon is first produced. In an embodiment, the nano sized or nano-sized and nano-featured silicon is produced according to methods described in U.S. No. 62/205,542 "Nano-Featured Porous Silicon Materials," U.S. No. 62/208,357 "Nano-Featured Porous Silicon Materials," and/or U.S. No. 62/209,651 "Composites of Porous Nano-Featured Silicon Materials and Carbon Materials," the full disclosures of which are hereby incorporated by reference in their entireties for all purposes.

The porous carbon can be mixed with the nano silicon, for example in a stirred reactor vessel wherein the carbon particles, for example micro sized porous carbon particles, are co-suspended with nano silicon of the desired particle size. The suspension milieu can be varied as known in the art, for example can be aqueous or non-aqueous. In certain embodiments, the suspension fluid can be multi-component, comprising either miscible or non-miscible co-solvents. Suitable co-solvents for aqueous (water) milieu include, but are not limited to, acetone, ethanol, methanol, and others known in the art. A wide variety of non-water soluble milieu are also known in the art, including, but not limited to, heptane, hexane, cyclohexane, oils, such as mineral oils, vegetable oils, and the like. Without being bound by theory, mixing within the reactor vessel allows for diffusion of the silicon nanoparticles within the porous carbon particle. The resulting nano silicon impregnated carbon particles can then be harvested, for example, by centrifugation, filtration, and subsequent drying, all as known in the art.

To this end, the porous carbon particles with the desired extent and type of porosity are subject to processing that results in creation of silicon within said porosity. For this processing, the porous carbon particles can be first particle size reduced, for example to provide a (Dv50) between 1 and 1000 microns, for example between 1 and 100 microns, for example between 1 and 50 microns, for example between 1 and 20 microns, for example between 1 and 15 microns, for example between 2 and 12 microns, for example between 5 and 10 microns. The particle size reduction can be carried out as known in the art, and as described elsewhere herein, for instance by jet milling.

In an embodiment, silicon is created within the pores of the porous carbon by subjecting the porous carbon particles to a silicon containing precursor at elevated temperature and the presence of a silicon-containing gas, preferably silane, in order to achieve silicon deposition via chemical vapor deposition (CVD). The silicon containing precursor can be mixed with other inert gases, for example, nitrogen gas. The temperature and time of processing can be varied, for example the temperature can be between 300 and 400 C, for example between 400 and 500 C, for example between 500 and 600 C, for example between 600 and 700 C, for example between 700 and 800 C, for example between 800 and 900 C. In some embodiments, the temperature is between 300 C and 600 C.

In certain embodiments, the temperature can range between 450 and 700 C. In other embodiments, the temperature can range between 450 and 650 C, between 450 and 600 C, between 450 and 550 C, or between 450 and 500 C. In yet other embodiments, the temperature can range between 500 and 750 C, between 500 and 700 C, between 500 and 650 C, between 500 and 600 C, or between 500 and 550 C. In yet other embodiments, the temperature can range between 550 and 800 C, between 550 and 750 C, between 550 and 700 C, between 550 and 650 C, or between 550 and 600 C.

The mixture of gas can comprise between 0.1 and 1% silane and remainder inert gas. Alternatively, the mixture of gas can comprise between 1% and 10% silane and remainder inert gas. Alternatively, the mixture of gas can comprise between 10% and 20% silane and remainder inert gas. Alternatively, the mixture of gas can comprise between 20% and 50% silane and remainder inert gas. Alternatively, the mixture of gas can comprise above 50% silane and remainder inert gas. Alternatively, the gas can essentially be 100% silane gas. The reactor in which the CVD process is carried out is according to various designs as known in the art, for example in a fluid bed reactor, a static bed reactor, an elevator kiln, a rotary kiln, a box kiln, or other suitable reactor type. The reactor materials are suitable for this task, as known in the art. In an embodiment, the porous carbon particles are process under condition that provide uniform access to the gas phase, for example a reactor wherein the porous carbon particles are fluidized, or otherwise agitated to provide said uniform gas access.

The above embodiments are not limited to silane gas as the silicon containing precursor. Additional silane containing precursors in this context include, but are not limited to disilane, trisilane, tetrasilane, chlorosilane, dichlorosilane, trichlorosilane, and tetrachlorosilane, and combinations thereof. Additional silicon containing species include, but are not limited to silane comprising alkyl moieties, such as methyl silane, dimethyl silane, trimethyl silane, tetramethyl silane, methyl disilane, dimethyl disilane, trimethyl disilane, tetramethyl disilane, hexamethyl silane, and combinations thereof.

In some embodiments, the CVD process is a plasma-enhanced chemical vapor deposition (PECVD) process. This process is known in the art to provide utility for depositing thin films from a gas state (vapor) to a solid state on a substrate. Chemical reactions are involved in the process, which occur after creation of a plasma of the reacting gases. The plasma is generally created by RF (AC) frequency or DC discharge between two electrodes, the space between which is filled with the reacting gases. In certain embodiments, the PECVD process is utilized for porous carbon that is coated on a substrate suitable for the purpose, for example a copper foil substrate. The PECVD can be carried out at various temperatures, for example between 300 and 800 C, for example between 300 and 600 C, for example between 300 and 500 C, for example between 300 and 400 C, for example at 350 C. The power can be varied, for example 25W RF, and the silane gas flow required for processing car be varied, and the processing time can be varied as known in the art.

The silicon that is impregnated into the porous carbon, regardless of the process, is envisioned to have certain properties that are optimal for utility as an energy storage material. For example, the size and shape of the silicon can be varied accordingly to match, while not being bound by theory, the extent and nature of the pore volume within the porous carbon particle. For example, the silicon can be impregnated, deposited by CVD, or other appropriate process into pores within the porous carbon particle comprising pore sizes between 1 nm and 1000 nm, for example between 1 and 10 nm, for example between 2 and 8 nm, for example between 2 and 5 nm, for example for between 2 and 4 nm, for example between 10 nm and 500 nm, for example between 10 nm and 200 nm, for example between 10 nm and 100 nm, for example between 33 nm and 150 nm, for example between 20 nm and 100 nm. Other ranges of carbon pores sizes with regards to fractional pore volume, whether micropores, mesopores, or macropores, are also envisioned as described elsewhere within this disclosure.

The oxygen content in silicon can be less than 50%, for example, less than 30%, for example less than 20%, for example less than 15%, for example, less than 10%, for example, less than 5%, for example, less than 1%, for example less than 0.1%. In certain embodiments, the oxygen content in the silicon is between 1 and 30%. In certain embodiments, the oxygen content in the silicon is between 1 and 20%. In certain embodiments, the oxygen content in the silicon is between 1 and 10%. In certain embodiments, the oxygen content in the porous silicon materials is between 5 and 10%.

In certain embodiments wherein the silicon comprises oxygen, the oxygen is incorporated such that the silicon exists as a mixture of silicon and silicon oxides of the general formula SiOx, where X is a non-integer (real number) can vary continuously from 0.01 to 2. In certain embodiments, the fraction of oxygen present on the surface of the nano-feature porous silicon is higher compared to the interior of the particle.

In certain embodiments, the silicon comprises crystalline silicon. In certain embodiments, the silicon comprises polycrystalline silicon. In certain embodiments, the silicon comprises micro-polycrystalline silicon. In certain embodiments, the silicon comprises nano-polycrystalline silicon. In certain other embodiments, the silicon comprises amorphous silicon. In certain other embodiments, the silicon comprises both crystalline and non-crystalline silicon.

In certain embodiments, the carbon scaffold to be impregnated or otherwise embedded with silicon can comprise various carbon allotropes and/or geometries. To this end, the carbon scaffold to be impregnated or otherwise embedded with silicon can comprise graphite, nano graphite, graphene, nano graphene, conductive carbon such as carbon black, carbon nanowires, carbon nanotubes, and the like, and combinations thereof.

In certain embodiments, the carbon scaffold that is impregnated or otherwise embedded with silicon is removed to yield the templated silicon material with desired size characteristics. The removal of the scaffold carbon can be achieved as known in the art, for example by thermal of chemical activation under conditions wherein the silicon does not undergo undesirable changes in its electrochemical properties. Alternatively, if the scaffold is a porous polymer or other material soluble in a suitable solvent, the scaffold can be removed by dissolution.

In this context, and without being bound by theory, it is important that the reactive surface of the carbon particle needs to achieve the desired temperature to achieve the desired extent of reaction and deposition with the silicon-containing precursor. Conventional engineering principles dictate that it is difficult to heat the interior vs the exterior of the particle, for example the particle heats from the outside surface via convective heating (or perhaps other mechanism such as, but not limited to, microwaves or radiative heating), and then the temperature within the particle heats via conductive heating from the outside of the carbon particle to the inside. It is non-obvious that in the case of a porous particle, the inside of the particle heats concomitantly with the outside, provided that the inside comprises surface area with equal access to the gas molecules that are colliding with the carbon on the particle surface and imparting heat via convection.

Without being bound by theory, the reaction condition may be such that the mean free path length of the silicon-containing gas is similar or lower than the diameter and/or the depths of pores that are desired to be filled. Such a case is known in the art as controlled by Knudsen diffusion, i.e., a means of diffusion that occurs when the scale length of a system is comparable to or smaller than the mean free path of the particles involved. Consider the diffusion of gas molecules through very small capillary pores. If the pore diameter is smaller than the mean free path of the diffusing gas molecules and the density of the gas is low, the gas molecules collide with the pore walls more frequently than with each other. This process is known as Knudsen flow or Knudsen diffusion. The Knudsen number is a good measure of the relative importance of Knudsen diffusion. A Knudsen number much greater than one indicates Knudsen diffusion is important. In practice, Knudsen diffusion applies only to gases because the mean free path for molecules in the liquid state is very small, typically near the diameter of the molecule itself. In cases where the pore diameter is much greater than the mean free path length of the gas, the diffusion is characterized as Fisk diffusion.

The pressure can be varied for the deposition process, for example can be ambient, or about 101 kPa. In certain embodiments, the pressure can be less than ambient, for example less than 101 kPa, for example less than 10.1 kPa, for example less than 1.01 kPa. In certain embodiments, the gas comprises a mixture of the silicon-containing deposition gas and an inert gas, for example a combination of silane and nitrogen. In this case the partial pressure of the deposition gas can be less than 101 kPa, for example less than 10.1 kPa, for example less than 1.01 kPa. In certain embodiments, the pressure and temperature are such that the silicon-containing gas is supercritical.

Accordingly, in certain embodiments, the silicon-containing reactant can be supercritical silane, for example silane at a temperature above about 270 K (−3 C) and a pressure above about 45 bar. In further embodiments, the silicon-containing reactant can be supercritical silane, for example silane at a temperature between 0-100 C and a pressure between 45 and 100 bar. In further embodiments, the silicon-containing reactant can be supercritical silane, for example silane at a temperature between 100-600 C and a pressure between 45 and 100 bar. In further embodiments, the silicon-containing reactant can be supercritical silane, for example silane at a temperature between 300-500 C and a pressure between 50 and 100 bar. In further embodiments, the silicon-containing reactant can be supercritical silane, for example silane at a temperature between 400-550 C and a pressure between 50 and 80 bar.

In certain embodiments, the pressure and temperature are both varied over the time within the process of silicon impregnation of the porous carbon scaffold. For example, the porous carbon scaffold can be held at a certain temperature and pressure, for example at temperature at or higher than ambient, and at a pressure less than ambient. In this case, the combination of low pressure and high temperature allows for desorption of volatile components that could potential clog or otherwise occupy the porous within the porous carbon scaffold, thus facilitating the access of the silicon-containing reactant. Examples of temperature pressure conditions include, for example, 50-900 C and 0.1 to 101 kPa, and various combinations thereof. These conditions can be employed as a first step in the absence of silicon-containing reactant, followed a second condition of temperature and pressure in the presence of the silicon-containing reactant. Examples of temperature and pressure ranges for the latter are found throughout this disclosure.

The CVD process can be accomplished via various modes according to the art. For example, the CVD can be carried out in a static mode, wherein the particles are not agitated, and the CVD gas flows over, around, or otherwise permeates the particles to be coated. In other exemplary modes, the particles can be fluidized, for example CVD can be carried out in a fluidized bed reactor. A variety of different reactor designs can be employed in this context as known in the art, including, but not limited to, elevator kiln, roller hearth kiln, rotary kiln, box kiln, and fluidized bed designs. These designs can be combined with various silicon-containing precursors to be employed as a deposition gas, including, but not limited to, silane, disilane, trisilane, tetrasilane, chlorosilane, dichlorosilane, trichlorosilane, and tetrachlorosilane, and combinationsd thereof. Additional silicon containing species include, but are not limited to silane comprising alkyl moieties, such as methyl silane, dimethyl silane, trimethyl silane, tetramethyl silane, methyl disilane, dimethyl disilane, trimethyl disilane, tetramethyl disilane, hexamethyl silane, and combinations thereof.

In the case of a rotary kiln, various methods for facilitating the proper dispersion and tumbling of particles within the reactor are known in art, and provide maximal contacting of the porous carbon and the silicon-containing reactant. These methods include equipment modifications such as lifters, helical flights, various screw/impellor designs and the like. Also known in the art are strategies to load the rotary kiln with additional, non-reactive particles to facilitate dispersion and minimum agglomeration of the porous carbon scaffold particles.

The CVD process can also employ microwaves to achieve heating the carbon particles to be processed. Accordingly, the above reactor configurations can also be combined with microwaves as part of the processing, employing engineering design principles known in the art. Without being bound by theory, carbon particle are efficient microwave absorbers and a reactor can be envisioned wherein the particles are subjected to microwaves to heat them prior to introduction of the silicon-containing gas to be deposited to the particles.

D. Dielectric Heating

Dielectric heating is the process in which a high-frequency alternating electric field, or radio wave or microwave electromagnetic radiation heats a dielectric material. Molecular rotation occurs in materials containing polar molecules having an electrical dipole moment, with the consequence that they will align themselves in an electromagnetic field. If the field is oscillating, as it is in an electromagnetic wave or in a rapidly oscillating electric field, these molecules rotate continuously by aligning with it. This is called dipole rotation, or dipolar polarization. As the field alternates, the molecules reverse direction. Rotating molecules push, pull, and collide with other molecules (through electrical forces), distributing the energy to adjacent molecules and atoms in the material. Once distributed, this energy appears as heat.

Temperature is related to the average kinetic energy (energy of motion) of the atoms or molecules in a material, so agitating the molecules in this way increases the temperature of the material. Thus, dipole rotation is a mechanism by which energy in the form of electromagnetic radiation can raise the temperature of an object. Dipole rotation is the mechanism normally referred to as dielectric heating, and is most widely observable in the microwave oven where it operates most efficaciously on liquid water, and also, but much less so, on fats and sugars, and other carbon-comprising materials.

Dielectric heating involves the heating of electrically insulating materials by dielectric loss. A changing electric field across the material causes energy to be dissipated as the molecules attempt to line up with the continuously changing electric field. This changing electric field may be caused by an electromagnetic wave propagating in free space (as in a microwave oven), or it may be caused by a rapidly alternating electric field inside a capacitor. In the latter case, there is no freely propagating electromagnetic wave, and the changing electric field may be seen as analogous to the electric component of an antenna near field. In this case, although the heating is accomplished by changing the electric field inside the capacitive cavity at radio-frequency (RF) frequencies, no actual radio waves are either generated or absorbed. In this sense, the effect is the direct electrical analog of magnetic induction heating, which is also near-field effect (thus not involving radio waves).

Frequencies in the range of 10-100 MHz are necessary to cause efficient dielectric heating, although higher frequencies work equally well or better, and in some materials (especially liquids) lower frequencies also have significant heating effects, often due to more unusual mechanisms. Dielectric heating at low frequencies, as a near-field effect, requires a distance from electromagnetic radiator to absorber of less than $1/2\pi \approx 1/6$ of a wavelength. It is thus a contact process or near-contact process, since it usually sandwiches the material to be heated (usually a non-metal) between metal plates taking the place of the dielectric in what is effectively a very large capacitor. However, actual electrical contact is not necessary for heating a dielectric inside a capacitor, as the electric fields that form inside a capacitor subjected to a voltage do not require electrical contact of the capacitor plates with the (non-conducting) dielectric material between the plates. Because lower frequency electrical fields penetrate non-conductive materials far more deeply than do microwaves, heating pockets of water and organisms deep inside dry materials like wood, it can be used to rapidly heat and prepare many non-electrically conducting food and agricultural items, so long as they fit between the capacitor plates.

At very high frequencies, the wavelength of the electromagnetic field becomes shorter than the distance between the metal walls of the heating cavity, or than the dimensions of the walls themselves. This is the case inside a microwave oven. In such cases, conventional far-field electromagnetic waves form (the cavity no longer acts as a pure capacitor, but rather as an antenna), and are absorbed to cause heating, but the dipole-rotation mechanism of heat deposition remains the same. However, microwaves are not efficient at causing the heating effects of low frequency fields that depend on slower molecular motion, such as those caused by ion-drag.

Microwave heating is a sub-category of dielectric heating at frequencies above 100 MHz, where an electromagnetic wave can be launched from a small dimension emitter and guided through space to the target. Modern microwave ovens make use of electromagnetic waves with electric fields of much higher frequency and shorter wavelength than RF heaters. Typical domestic microwave ovens operate at 2.45 GHz, but 915 MHz ovens also exist. This means that the wavelengths employed in microwave heating are 12 or 33 cm (4.7 or 13.0 in). This provides for highly efficient, but less penetrative, dielectric heating. Although a capacitor-like set of plates can be used at microwave frequencies, they are not necessary, since the microwaves are already present as far field type electromagnetic radiation, and their absorption does not require the same proximity to a small antenna, as does RF heating. The material to be heated (a non-metal) can therefore simply be placed in the path of the waves, and heating takes place in a non-contact process.

Microwave absorbing materials are thus capable of dissipating an electromagnetic wave by converting it into thermal energy. Without being bound by theory, a material's microwave absorption capacity is mainly determined by its relative permittivity, relative permeability, the electromagnetic impedance match, and the material microstructure, for example its porosity and/or nano- or micro-structure. When a beam of microwave irradiates the surface of an microwave absorbing material, a suitable matching condition for the electromagnetic impedance can enable almost zero reflectivity of the incident microwave, ultimately resulting in transfer of thermal energy to the absorbing material.

E. Microwave Heating of Carbon Materials

Carbon materials are capable of absorbing microwaves, i.e., they are easily heated by microwave radiation, i.e. infrared radiation and radio waves in the region of the electromagnetic spectrum. More specifically, they are defined as those waves with wavelengths between 0.001 and 1 m, which correspond to frequencies between 300 and 0.3 GHZ. The ability of carbon to be heated in the presence of a microwave field, is defined by its dielectric loss tangent: $\tan \delta = \varepsilon''/\varepsilon'$. The dielectric loss tangent is composed of two parameters, the dielectric constant (or real permittivity), $\varepsilon'$, and the dielectric loss factor (or imaginary permittivity), $\varepsilon''$; i.e., $\varepsilon = \varepsilon' - i\,\varepsilon''$, where & is the complex permittivity. The dielectric constant ($\varepsilon'$) determines how much of the incident energy is reflected and how much is absorbed, while the dielectric loss factor ($\varepsilon''$) measures the dissipation of electric energy in form of heat within the material. For optimum microwave energy coupling, a moderate value of $\varepsilon'$ should be combined with high values of $\varepsilon''$ (and so high values of $\tan \delta$), to convert microwave energy into thermal energy. Thus, while some materials do not possess a sufficiently high loss factor to allow dielectric heating (transparent to microwaves), other materials, e.g. some inorganic oxides and most carbon materials, are excellent microwave absorbers. On the other hand, electrical conductor materials reflect microwaves. For example, graphite and highly graphitized carbons may reflect a considerable fraction of microwave radiation. In the case of carbons, where delocalized n-electrons are free to move in relatively broad regions, an additional and very interesting phenomenon may take place. The kinetic energy of some electrons may increase enabling them to jump out of the material, resulting in the ionization of the surrounding atmosphere. At a macroscopic level, this phenomenon is perceived as sparks or electric arcs formation. But, at a microscopic level, these hot spots are actually plasmas. Most of the time these plasmas can be regarded as microplasmas both from the point of view of space and time, since they are confined to a tiny region of the space and last for just a fraction of a second. An intensive generation of such microplasmas may have important implications for the processes involved.

Without being bound by theory, heating of carbon materials by microwave heating offers a number of advantages over conventional heating such as: (i) non-contact heating; (ii) energy transfer instead of heat transfer; (iii) rapid heating; (iv) selective material heating; (v) volumetric heating; (vi) quick start-up and stopping; (vii) heating from the interior of the material body; and, (viii) higher level of safety and automation [3]. The high capacity of carbon materials to absorb microwave energy and convert it into heat is illustrated in Table A (provided from the reference J. A. Menéndez, A. Arenillas, B. Fidalgo, Y. Fernández, L. Zubizarreta, E. G. Calvo, J. M. Bermúdez, "Microwave heating processes involving carbon materials", Fuel Processing Technology, 2010, 91 (1), 1-8), where the dielectric loss tangents of examples of different carbons are listed. As can be seen, the loss tangents of most of the carbons, except for coal, are higher than the loss tangent of distilled water (tan δ of distilled water=0.118 at 2.45 GHz and room temperature).

TABLE A

Examples of dielectric loss tangents for different carbon materials at a frequency of 2.45 GHz and room temperature

| Carbon Type | tanδ = ε"/ε' |
|---|---|
| Coal | 0.02-0.08 |
| Carbon foam | 0.05-0.20 |
| Charcoal | 0.11-0.29 |
| Carbon black | 0.35-0.83 |
| Activated carbon | 0.22-2.95 |
| Carbon nanotubes | 0.25-1.14 |

Given the potential for carbons to absorb microwaves, there is also a potential for microwave enhancement of carbon-catalyzed reactions, or reactions that occur on or within a carbon particle. Without being bound by theory, there are at least two scenarios where microwaves enhance such a reaction on or within a carbon particle: (i) reactions which require a high temperature, and (ii) reactions involving chemical compounds which, like the organic compounds, have a low dielectric loss and do not heat up sufficiently under microwave irradiation. With regards to the current invention, the carbon material acts as both reaction surface (e.g., catalyst) and microwave receptor.

F. Production of Silicon-Carbon Composites by Microwave-Enabled Decomposition of Silicon Containing Moieties on Porous Carbon Substrate Embodiments of the present invention are directed to a method for synthesizing a composite material from one or more microwave-absorbing material(s), where said microwave-absorbing material(s) are heated by exposure to microwave radiation, and introduced to one or more additional feedstock material(s) that thermally decompose on or within pores of the microwave heated material(s). In embodiments, the microwave heated material is porous, for example, contains micropores, mesopore, or macropores, or combinations thereof. In embodiments, the porous, inductively heated material is a carbon material. The porous, microwave heated carbon material may be inherently capable of absorbing microwaves, or may be doped with species that otherwise result in the doped material being capable to absorb microwaves. Heating the porous substrate material by microwaves allows for localized heating of the substrate particles, without directly heating other materials within the reactor system, for example the material container, the reactor walls, and the atmosphere (gas) within the reactor. This localized heating, in turn, allows for highly efficient, and highly localized decomposition of a silicon-containing reactant feedstock. Suitable reactant feedstocks in this regard include, but are not limited to, silicon-containing gases and silicon-containing liquids. In one embodiment, the silicon-containing feedstock is silane gas. Other suitable silicon containing species include, but are not limited to, disilane, trisilane, tetrasilane, and combinations thereof. Accordingly, the methods disclosed herein provide advantages to producing homogenous silicon-composite particles.

In general terms, embodiments of the current invention are directed to composite materials wherein silicon is deposited into the pore volume of a porous scaffold material that is a microwave absorbing material. The porous, microwave absorbing scaffold material can comprise a variety of different materials. In certain embodiments, the porous scaffold material is porous carbon material comprising micropore, mesopore, and/or macropores. Specifically, the porous carbon material provides pores in the range of 5 to 1000 nm, which are subsequently filled with silicon. Accordingly, this disclosure also concerns methods for manufacturing composite materials wherein silicon is deposited into the pore volume of a porous scaffold material. The resulting composites exhibit remarkably durable intercalation of lithium, and therefore provide optimized lithium storage and utilization properties. These novel composites find utility in any number of electrical energy storage devices, for example as electrode material in lithium-based electrical energy storage devices (e.g., lithium ion batteries). Electrodes comprising the novel composites disclosed herein display high reversible capacity, high first cycle efficiency, high power performance or any combination thereof. The present inventors have discovered that such improved electrochemical performance is related to the size of the silicon, the integrity of the silicon and carbon material during cycling, formation of a stable SEI layer, the physicochemical properties of the scaffold materials, for example the surface area and pore volume characteristics of the carbon scaffold, and other properties, as well as the approaches used to manufacture and compound the materials.

Accordingly, in one embodiment, the present disclosure provides a method for the manufacturing of a novel composite material with durable intercalation of lithium, wherein the composite comprises a porous scaffold and silicon. For example, in some embodiments the process may involve the following steps:

a) creating a microwave absorbing, porous scaffold material, wherein the said microwave absorbing porous scaffold material comprises pore volume in the range of 5 to 1000 nm; and
b) heating of the microwave absorbing porous scaffold material by microwaves in the presence of a silicon-containing feedstock to a sufficient temperature to enable decomposition of the silicon-containing feedstock, resulting in a silicon-impregnated carbon material.

Accordingly, in one embodiment, the present disclosure provides for the manufacturing of a novel composite material with durable intercalation of lithium, wherein the composite comprises carbon and silicon. For example, the process may involve the following steps:

a) mixing polymer precursors materials and storing the resulting mixture for a period of time at sufficient temperature to allow for polymerization of the precursors;
b) carbonizing the resulting polymer material to create a microwave absorbing porous carbon material comprising pore volume in the range of 5 to 1000 nm; and
c) heating of the microwave absorbing porous carbon material by microwaves in the presence of a silicon-containing feedstock to a sufficient temperature to enable decomposition of the silicon-containing feedstock, resulting in a silicon-impregnated carbon material.

In an alternative embodiment, the present disclosure provides for the manufacturing of a novel composite material with durable intercalation of lithium, wherein the composite comprises a carbon doped with a microwave absorbing material and silicon. For example, the process may involve the following steps:

a) Mixing polymer precursors materials and storing the resulting mixture for a period of time at sufficient temperature to allow for polymerization of the precursors;
b) carbonizing the resulting polymer material to create a porous carbon material comprising pore volume in the range of 5 to 1000 nm;
c) doping the porous carbon material with a material capable of microwave heating; and
d) heating the resulting microwave absorbing porous carbon material by microwaves in the presence of a silicon-containing feedstock to a sufficient temperature to enable decomposition of the silicon-containing feedstock, resulting in a silicon-impregnated carbon material.

In a related alternative embodiment, the present disclosure provides for the manufacturing of a novel composite material with durable intercalation of lithium, wherein the composite comprises a carbon produced from a polymer material comprising a microwave absorbing material and silicon. For example, the process may involve the following steps:

a) mixing polymer precursors materials in the presence of a microwave absorbing material and storing the resulting mixture for a period of time at sufficient temperature to allow for polymerization of the precursors;
b) carbonizing the resulting polymer material to create a porous microwave absorbing carbon material comprising pore volume in the range of 5 to 1000 nm; and
c) heating the microwave absorbing porous carbon material by microwaves in the presence of a silicon-containing feedstock to a sufficient temperature to enable decomposition of the silicon-containing feedstock, resulting in a silicon-impregnated carbon material.

Accordingly, in one embodiment, the present disclosure provides for the manufacturing of a novel composite material with durable intercalation of lithium, wherein the composite comprises a layer of carbon surrounding the silicon-impregnated carbon material. For example, the process may involve the following steps:

e) mixing polymer precursors materials and storing the resulting mixture for a period of time at sufficient temperature to allow for polymerization of the precursors;
f) carbonizing the resulting polymer material to create a microwave absorbing porous carbon material comprising pore volume in the range of 5 to 1000 nm;
g) heating the microwave absorbing porous scaffold material by microwaves in the presence of a silicon-containing feedstock to a sufficient temperature to enable decomposition of the silicon-containing feedstock, resulting in a silicon-impregnated carbon material; and
h) applying a carbon layer on the silicon-impregnated carbon material to yield a carbon-coated, silicon-impregnated carbon material.

Accordingly, in one embodiment, the present disclosure provides for the manufacturing of a novel composite material with durable intercalation of lithium, wherein the composite comprises a layer of conductive polymer surrounding the silicon-impregnated carbon material. For example, the process may involve the following steps:

e) mixing polymer precursors materials and storing for a period of time at sufficient temperature to allow for polymerization of the precursors;
f) carbonizing the resulting polymer material to create a microwave absorbing porous carbon material comprising pore volume in the range of 5 to 1000 nm;
g) heating the microwave absorbing porous scaffold material by microwaves in the presence of a silicon-containing feedstock to a sufficient temperature to enable decomposition of the silicon-containing feedstock, resulting in a silicon-impregnated carbon material; and
h) applying conductive polymer around the silicon-impregnated carbon material to yield a silicon-impregnated carbon material further embedded within a conductive polymer network.

Accordingly, embodiments of the present disclosure provide both novel compositions of matter in addition to manufacturing methods thereof, wherein said materials exhibit remarkably durable intercalation of lithium when incorporated into an electrode of a lithium based energy storage device. In some embodiments, the lithium based electrical energy storage device is a lithium ion battery or lithium ion capacitor.

G. Synthesis of Carbon and Silicon Carbon Composite Materials in Same or Similar Reaction Vessel In certain embodiments, the synthesis of the porous scaffold and the silicon containing composite can occur in different steps in the same reaction vessel or similar reaction vessels. For example, the carbon precursors can be charged into the reaction vessel wherein the carbon precursors comprise hydrocarbons. Hydrocarbons in this context include, but are not limited to, methane, ethane, propane, butane, pentane, heptane, hexane, cyclohexane, octane, nonane and decane. The hydrocarbons can be gas or liquid state, depending on the molecular weight of the hydrocarbon species and the reactor temperature and pressure. The reactor conditions (pressure and temperature) can be controlled to facilitate the thermal decomposition of the hydrocarbon species to create a porous carbon scaffold.

In some embodiments, the silicon containing precursor is also charged into the reaction vessel. The charging of the silicon containing precursor can occur either simultaneous with the carbon containing precursor, or sequentially. In certain embodiments, the decomposition of the carbon containing precursors occurs at a temperature below the decomposition temperature of the silicon containing precursor. In this embodiment, the temperature within the reaction vessel is controlled such that the decomposition of the carbon containing precursor is accomplished first to create a porous carbon scaffold, then the temperature is increased to a condition corresponding to the decomposition temperature of the silicon containing precursor to create the silicon impregnated carbon scaffold.

In certain other embodiments, the decomposition of the carbon containing precursors occurs at a temperature above the decomposition temperature of the silicon containing precursor. In this embodiment, the temperature within the reaction vessel is controlled such that the decomposition of the silicon containing precursor is accomplished first to create nano-sized and/or nano-featured silicon particles, then the temperature is increased to a condition corresponding to the decomposition temperature of the carbon containing precursor to create a layer of carbon surrounding the silicon particles.

In certain other embodiments, a combination of porous carbon scaffold, carbon containing precursors, and silicon containing precursors are all charged into the reaction vessel, either in combination(s) or sequentially. In a certain embodiment, the porous carbon scaffold is charged into the reaction vessel, and the decomposition of the carbon containing precursors occurs at a temperature above the decomposition temperature of the silicon containing precursor. In this embodiment, the temperature within the reaction vessel is controlled such that the decomposition of the silicon containing precursor is accomplished first to create a silicon impregnated carbon scaffold, then the temperature is increased to a condition corresponding to the decomposition temperature of the carbon containing precursor, in order to create the carbon coated, silicon impregnated carbon scaffold.

In certain other embodiments, a combination of porous carbon scaffold, carbon containing precursors, and silicon containing precursors are all charged into the reaction vessel, either in combination(s) or sequentially. In a certain embodiment, the porous carbon scaffold is charged into the reaction vessel, and the decomposition of the carbon containing precursors occurs at a similar temperature to the decomposition temperature of the silicon containing precursor. In this embodiment, the temperature within the reaction vessel is controlled such that the decomposition of the silicon containing precursor is accomplished contemporaneously with decomposition of the carbon containing precursor to create a carbon coated, silicon impregnated carbon scaffold.

In related embodiments, the charging of carbon containing and silicon containing precursors, and their respective decomposition temperatures, are such that a layer composite is created (multiple layers of silicon impregnated carbon scaffold and carbon coating).

H. Coating of Silicon on a Disposable Porous Scaffold

Without being bound by theory, the porous scaffold that is employed to produce the silicon impregnated scaffold can be subject to conditions post process such that the scaffold is degraded or otherwise removed, leaving behind a nano-featured and/or nano-sized silicon material. In this fashion, the scaffold can be considered “disposable” in the sense that the final nano-sized and/or nano-featured silicon material does not comprise the scaffold.

Disposable scaffolds in this context can be porous polymers or other carbon-containing materials that exhibit extremely low or virtually no char yield. In this embodiment, the porous polymer or other carbon-containing material can be removed by heating to a temperature and time sufficient to burn off the porous polymer or other carbon-containing material while not raising to sufficient temperature to adversely affect the physicochemical or electrochemical properties of the silicon.

In certain embodiments, the disposable porous scaffold is an organic or inorganic salt. Porous features can be imparted into the organic or inorganic salt as known in the art, for example by certain methodologies involving templating spray drying or freeze drying. In this embodiment, the disposable porous scaffold comprising an organic or inorganic salt is stable under the conditions sufficient to decompose the silicon containing precursor to create the silicon impregnated scaffold. Further according to this embodiment, after creation of the silicon impregnated scaffold, said scaffold is removed, for example by thermal decomposition into volatile products, or by dissolution into suitable media that does not dissolve the nano-sized and/or nano-featured silicon.

I. Functionalization of the Porous Scaffold to Increase Affinity for Silane-Containing Precursor In certain embodiments, the porous scaffold is functionalized to comprise moieties that increase the scaffold's affinity for the silane-containing precursors. For instance, the porous scaffold material in certain embodiments is a carbon scaffold wherein other species have been physically or chemically incorporated into the carbon matrix to increase the affinity for the silicon containing precursor. Such species in this regard include, but are not limited to, silicon and silicon containing compounds, halogens such as fluorine and halogen containing compounds.

J. Functionalization of the Silane-Containing Precursor to Increase Affinity for the Porous Scaffold In certain embodiments, the silane containing precursor is functionalized to comprise moieties that increase the affinity for the porous scaffold. For instance, the silicon containing precursor in certain embodiments is a silicon containing precursor wherein other species have been physically or chemically incorporated to increase the affinity for the porous scaffold, for example a porous carbon scaffold. Such species in this regard include, but are not limited to, carbon and carbon containing compounds, halogens such as fluorine and halogen containing compounds. Specific examples of such functionalized silicon containing precursors include, but are not limited to methyl silane, dimethyl silane, trimethyl silane, tetramethyl silane, methyl disilane, dimethyl disilane, trimethyl disilane, tetramethyl disilane, hexamethyl silane, and combinations thereof.

K. Functionalization of both Silane-Containing Precursor and Porous Carbon Scaffold In certain embodiments, both the silane containing precursor and porous carbon scaffold are functionalized to increase their respective affinities for each other. For instance, the silicon containing precursor can be a silicon containing precursor wherein other species have been physically or chemically incorporated to increase the affinity for the porous scaffold, for example a porous carbon scaffold, wherein the porous carbon scaffold has also been functionalized wherein other species have been physically or chemically incorporated into the carbon matrix to increase the affinity for the silicon containing precursor. According to such embodiments, species for functionalizing the silicon include, but are not limited to, carbon and carbon containing compounds, halogens such as fluorine and halogen containing compounds. Specific examples of such functionalized silicon containing precursors include, but are not limited to methyl silane, dimethyl silane, trimethyl silane, tetramethyl silane, methyl disilane, dimethyl disilane, trimethyl disilane, tetramethyl disilane, hexamethyl silane, and combinations thereof. According to the same. Also according to such embodiments, species to functionalize the carbon scaffold include, but are not limited to, silicon and silicon containing compounds, halogens such as fluorine and halogen containing compounds.

L. Coating of Composite Materials with Carbon

Without being bound by theory, the electrochemical performance of the composites produced via silicon impregnation into porous carbon materials can be achieved by coating, for example coating the composite material in a layer of carbon. In this context, the surface layer can comprise a carbon layer, as described in the current section, or another suitable layer, for example a conductive polymer layer, as described in the subsequent section.

The surface layer is envisioned to provide for a suitable SEI layer. In this context, the surface carbon layer is preferably a good ionic conductor to shuttle Li-ions. Alternatively, the carbon layer can comprise an artificial SEI layer, for example the carbon layer can comprise poly(3,4-ethylenedioxythiophene)-co-poly(ethylene glycol) copolymer. The coating may comprise nitrogen and/or oxygen functionality to further improve the layer with respect to promoting a stable SEI layer. The coating needs to provide sufficient electrical conductivity, adhesion, and cohesion between particles. The surface should provide a stable SEI layer, the latter is typically comprised of species such as LiF, $Li_2CO_3$, and $Li_2O$. Inorganic material with relatively low bulk modulus may provide a more stable SEI layer, for example a more amorphous vs. crystalline layer is, for instance $Li_2CO_3$ VS. LiF.

To this end, a layer of carbon can be applied to the silicon-impregnated carbon material. Without being bound by theory, this carbon layer should provide low surface area, low surface roughness and/or low degree of morphological defects, all in order to provide a more stable SEI layer, higher first cycle efficiency, and greater cycle stability in a lithium-ion battery. Various carbon allotropes can be envisioned in the context of providing a surface layer to the silicon-impregnated porous carbon materials, including graphite, graphene, hard or soft carbons, for example pyrolytic carbon.

In alternate embodiments, the aforementioned coating can be achieved with a precursor solution as known in the art, followed by a carbonization process. For example, particles can be coated by a wurster process or related spray drying process known in the art to apply a thin layer of precursor material on the particles. The precursor coating can then be pyrolyzed, for example by further fluidization of the wurster-coated particles in the presence of elevated temperature and an inert gas as consistent with descriptions disclosed elsewhere herein.

In alternate embodiments, the particles can be covered in a carbonaceous layer accomplished by chemical vapor deposition (CVD). Methodologies for CVD generally described in the art can be applied to the composite materials disclosed herein, for example particles of porous silicon wherein nano-sized or nano-sized and nano-featured silicon has been impregnated or otherwise introduced into the carbon pore volume of the desired range of pore sizes. CVD is generally accomplished by subjecting the porous silicon material for a period of time at elevated temperature in the presence of a suitable deposition gas containing carbon atoms. Suitable gases in this context include, but are not limited to methane, propane, butane, cyclohexane, ethane, propylene, and acetylene. The temperature can be varied, for example between 350 to 1050 C, for example between 350 and 450 C, for example between 450 and 550 C, for example between 550 and 650 C, for example between 650 and 750 C, for example between 750 and 850 C, for example between 850 and 950 C, for example between 950 and 1050 C. The deposition time can be varied, for example between 0 and 5 min, for example between 5 and 15 min, for example between 15 and 30 min, for example between 30 and 60 min, for example between 60 and 120 min, for example between 120 and 240 min. In some embodiments, the deposition time is greater than 240 min. In certain embodiments, the deposition gas is methane and the deposition temperature is greater than or equal to 950 C. In certain embodiments, the deposition gas is propane and the deposition temperature is less than or equal to 750 C. In certain embodiments, the deposition gas is cyclohexane and the deposition temperature is greater than or equal to 800 C.

In certain embodiments, the reactor itself can be agitated, in order to agitate the porous carbon scaffold to be silicon impregnated. For example, the impregnation process can be carried out in a static mode, wherein the particles are not agitated, and the silicon-containing reactant flows over, around, or otherwise comes in contact with the particles to be coated. In other exemplary modes, the particles can be fluidized, for example the impregnation with silicon-containing reactant can be carried out in a fluidized bed reactor. A variety of different reactor designs can be employed in this context as known in the art, including, but not limited to, elevator kiln, roller hearth kiln, rotary kiln, box kiln, and modified fluidized bed designs.

Accordingly, embodiments of the present disclosure provide for the manufacturing of a composite silicon-carbon material comprising a carbon scaffold, wherein the carbon scaffold material is a porous carbon material, and wherein the silicon impregnation is achieved by contacting the porous carbon material with a silicon-containing reactant. For example, the process may involve the following steps:

c) mixing polymer(s) and/or polymer precursor(s) and storing the resulting mixture for a period of time at sufficient temperature to allow for polymerization of the precursors;

d) carbonizing the resulting polymer material to create a porous carbon material; and e) subjecting the porous carbon material to elevated temperature in the presence of a silicon-containing reactant within a static or agitated reactor, resulting in a silicon-impregnated carbon material In another embodiment, the present disclosure provides for the manufacturing of a composite silicon-carbon material, wherein the carbon scaffold material is a porous carbon material, and wherein the silicon impregnation is achieved by contacting with a silicon-containing reactant, and wherein a terminal carbon coating is achieved by contacting the composite with a carbon-containing reactant. For example, the process may involve the following steps:

a) mixing polymer(s) and/or polymer precursor(s) and storing the resulting mixture for a period of time at sufficient temperature to allow for polymerization of the precursors;

b) carbonizing the resulting polymer material to create a porous carbon material;

c) subjecting the porous carbon material to elevated temperature in the presence of a silicon-containing reactant within a static or agitated reactor, resulting in a silicon-impregnated carbon material; and d) subjecting the silicon impregnated carbon material to elevated temperature in the presence of a carbon-containing reactant within a static or agitated reactor, resulting in a terminally carbon coated silicon-carbon composite material.

In another embodiment, the present disclosure provides for the manufacturing of a composite silicon-carbon material, wherein the carbon scaffold material is a porous carbon material, and wherein the silicon impregnation is achieved by contacting with a silicon-containing reactant, and wherein a terminal conducting polymer coating is achieved by contacting the composite with a conductive polymer, and optionally pyrolyzing the material For example, the process may involve the following steps:

a) mixing polymer(s) and/or polymer precursor(s) and storing the resulting mixture for a period of time at sufficient temperature to allow for polymerization of the precursors;

b) carbonizing the resulting polymer material to create a porous carbon material;

c) subjecting the porous carbon material to elevated temperature in the presence of a silicon-containing reactant within a static or agitated reactor, resulting in a silicon-impregnated carbon material;

d) subjecting the silicon impregnated carbon material to elevated temperature in the presence of a conductive polymer within a static or agitated reactor, resulting in a terminally conductive polymer coated silicon-carbon composite material; and e) the materials of (d) can be optionally pyrolyzed.

The silicon-impregnated porous carbon composite material can also be terminally carbon coated via a hydrothermal carbonization wherein the particles are processed by various modes according to the art. Hydrothermal carbonization can be accomplished in an aqueous environment at elevated temperature and pressure to obtain a silicon-carbon composite. Examples of temperature to accomplish the hydrothermal carbonization vary, for example between 150 C and 300 C, for example, between 170 C and 270 C, for example between 180 C and 260 C, for example, between 200 and 250 C. Alternatively, the hydrothermal carbonization can be carried out at higher temperatures, for example, between 200 and 800 C, for example, between 300 and 700 C, for example between 400 and 600 C. In some embodiments, the hydrothermal carbonization can be carried out at a temperature and pressure to achieve graphitic structures. The range of pressures suitable for conducting the hydrothermal carbonization are known in the art, and the pressure can vary, for example, increase, over the course of the reaction. The pressure for hydrothermal carbonization can vary from 0.1 MPa to 200 MPA. In certain embodiments the pressure of hydrothermal carbonization is between 0.5 MPa and 5 MPa. In other embodiments, the pressure of hydrothermal carbonization is between 1 MPa and 10 MPa, or between 5 and 20 MPa. In yet other embodiments, the pressure of hydrothermal carbonization is between 10 MPa and 50 MPa. In yet other embodiments, the pressure of hydrothermal carbonization is between 50 MPa and 150 MPa. In yet other embodiments, the pressure of hydrothermal carbonization is between 100 MPa and 200 MPa. Feedstock suitable as carbon source for hydrothermal carbonization are also known in the art. Such feedstocks for hydrothermal carbonization typically comprise carbon and oxygen, these include, but are not limited to, sugars, oils, biowastes, polymers, and polymer precursors described elsewhere within this disclosure.

Accordingly, the present disclosure provides for the manufacturing of a composite silicon-carbon material, wherein the carbon scaffold material is a porous carbon material, and wherein the silicon impregnation is achieved by contacting with a silicon-containing reactant, and wherein a terminal carbon coating is achieved by hydrothermal carbonization. For example, the process may involve the following steps:

a) mixing polymer(s) and/or polymer precursor(s) and storing the resulting mixture for a period of time at sufficient temperature to allow for polymerization of the precursors;

b) carbonizing the resulting polymer material to create a porous carbon material;

c) subjecting the porous carbon material to elevated temperature in the presence of a silicon-containing reactant within a static or agitated reactor, resulting in a silicon-impregnated carbon material; and d) subjecting the silicon impregnated carbon material to hydrothermal carbonization to yield a composite comprising the silicon impregnated carbon materials terminally carbon coated via hydrothermal carbonization. suspending particles of a silicon alloy in a liquid medium containing M. Coating of Composite Materials with Conductive Polymer Materials The composite material comprising a porous silicon material may include various surface treatment or properties in order to further improve the electrochemical performance as defined by capacity, stability and power performance. In one embodiment the composite is covered by an ionically conductive polymer with a thickness between 1 nm and 10 microns. In another embodiment the composite is covered by a ceramic protective coating with a thickness between 1 nm and 10 microns. In yet another embodiment the composite is covered by an organic film with a thickness between 1 nm and 10 microns. The thickness can be measured with a variety of techniques known in the art such as but not limited to XPS sputtering, FIB/SEM or SIMS.

The composite material can be coated with an ionically conductive polymer. Example materials include, but are not limited to, polyanaline-based materials, polypyrrole-based materials, a combination of the two such as poly-pyrrol-co-aniline, polythiophene-based materials, oligomers, PEDOT-PSS, polyvinylidene fluoride and other vinylenes and fluorides, neoprene, silicone, urethane, styrene-butadiene rubber-based materials and other rubbers such as isoprene.

The composite material can be coated with a ceramic protective coating. Coating materials include, but are not limited to, oxide-type coatings such as alumina, titania, zirconia, and chromium-oxide. Coating material can also be non-oxygen containing, such as carbides, nitrides, borides and silicides. The purpose of the ceramic is to protect the surface of the composite material.

The composite material can be coated by an organic material. Organic materials could be found in nature or synthetically synthesized. Examples of organic coating materials include, but are not limited to, lignin, cellulose, chitosan, polysaccharides, and lipids.

The act of coating of particles can easily be achieved by those skilled in the art. Commonly employed methods include vapor deposition methods such as atomic layer deposition, chemical vapor deposition, and plasma-assisted deposition, physical vapor deposition, sputtering methods, spray drying, emulsion, spin coating, electrodeposition, and direct-to-particle selective growth through seeding or other means.

The coating on the composite material is meant to prevent corrosion as well as provide mechanical stability during expansion and contraction. To this end, the hardness and the elasticity of the material is vital. These values for hardness and elasticity can be measured using methods known in the art. Depending on the choice of material, the Mohs hardness of the coating can range between 0 and 10. Not bound by theory, the Mohs hardness of the coating can range between 0 and 5, 0 and 4, 0 to 3, 0 to 2, and 0 to 1. In another example, the Mohs hardness of the coating can range from 5 to 10, 6 to 10, 7 to 10, 8 to 10, and 9 to 10. In limited cases, the coating may exhibit unusually high Mohs hardness >10. Not bound by theory, the hardness can also be measured using the Vickers scale, rather than the Mohs scale.

In yet another embodiment, the Young's modulus of the coating can be measured between 0 and 1210 GPa. In one embodiment, the Young's modulus of the coating is between 0.01 to 11 GPa, 0.01 to 5 GPa, 0.01 to 2 GPa, 0.01 to 0.5 GPa, 0.01 to 0.1 GPa, and 1 to 4 GPa. In another example the Young's modulus of the coating can be greater than 11.

The Young's modulus may be between 11 to 1000 GPa, 20 to 1000 GPa, 50 to 1000 GPa, 100 to 1000 GPa, 200 to 1000 GPa, and 400 to 700 GPa.

The thickness of the coating can alter the performance of the composite material and may be directly linked to the physical properties of the coating. In one embodiment the thickness of the coating is between 1 nm and 10 microns, between 1 nm and 5 microns, between 1 nm and 1 micron, between 1 nm and 50 nm. In another embodiment the thickness of the coating is between 5 microns and 10 microns. In yet another embodiment, the coating is a single atomic monolayer.

The mass of the coating with respect to the mass of the composite particle can vary depending on the properties of both the coating and the composite particle. Not bound by theory, the ratio of the mass of the coating to the mass of the composite particle can alter the gravimetric and volumetric capacity of the material. In this embodiment, the mass of the composite particle refers to any and all materials which are not considered a conductive polymeric or ceramic coating. In one embodiment the ratio of the mass of the coating to the mass of the composite particle is less than 1:50. In another embodiment the ratio of the mass of the coating to the mass of the composite particle is between 1:50 and 1:1, 1:50 and 1:5, 1:50 and 1:10, 1:50 and 1:20, 1:20 and 1:30. In still another embodiment the ratio of the mass of the coating to the mass of the composite particle exceeds 1:1, indicating that more coating is present than composite material.

The volume of the coating with respect to the volume of the composite particle can vary depending on the properties of both the coating and the composite particle. Not bound by theory, the ratio of the volume of the coating to the volume of the composite particle can alter the gravimetric and volumetric capacity of the material. In this embodiment, the volume of the composite particle refers to any and all materials which are not considered a conductive polymeric or ceramic coating. In one embodiment the ratio of the volume of the coating to the volume of the composite particle is less than 1:50. In another embodiment the ratio of the volume of the coating to the volume of the composite particle is between 1:50 and 1:1, 1:50 and 1:5, 1:50 and 1:10, 1:50 and 1:20, 1:20 and 1:30. In still another embodiment the ratio of the volume of the coating to the volume of the composite particle exceeds 1:1, indicating that more coating is present than composite material.

The oxygen content in coating on the composite material can be less than 80%, for example, less than 70%, for example less than 60%, for example less than 50%, for example, less than 40%, for example, less than 30%, for example, less than 20%, for example less than 10%. In certain embodiments, the oxygen content in the coating on the composite material is between 10 and 80%. In certain embodiments, the oxygen content in the coating on the composite material is between 20 and 70%. In certain embodiments, the oxygen content in the coating on the composite material is between 30 and 60%. In certain embodiments, the oxygen content in the coating on the composite material is between 40 and 50%. In yet other embodiments the oxygen content in the coating on the composite material is less than 10%.

The nitrogen content in coating on the composite material can be less than 50%, for example, less than 30%, for example less than 20%, for example less than 15%, for example, less than 10%, for example, less than 5%, for example, less than 1%, for example less than 0.1%. In certain embodiments, the nitrogen content in the coating on the composite material is between 1 and 30%. In certain embodiments, the nitrogen content in the coating on the composite material is between 1 and 20%. In certain embodiments, the nitrogen content in the coating on the composite material is between 1 and 10%. In certain embodiments, the nitrogen content in the coating on the composite material is between 5 and 10%.

In certain embodiments, the conductive polymer is pyrolyzed to achieve a pyrolyzed conductive polymer coating. There are various embodiments whereby the conductive polymer can be added as a second carbon composite with the composite of nano-featured and/or nano-sized and nano-featured silicon impregnated into the carbon scaffold. For example, the silicon-carbon composite can be suspended in a solvent containing dissolved conductive polymer, the suspension can then be dried as known in the art. In an alternate embodiment, solid particles of conductive polymer can be mixed with solid silicon particles, and the mixture of particles stored at elevated temperature. In embodiments, the temperature is near or above the glass transition temperature of the polymer. In additional embodiments, the temperature is near or above the softening temperature of the polymer. In additional embodiments, the temperature is near or above the melting temperature of the polymer. The elevated temperature may be about 100 C, or about 120 C, or about 140 C, or about 160 C, or about 180 C, or about 200 C. The pyrolysis can be conducted at elevated temperature as known in the art, for example at 300 C, or 350 C, or 400 C, or 450 C, or 500 C, or 600 C, or 700 C, or 800 C. In certain embodiments, the mixture of nano-featured or nano-featured and nano-sized silicon can be pyrolyzed at 850 C, 900 C, 1000 C, 1050 C, or 1100 C. Exemplary conductive polymers include, but are not limited to, polyacrylonitrile (PAN), polyaniline, polypyrrole, polyacetylene, polyphenylene, polyphenylene sulfide, polythiophene, poly(fluorene)s, polypyrenes, polyazulenes, polynaphthalenes, polycarbazoles, polyindoles, polyazepines, poly(3,4-ethylenedioxythiophene) (PEDOT), poly(p-phenylene sulfide) (PPS), poly (p-phenylene vinylene) (PPV), and mixtures thereof. The ratio of nano-featured or nano-featured and nano-sized silicon to conductive polymer can be varied, for example, from 95:5 to 9:95. In certain embodiments, the ratio of silicon to conductive polymer is 95:5 to 60:40, or 90:10 to 70:30.

In another embodiment, the present disclosure provides for the manufacturing of a composite silicon-carbon material, wherein the silicon material is a nano-sized silicon material or nano-sized silicon material with nano-sized features that is impregnated within the carbon scaffold according to the methods generally described herein, and the resulting silicon carbon composite is further coating with a second carbon coating, wherein the second carbon coating is achieved via application of a conductive polymer. In certain embodiments, the conductive polymer is pyrolyzed to achieve a pyrolyzed conductive polymer coating. There are various embodiments whereby the conductive polymer can be composited with the composite of nano-featured and/or nano-sized and nano-featured silicon with the carbon. For example, the silicon carbon composite can be suspended in a solvent containing dissolved conductive polymer, the suspension can then be dried as known in the art. In an alternate embodiment, solid particles of conductive polymer can be mixed with solid silicon carbon composite particles, and the mixture of particles stored at elevated temperature. In embodiments, the temperature is near or above the glass transition temperature of the polymer. In additional embodiments, the temperature is near or above the softening temperature of the polymer. In additional embodiments, the temperature is near or above the melting temperature of the polymer. The elevated temperature may be about 100 C, or about 120 C, or about 140 C, or about 160 C, or about 180 C, or about 200 C. The pyrolysis can be conducted at elevated temperature as known in the art, for example at 300 C, or 350 C, or 400 C, or 450 C, or 500 C, or 600 C, or 700 C, or 800 C. In certain embodiments, the mixture of nano-featured or nano-featured and nano-sized silicon can be pyrolyzed at 850 C, 900 C, 1000 C, 1050 C, or 1100 C. Exemplary conductive polymers include, but are not limited to, polyacrylonitrile (PAN), polyaniline, polypyrrole, polyacetylene, polyphenylene, polyphenylene sulfide, polythiophene, poly(fluorene)s, polypyrenes, polyazulenes, polynaphthalenes, polycarbazoles, polyindoles, polyazepines, poly(3,4-ethylenedioxythiophene) (PEDOT), poly(p-phenylene sulfide) (PPS), poly(p-phenylene vinylene) (PPV), and mixtures thereof. The ratio of composite of nano-featured or nano-featured and nano-sized silicon with carbon to conductive polymer can be varied, for example, from 95:5 to 9:95. In certain embodiments, the ratio of composite to conductive polymer is 95:5 to 60:40, or 90:10 to 70:30.

N. Electrochemical Performance of Composites with Extremely Durable Insertion of Lithium As noted above, certain embodiments of the present disclosure are directed to composite materials comprising a core of porous carbon scaffold upon which nano silicon is impregnated or otherwise introduced via CVD in the presence of silane gas, or other suitable technique, with an optional final coating, for example of carbon achieved via CVD in the presence of propane, or other suitable technique, or coating with conductive polymer. Such composites exhibit extremely durable intercalation of lithium, and therefore are highly useful as anode material in lithium-based (or sodium-based) and other electrical storage devices. While not wishing to be bound by theory, it is believed that the nano sized silicon achieved as a result of filling in certain, desired pore volume structure of the porous carbon scaffold (for instance, silicon filling pores in the range of 5 to 1000 nm, or other range as disclosed elsewhere herein), along with the advantageous properties of the other components of the composite, including the carbon or conductive polymer coating, and, at least in part, owing its preparation method, and variation of the preparation parameters, yield composite materials having different and advantageous properties, for instance electrochemical performance when the composite comprises an anode of a lithium ion energy storage device.

In certain embodiments, the electrochemical performance of the composite disclosed herein is tested in a half-cell; alternatively the performance of the composite with extremely durable intercalation of lithium disclosed herein is tested in a full cell, for example a full cell coin cell, a full cell pouch cell, a prismatic cell, or other battery configurations known in the art. The anode composition comprising the composite with extremely durable intercalation of lithium disclosed herein can further comprise various species, as known in the art. Additional formulation components include, but are not limited to, conductive additives, such as conductive carbons such as Super P, Ketjenblack carbons, and the like, conductive polymers and the like, binders such as styrene-butadiene rubber sodium carboxymethylcellulose (SBR-Na CMC), polyvinylidene difluoride (PVDF), and the like, and combinations thereof. The various types and species comprising the electrode are known in the art. The % of active material in the electrode by weight can vary, for example between 1 and 5%, for example between 5 and 15%, for example between 15 and 25%, for example between 25 and 35%, for example between 35 and 45%, for example between 45 and 55%, for example between 55 and 65%, for example between 65 and 75%, for example between 75 and 85%, for example between 85 and 95%. In embodiments, the active material comprises between 80 and 95% of the electrode. In certain embodiment, the amount of conductive additive in the electrode can vary, for example between 1 and 5%, between 5 and 15%, for example between 15 and 25%, for example between 25 and 35%. In embodiments, the amount of conductive additive in the electrode is between 5 and 25%. In certain embodiments, the amount of binder can vary, for example between 1 and 5%, between 5 and 15%, for example between 15 and 25%, for example between 25 and 35%. In certain embodiments, the amount of conductive additive in the electrode is between 5 and 25%.

Embodiments of the composite with extremely durable intercalation of lithium disclosed herein improves the properties of any number of electrical energy storage devices, for example the composite with extremely durable intercalation of lithium disclosed herein have been shown to improve the first cycle efficiency of a lithium-based battery. Accordingly, one embodiment of the present disclosure provides a composite with extremely durable intercalation of lithium disclosed herein, wherein said matter has a first cycle efficiency of greater than 50% when the matter is incorporated into an electrode of a lithium based energy storage device, for example a lithium ion battery. For example, some embodiments provide a composite with extremely durable intercalation of lithium disclosed herein having a surface area of greater than 50 m2/g, wherein the carbon material has a first cycle efficiency of greater than 50% and a reversible capacity of at least 600 mAh/g when the material is incorporated into an electrode of a lithium based energy storage device. In other embodiments, the first cycle efficiency is greater than 55%. In some other embodiments, the first cycle efficiency is greater than 60%. In yet other embodiments, the first cycle efficiency is greater than 65%. In still other embodiments, the first cycle efficiency is greater than 70%. In other embodiments, the first cycle efficiency is greater than 75%, and in other embodiments, the first cycle efficiency is greater than 80%, greater than 90%, greater than 95%, greater than 98%, or greater than 99%.

The silicon-carbon composite material may be prelithiated, as known in the art. In certain embodiments, the prelithiation is achieved electrochemically, for example in a half cell, prior to assembling the lithiated anode comprising the porous silicon material into a full cell lithium ion battery. In certain embodiments, prelithiation is accomplished by doping the cathode with a lithium-containing compound, for example a lithium containing salt. Examples of suitable lithium salts in this context include, but are not limited to, dilithium tetrabromonickelate(II), dilithium tetrachlorocuprate(II), lithium azide, lithium benzoate, lithium bromide, lithium carbonate, lithium chloride, lithium cyclohexanebutyrate, lithium fluoride, lithium formate, lithium hexafluoroarsenate(V), lithium hexafluorophosphate, lithium hydroxide, lithium iodate, lithium iodide, lithium metaborate, lithium perchlorate, lithium phosphate, lithium sulfate, lithium tetraborate, lithium tetrachloroaluminate, lithium tetrafluoroborate, lithium thiocyanate, lithium trifluoromethanesulfonate, lithium trifluoromethanesulfonate, and combinations thereof.

The anode comprising the silicon-carbon composite material can be paired with various cathode materials to result in a full cell lithium ion battery. Examples of suitable cathode materials are known in the art. Examples of such cathode materials include, but are not limited to $LiCoO_2$ (LCO), $LiNi_{0.8}Co_{0.15}Al_{0.05}O_2$ (NCA), $LiNi_{1/3}Co_{1/3}Mn_{1/3}O_2$ (NMC), $LiMn_2O_4$ and variants (LMO), and $LiFePO_4$ (LFP).

For the full cell lithium ion battery comprising an anode further comprising the silicon-carbon composite material, pairing of cathode to anode can be varied. For example, the ratio of cathode-to-anode capacity can vary from 0.7 to 1.3. In certain embodiments, the ratio of cathode-to-anode capacity can vary from 0.7 to 1.0, for example from 0.8 to 1.0, for example from 0.85 to 1.0, for example from 0.9 to 1.0, for example from 0.95 to 1.0. In other embodiments, the ratio of cathode-to-anode capacity can vary from 1.0 to 1.3, for example from 1.0 to 1.2, for example from 1.0 to 1.15, for example from 1.0 to 1.1, for example from 1.0 to 1.05. In yet other embodiments, the ratio of cathode-to-anode capacity can vary from 0.8 to 1.2, for example from 0.9 to 1.1, for example from 0.95 to 1.05.

For the full cell lithium ion battery comprising an anode further comprising the silicon-carbon composite material, the voltage window for charging and discharging can be varied. In this regard, the voltage window can be varied as known in the art, depending on various properties of the lithium ion battery. For instance, the choice of cathode plays a role in the voltage window chosen, as known in the art. Examples of voltage windows vary, for example, in terms of potential versus Li/Li+, from 2.0 V to 5.0 V, for example from 2.5 V to 4.5V, for example from 2.5V to 4.2V.

For the full cell lithium ion battery comprising an anode further comprising the silicon-carbon composite material, the strategy for conditioning the cell can be varied as known in the art. For example, the conditioning can be accomplished by one or more charge and discharge cycles at various rate(s), for example at rates slower than the desired cycling rate. As known in the art, the conditioning process may also include a step to unseal the lithium ion battery, evacuate any gases generated within during the conditioning process, followed by resealing the lithium ion battery.

For the full cell lithium ion battery comprising an anode further comprising the silicon-carbon composite material, the cycling rate can be varied as known in the art, for example, the rate can between C/20 and 20C, for example between C10 to 10C, for example between C/5 and 5C. In certain embodiments, the cycling rate is C/10. In certain embodiments, the cycling rate is C/5. In certain embodiments, the cycling rate is C/2. In certain embodiments, the cycling rate is 1C. In certain embodiments, the cycling rate is 1C, with periodic reductions in the rate to a slower rate, for example cycling at 1C with a C/10 rate employed every 20th cycle.

In certain embodiments, the cycling rate is 2C. In certain embodiments, the cycling rate is 4C. In certain embodiments, the cycling rate is 5C. In certain embodiments, the cycling rate is 10C. In certain embodiments, the cycling rate is 20C.

In some embodiments of the foregoing, the composite with extremely durable intercalation of lithium disclosed herein also comprises a surface area ranging from about 5 $m^2/g$ to about 400 $m^2/g$ or a pore volume ranging from about 0.05 to about 1.0 cc/g or both. For example, in some embodiments the surface area ranges from about 200 $m^2/g$ to about 300 $m^2/g$ or the surface area is about 250 $m^2/g$.

In certain embodiments, the composite with extremely durable intercalation of lithium disclosed herein has a surface area below 200 $m^2/g$, for example below 100 $m^2/g$, for example below 50 $m^2/g$. In further embodiments, the composite material has a surface area below 30 $m^2/g$, for instance below 20 $m^2/g$, for instance below 10 $m^2/g$, for instance below 5 $m^2/g$, for instance below 2 $m^2/g$, for instance below 1 $m^2/g$.

In other embodiments the composite with extremely durable intercalation of lithium disclosed herein has a surface area of less than 50 $m^2/g$, for example less than 20 $m^2/g$, for example, less than 10 $m^2/g$, for example, less than 5 $m^2/g$, for example less than 1 $m^2/g$, and wherein the first cycle efficiency is greater than 50% and the reversible capacity is at least 600 mAh/g when the material is incorporated into an electrode of a lithium based energy storage device. In other embodiments, the first cycle efficiency is greater than 55%. In some other embodiments, the first cycle efficiency is greater than 60%. In yet other embodiments, the first cycle efficiency is greater than 65%. In still other embodiments, the first cycle efficiency is greater than 70%. In other embodiments, the first cycle efficiency is greater than 75%, and in other embodiments, the first cycle efficiency is greater than 80%, greater than 90%, greater than 95%, greater than 98%, or greater than 99%. In some embodiments of the foregoing, the composite materials also comprise a surface area ranging from about 1 $m^2/g$ to about 400 $m^2/g$ or a pore volume ranging from about 0.01 to about 1.0cc/g or both. For example, in some embodiments the surface area ranges from about 200 $m^2/g$ to about 300 $m^2/g$ or the surface area is about 250 $m^2/g$.

The electrochemical properties of the composite with extremely durable intercalation of lithium disclosed herein (e.g., first cycle efficiency, capacity, etc.) can be determined by incorporating into an electrode, known to those versed in the art. The composite is tested electrochemically. The methods of testing may vary depending on the electrode composition, as known in the art. In one example, pure silicon is tested between upper and lower voltages of 1.0V and 10 mV at a current of 400 mAh/g, after two formation cycles between 1.0V and 70 mV at a current of 200 mAh/g, with respect to the mass of the composite material. Alternatively, the composite materials are tested by limiting the capacity at a predefined value and measuring the stability and voltage fluctuations of the composite.

The first cycle efficiency of the composite with extremely durable intercalation of lithium disclosed herein be determined by comparing the lithium inserted into the anode during the first cycle to the lithium extracted from the anode on the first cycle, prior prelithiation modification. When the insertion and extraction are equal, the efficiency is 100%. As known in the art, the anode material can be tested in a half-cell, where the counter electrode is lithium metal, the electrolyte is a 1M $LiPF_6$ 1:1 ethylene carbonate:diethylcarbonate (EC:DEC), using a commercial polypropylene separator. In certain embodiments, the electrolyte can comprise various additives known to provide improved performance, such as fluoroethylene carbonate (FEC) or other related fluorinated carbonate compounds, or ester co-solvents such as methyl butyrate, vinylene carbonate, and other electrolyte additives known to improve electrochemical performance of silicon-comprising anode materials.

Coulombic efficiency can be averaged, for example averaged over cycles 7 to cycle 25 when tested in a half cell. In certain embodiments, the average efficiency of the composite with extremely durable intercalation of lithium is greater than 0.9, or 90%. In certain embodiments, the average efficiency is greater than 0.95, or 95%. In embodiments, the average efficiency is greater than 0.98, or 98%. In further embodiments, the average efficiency is greater than 0.99, or 99%. In further embodiments, the average efficiency is greater than 0.991, or 99.1%. In further embodiments, the average efficiency is greater than 0.992, or 99.2%. In further embodiments, the average efficiency is greater than 0.993, or 99.3%. In further embodiments, the average efficiency is greater than 0.994, or 99.4%. In further embodiments, the average efficiency is greater than 0.995, or 99.5%. In further embodiments, the average efficiency is greater than 0.996, or 99.6%. In further embodiments, the average efficiency is greater than 0.997, or 99.7%. In further embodiments, the average efficiency is greater than 0.998, or 99.8%. In further embodiments, the average efficiency is greater than 0.999, or 99.9%. In further embodiments, the average efficiency is greater than 0.9999, or 99.99%.

In another embodiment the present disclosure provides a composite material with extremely durable intercalation of lithium, wherein the composite has a volumetric capacity (i.e., reversible capacity) independent of alloying electrochemical modifier of at least 400 mAh/cc when the material is incorporated into an electrode of a lithium based energy storage device, for example a lithium ion battery. The volumetric capacity of the composite can be calculated from multiplying the maximum gravimetric capacity (mAh/g) with the pycnometer, skeletal density (g/cc), without the presence of the electrochemical modifier. In other embodiments, this volumetric capacity is at least 450 mAh/cc. In some other embodiments, the volumetric capacity is at least 500 mAh/cc. In yet other embodiments, the volumetric capacity is at least 550 mAh/cc. In still other embodiments, the volumetric capacity is at least 600 mAh/cc. In other embodiments, the volumetric capacity is at least 650 mAh/cc, and in other embodiments, the volumetric capacity is at least 700 mAh/cc. In another embodiment, the volumetric capacity of the carbon component of the composite is between 700 and 1100 mAh/cc.

In another embodiment the present disclosure provides a composite material with extremely durable intercalation of lithium, wherein the composite has a volumetric capacity (i.e., reversible capacity) of at least 800 mAh/cc when the composite material is incorporated into an electrode of a lithium based energy storage device, for example a lithium ion battery. The volumetric capacity of the composite materials can be calculated from multiplying the maximum gravimetric capacity (mAh/g) with the pycnometer, skeletal density (g/cc) prior to electrochemical testing. In other embodiments, the volumetric capacity is at least 900 mAh/cc. In some other embodiments, the volumetric capacity is at least 1000 mAh/cc. In yet other embodiments, the volumetric capacity is at least 1100 mAh/cc. In still other embodiments, the volumetric capacity is at least 1200 mAh/cc. In other embodiments, the volumetric capacity is at least 1300 mAh/cc, and in other embodiments, the volumetric capacity is at least 1400 mAh/cc, at least 1500 mAh/cc, at least 1600 mAh/cc, at least 1700 mAh/cc, at least 1800 mAh/cc or even at least 1900 mAh/cc. In yet other embodiments, the volumetric capacity is between 2000 and 8000 mAh/cc. In still other embodiments, the volumetric capacity is between 4000 and 7000 mAh/cc. In some particular embodiments the composite materials have a volumetric capacity ranging from about 2500 mAh/cc to about 3500 mAh/cc.

In another embodiment, the present disclosure provides a composite material with extremely durable intercalation of lithium, wherein the composite has a gravimetric capacity (i.e., reversible capacity) independent of the alloying electrochemical modifier of at least 150 mAh/g when the material is incorporated into an electrode of a lithium based energy storage device, for example a lithium ion battery. In other embodiments, the gravimetric capacity is at least 200 mAh/g. In some other embodiments, this gravimetric capacity is at least 300 mAh/g. In yet other embodiments, the gravimetric capacity is at least 400 mAh/g. In still other embodiments, the gravimetric capacity is at least 500 mAh/g. In other embodiments, the gravimetric capacity is at least 600 mAh/g, and in other embodiments, the gravimetric capacity is at least 700 mAh/g, at least 800 mAh/g, at least 900 mAh/g, at least 1000 mAh/g, at least 1100 mAh/g, at least 1200 mAh/g, at least 1300 mAh/g, at least 1400 mAh/g, at least 1600 mAh/g, at least 1800 mAh/g, at least 2000 mAh/g, at least 2500 mAh/g, at least 3000 mAh/g, at least 3500 mAh/g. In yet other embodiments, the gravimetric capacity is between 1200 and 3500 mAh/g. In some particular embodiments the composite materials have a gravimetric capacity ranging from about 700 mAh/g to about 2000 mAh/g. In some particular embodiments the composite materials have a gravimetric capacity ranging from about 1000 mAh/g to about 1500 mAh/g. In some particular embodiments the composite materials have a gravimetric capacity ranging from about 550 mAh/g to about 750 mAh/g. In some particular embodiments the composite materials have a gravimetric capacity ranging from about 400 mAh/g to about 500 mAh/g. Certain examples of any of the above composite materials may comprise an electrochemical modifier as described in more detail below.

O. Physicochemical Properties of Composites with Extremely Durable Insertion of Lithium that Influence Electrochemical Performance As noted above, traditional lithium based energy storage devices comprise graphitic anode material. The disadvantages of graphitic carbon are numerous in lithium ion batteries. For one, the graphite undergoes a phase and volume change during battery operation. That is, the material physically expands and contracts when lithium is inserted between the graphene sheets while the individual sheets physically shift laterally to maintain a low energy storage state. Secondly, graphite has a low capacity. Given the ordered and crystalline structure of graphite, it takes six carbons to store one lithium ion. The structure is not able to accommodate additional lithium. Thirdly, the movement of lithium ions is restricted to a 2D plane, reducing the kinetics and the rate capability of the material in a battery. This means that graphite does not perform well at high rates where power is needed. This power disadvantage is one of the limiting factors for using lithium ion batteries in all-electric vehicles.

Accordingly, and without being bound by theory, there are certain physicochemical properties of the composite materials that allow for their extremely durable intercalation of lithium. Exemplary, critical characteristic in this context are silicon content, morphology and size within the composite, as discussed below and throughout this disclosure.

In certain embodiments, the embedded silicon particles embedded within the composite comprise nano-sized features. The nano-sized features can have a characteristic length scale of preferably less than 1 μm, preferably less than 300 nm, preferably less than 150 nm, preferably less than 100 μm, preferably less than 50 nm, preferably less than 30 nm, preferably less than 15 nm, preferably less than nm, preferably less than 5 nm.

In certain embodiments, the silicon embedded within the composite is spherical in shape. In certain other embodiments, the porous silicon particles are non-spherical, for example rod-like, or fibrous in structure. In embodiments, the silicon exists as a layer coating the inside of pores within the porous carbon scaffold. The depth of this silicon layer can vary, for example the depth can between 5 nm and 10 nm, for example between 5 nm and 20 nm, for example between 5 nm and 30 nm, for example between 5 nm and 33 nm, for example between 10 nm and 30 nm, for example between 10 nm and 50 nm, for example between 10 nm and 100 nm, for example between 10 and 150 nm, for example between 50 nm and 150 nm, for example between 100 and 300 nm, for example between 300 and 1000 nm.

In embodiments, the silicon embedded within the composite is nano sized, and resides within pores of the porous carbon scaffold. For example, the embedded silicon can be impregnated, deposited by CVD, or other appropriate process into pores within the porous carbon particle comprising pore sizes between 5 and 1000 nm, for example between 10 and 500 nm, for example between 10 and 200 nm, for example between 10 and 100 nm, for example between 33 and 150 nm, for example between and 20 and 100 nm. Other ranges of carbon pores sizes with regards to fractional pore volume, whether micropores, mesopores, or macropores, are also envisioned.

In certain embodiments, the porous silicon particles embedded within the composite fill the pores within the porous carbon scaffold material. The percent of pore volume within the porous carbon scaffold that is filled with silicon can vary. For example, the silicon embedded within the porous carbon scaffold material can occupy between 5% and 15% of the total available pore volume within the porous carbon scaffold. In other embodiments, the silicon embedded within the porous carbon scaffold material can occupy between 15% and 25% of the total available pore volume within the porous carbon scaffold. In other embodiments, the silicon embedded within the porous carbon scaffold material can occupy between 25% and 35% of the total available pore volume within the porous carbon scaffold. In other embodiments, the silicon embedded within the porous carbon scaffold material can occupy between 20% and 40% of the total available pore volume within the porous carbon scaffold. In other embodiments, the silicon embedded within the porous carbon scaffold material can occupy between 25% and 50% of the total available pore volume within the porous carbon scaffold. In other embodiments, the silicon embedded within the porous carbon scaffold material can occupy between 30% and 70% of the total available pore volume within the porous carbon scaffold, for example between 30% and 60% of the total available pore volume within the porous carbon scaffold. In other embodiments, the silicon embedded within the porous carbon scaffold material can occupy between 60% and 80% of the total available pore volume within the porous carbon scaffold. In other embodiments, the silicon embedded within the porous carbon scaffold material can occupy between 80% and 100% of the total available pore volume within the porous carbon scaffold.

In embodiments, the silicon embedded within the porous carbon scaffold material occupies a fraction of the total available pore volume within the porous carbon scaffold, with the remainder of the pore volume being available for the silicon to expand into upon the uptake of lithium. In this context, and without being bound by theory, this remaining pore volume may or may not be accessible to nitrogen, and therefore may or may not be observed upon employing nitrogen gas sorption as disclosed herein.

Accordingly, in some embodiments, the silicon embedded within the porous carbon scaffold material can occupy between 30% and 70% of the total available pore volume within the porous carbon scaffold, and the composite particle comprising the porous carbon scaffold and the embedded silicon comprised a pore volume of at least 0.01 cm3/g. In some embodiments, the silicon embedded within the porous carbon scaffold material can occupy between 30% and 70% of the total available pore volume within the porous carbon scaffold, and the composite particle comprising the porous carbon scaffold and the embedded silicon comprised a pore volume of at least 0.1 cm3/g. In some embodiments, the silicon embedded within the porous carbon scaffold material can occupy between 30% and 70% of the total available pore volume within the porous carbon scaffold, and the composite particle comprising the porous carbon scaffold and the embedded silicon comprised a pore volume of at least 0.2 cm3/g. In some embodiments, the silicon embedded within the porous carbon scaffold material can occupy between 30% and 70% of the total available pore volume within the porous carbon scaffold, and the composite particle comprising the porous carbon scaffold and the embedded silicon comprised a pore volume of at least 0.4 cm3/g. In some embodiments, the silicon embedded within the porous carbon scaffold material can occupy between 30% and 70% of the total available pore volume within the porous carbon scaffold, and the composite particle comprising the porous carbon scaffold and the embedded silicon comprised a pore volume of at least 0.6 cm3/g. In some embodiments, the silicon embedded within the porous carbon scaffold material can occupy between 30% and 70% of the total available pore volume within the porous carbon scaffold, and the composite particle comprising the porous carbon scaffold and the embedded silicon comprised a pore volume of at least 0.8 cm3/g. In some embodiments, the silicon embedded within the porous carbon scaffold material can occupy between 30% and 70% of the total available pore volume within the porous carbon scaffold, and the composite particle comprising the porous carbon scaffold and the embedded silicon comprised a pore volume of at least 0.8 cm3/g.

Accordingly, in some embodiments, the silicon embedded within the porous carbon scaffold material can occupy between 30% and 70% of the total available pore volume within the porous carbon scaffold, and the composite particle comprising the porous carbon scaffold and the embedded silicon comprised a pore volume of less than 0.5 cm3/g. In some embodiments, the silicon embedded within the porous carbon scaffold material can occupy between 30% and 70% of the total available pore volume within the porous carbon scaffold, and the composite particle comprising the porous carbon scaffold and the embedded silicon comprised a pore volume of less than 0.4 cm3/g. In some embodiments, the silicon embedded within the porous carbon scaffold material can occupy between 30% and 70% of the total available pore volume within the porous carbon scaffold, and the composite particle comprising the porous carbon scaffold and the embedded silicon comprised a pore volume of less than 0.3 cm3/g. In some embodiments, the silicon embedded within the porous carbon scaffold material can occupy between 30% and 70% of the total available pore volume within the porous carbon scaffold, and the composite particle comprising the porous carbon scaffold and the embedded silicon comprised a pore volume of less than 0.2 cm3/g. In some embodiments, the silicon embedded within the porous carbon scaffold material can occupy between 30% and 70% of the total available pore volume within the porous carbon scaffold, and the composite particle comprising the porous carbon scaffold and the embedded silicon comprised a pore volume of less than 0.1 cm3/g. In some embodiments, the silicon embedded within the porous carbon scaffold material can occupy between 30% and 70% of the total available pore volume within the porous carbon scaffold, and the composite particle comprising the porous carbon scaffold and the embedded silicon comprised a pore volume of less than 0.05 cm3/g. In some embodiments, the silicon embedded within the porous carbon scaffold material can occupy between 30% and 70% of the total available pore volume within the porous carbon scaffold, and the composite particle comprising the porous carbon scaffold and the embedded silicon comprised a pore volume of less than 0.02 cm3/g. In some embodiments, the silicon embedded within the porous carbon scaffold material can occupy between 30% and 70% of the total available pore volume within the porous carbon scaffold, and the composite particle comprising the porous carbon scaffold and the embedded silicon comprised a pore volume of less than 0.01 cm3/g.

In certain other embodiments, the silicon embedded within the pore volume of the porous silicon resides substantially within macropores, as evidenced by reduction in macropore volume in the silicon-embedded composite material compared to the porous carbon scaffold material prior to the addition of the silicon. Thus, in some embodiments, the embedded silicon results in at least 10% reduction of the macropore volume, for example at least 20% reduction of the macropore volume, for example at least 30% reduction of the macropore volume, for example at least 40% reduction of the macropore volume, for example at least 50% reduction of the macropore volume, for example at least 60% reduction of the macropore volume, for example at least 70% reduction of the macropore volume, for example at least 80% reduction of the macropore volume, for example at least 90% reduction of the macropore volume.

In certain other embodiments, the silicon embedded within the pore volume of the porous silicon resides substantially within mesopores, as evidenced by reduction in mesopore volume in the silicon-embedded composite material compared to the porous carbon scaffold material prior to the addition of the silicon. Thus, in some embodiments, the embedded silicon results in at least 10% reduction of the mesopore volume, for example at least 20% reduction of the mesopore volume, for example at least 30% reduction of the mesopore volume, for example at least 40% reduction of the mesopore volume, for example at least 50% reduction of the mesopore volume, for example at least 60% reduction of the mesopore volume, for example at least 70% reduction of the mesopore volume, for example at least 80% reduction of the mesopore volume, for example at least 90% reduction of the mesopore volume.

In certain other embodiments, the silicon embedded within the pore volume of the porous silicon resides substantially within micropores, as evidenced by reduction in micropore volume in the silicon-embedded composite material compared to the porous carbon scaffold material prior to the addition of the silicon. Thus, in some embodiments, the embedded silicon results in at least 10% reduction of the micropore volume, for example at least 20% reduction of the micropore volume, for example at least 30% reduction of the micropore volume, for example at least 40% reduction of the micropore volume, for example at least 50% reduction of the micropore volume, for example at least 60% reduction of the micropore volume, for example at least 70% reduction of the micropore volume, for example at least 80% reduction of the micropore volume, for example at least 90% reduction of the micropore volume.

In certain embodiments, the silicon is both embedded within essentially all the available pre volume within the porous carbon scaffold particle, and also covers the surface of the particle, this, the silicon loading can represent greater than 100% of the total pore volume of the porous carbon scaffold prior to the addition of the silicon. For example, the silicon loading in this context can be greater than 105%, for example greater than 110%, for example greater than 120%, for example greater than 130%, for example greater than 150%, for example greater than 200%.

In certain embodiments, the pore volume distribution of the composite material is proved by high resolution transmission electron spectroscopy (HRTEM).

In certain embodiments, the composite material comprises less than 20% micropores, greater than 30% mesopores and greater than 30% macropores. In certain embodiments, the composite material comprises less than 10% micropores, greater than 30% mesopores and greater than 30% macropores. In certain embodiments, the composite material comprises less than 5% micropores, greater than 30% mesopores and greater than 30% macropores. In certain embodiments, the composite material comprises less than 5% micropores, greater than 40% mesopores and greater than 40% macropores. In certain embodiments, the composite material comprises less than 1% micropores, greater than 40% mesopores and greater than 40% macropores.

In certain embodiments, the composite material comprises less than 10% micropores, greater than 70% mesopores and greater than 20% macropores. In certain embodiments, the composite material comprises less than 10% micropores, greater than 20% mesopores and greater than 70% macropores. In certain embodiments, the composite material comprises less than 10% micropores, greater than 10% mesopores and greater than 80% macropores. In certain embodiments, the composite material comprises less than 10% micropores, greater than 80% mesopores and greater than 10% macropores.

In certain embodiments, the composite material comprises less than 5% micropores, greater than 70% mesopores and greater than 20% macropores. In certain embodiments, the composite material comprises less than 5% micropores, greater than 20% mesopores and greater than 70% macropores. In certain embodiments, the composite material comprises less than 5% micropores, greater than 5% mesopores and greater than 80% macropores. In certain embodiments, the composite material comprises less than 5% micropores, greater than 80% mesopores and greater than 10% macropores.

In certain embodiments, the composite material comprises less than 1% micropores, greater than 70% mesopores and greater than 20% macropores. In certain embodiments, the composite material comprises less than 1% micropores, greater than 20% mesopores and greater than 70% macropores. In certain embodiments, the composite material comprises less than 1% micropores, greater than 10% mesopores and greater than 80% macropores. In certain embodiments, the composite material comprises less than 1% micropores, greater than 80% mesopores and greater than 10% macropores.

In certain embodiment, the composite comprises less than 4% micropores, greater than 84% mesopores and less than 13% macropores.

In certain embodiments, the composite comprises a pore volume between 0.01 and 0.5, and the pore volume distribution comprises less than 20% micropores, greater than 50% mesopores, and less than 30% macropores. In certain embodiments, the composite comprises a pore volume between 0.05 and 0.4 cm3/g, and the pore volume distribution comprises less than 10% micropores, greater than 60% mesopores, and less than 20% macropores. In certain embodiments, the composite comprises a pore volume between 0.1 and 0.3 cm3/g, and the pore volume distribution comprises less than 5% micropores, greater than 70% mesopores, and less than 15% macropores. In certain embodiments, the composite comprises a pore volume between 0.1 and 0.3 cm3/g, and the pore volume distribution comprises less than 5% micropores, greater than 85% mesopores, and less than 10% macropores.

In embodiments, the silicon is embedded within a fraction of the porous carbon scaffold, and the pores are capped with a coating that surrounds the composite particle, for example this coating can comprise carbon or a conductive polymer, as described elsewhere within this disclosure. In this context, and without being bound by theory, this pore volume may not accessible to nitrogen and therefore not detectable by nitrogen sorption. However, this resulting void space within the composite particle ca be ascertained by other means, for example by measuring tap density, or envelope density, for example by pyncnometry techniques.

Accordingly, the composite material with extremely durable intercalation of lithium may comprise silicon embedded within the porous carbon scaffold material between 30% and 70% of the total available pore volume within the porous carbon scaffold, and the composite particle comprises a tap density less than 0.7 g/cm3, for example less than 0.6 g/cm3, for example less than 0.5 g/cm3, for example less than 0.4 g/cm3, for example less than 0.3 g/cm3, for example less than 0.2 g/cm3, for example less than 0.15 g/cm3, for example less than 0.1 g/cm3.

In some embodiments, the composite material with extremely durable intercalation of lithium may comprise silicon embedded within the porous carbon scaffold material between 30% and 70% of the total available pore volume within the porous carbon scaffold, and the composite particle comprises a skeletal density as determined by pyncnometry less than 2.1 g/cm3, for example less than 2.0 g/cm3, for example less than 1.9 g/cm3, for example less than 1.8 g/cm3, for example less than 1.7 g/cm3, for example less than 1.6 g/cm3, for example less than 1.4 g/cm3, for example less than 1.2 g/cm3, for example less than 1.0 g/cm3.

The silicon content within the composite material exhibiting extremely durable intercalation of lithium can be varied. For example, the silicon content within the composite can range from 5 to 95% by weight. In certain embodiments, the content of silicon within the composite can range from 10% to 80%, for example, 20% to 70%, for example 30% to 60%, for example 40 to 50%. In some embodiments, the content of silicon within the composite can range from 10% to 50%, for example, 20% to 40%, for example 30% to 40%. In other embodiments, the content of silicon within the composite can range from 40% to 80%, for example, 50% to 70%, for example 60% to 70%. In specific embodiments, the content of silicon within the composite can range from 10% to 20%. In specific embodiments, the content of silicon within the composite can range from 15% to 25%. In specific embodiments, the content of silicon within the composite can range from 25% to 35%. In specific embodiments, the content of silicon within the composite can range from 35% to 45%. In specific embodiments, the content of silicon within the composite can range from 45% to 55%. In specific embodiments, the content of silicon within the composite can range from 55% to 65%. In specific embodiments, the content of silicon within the composite can range from 65% to 75%. In specific embodiments, the content of silicon within the composite can range from 75% to 85%.

Since the total pore volume (as determined by nitrogen gas sorption) may partially relate to the storage of lithium ions, the internal ionic kinetics, as well as the available composite/electrolyte surfaces capable of charge-transfer, this is one parameter that can be adjusted to obtain the desired electrochemical properties.

Accordingly, the surface area and pore volume of the composite material exhibiting extremely durable intercalation of lithium can be varied. For example, the surface area of the composite material exhibiting extremely durable intercalation of lithium can range between 10 $m^2/g$ and 200 $m^2/g$. In certain embodiments, the surface area of the composite can range between 10 $m^2/g$ and 100 $m^2/g$, for example between 20 $m^2/g$ and 200 $m^2/g$, for example between 20 $m^2/g$ and 150 $m^2/g$, for example between 10 $m^2/g$ and 100 $m^2/g$. In some embodiments, the surface area of the composite can range between 20 $m^2/g$ and 80 $m^2/g$, for example between 20 $m^2/g$ and 70 $m^2/g$, for example between 30 $m^2/g$ and 70 $m^2/g$, for example between 40 $m^2/g$ and 60 $m^2/g$.

The pore volume of the composite material exhibiting extremely durable intercalation of lithium can range between 0.01 cm3/g and 0.2 cm3/g. In certain embodiments, the pore volume of the composite material can range between 0.01 cm3/g and 0.15 cm3/g, for example between 0.01 cm3/g and 0.1 cm3/g, for example between 0.01 cm3/g and 0.05 cm2/g.

The pore volume distribution of the composite material exhibiting extremely durable intercalation of lithium can vary, for example the % micropores can comprise less than 30%, for example less than 20%, for example less than 10%, for example, less than 5%, for example less than 4%, for example, less than 3%, for example, less than 2%, for example, less than 1%, for example, less than 0.5%, for example, less than 0.2%, for example, less than 0.1%. In certain embodiments, there is no detectable micropore volume in the composite material exhibiting extremely durable intercalation of lithium In some embodiments, the pore volume distribution of the composite exhibiting extremely durable intercalation of lithium comprises less than 30% mesopores, for example less than 20% mesopores, for example less than 10% mesopores, for example less than 5% mesopores, for example less than 4% mesopores, for example less than 3% mesopores, for example less than 2% mesopores, for example less than 1% mesopores, for example less than 0.5% mesopores, for example less than 0.2% mesopores, for example less than 0.1% mesopores. In some embodiments, there is no detectable mesopore volume in the composite material exhibiting extremely durable intercalation of lithium.

In some embodiments, the pore volume distribution of the composite material exhibiting extremely durable intercalation of lithium comprises more than 50% macropores, for example more than 60% macropores, for example more than 70% macropores, for example more than 80% macropores, for example more than 90% macropores, for example more than 95% macropores, for example more than 98% macropores, for example more than 99% macropores, for example more than 99.5% macropores, for example more than 99.9% macropores.

Certain embodiments of the pore volume distribution of the composite material exhibiting extremely durable intercalation of lithium comprises a variety of the embodiments of the above several paragraphs. For example, the composite material exhibiting extremely durable intercalation of lithium comprises less than 30% micropores, less than 30% mesopores, and greater than 50% macropores. In other embodiments, the composite material exhibiting extremely durable intercalation of lithium comprises less than 20% micropores, less than 20% mesopores, and greater than 70% macropores. In other embodiments, the composite material exhibiting extremely durable intercalation of lithium comprises less than 10% micropores, less than 10% mesopores, and greater than 80% macropores. In other embodiments, the composite material exhibiting extremely durable intercalation of lithium comprises less than 10% micropores, less than 10% mesopores, and greater than 90% macropores. In other embodiments, the composite material exhibiting extremely durable intercalation of lithium comprises less than 5% micropores, less than 5% mesopores, and greater than 90% macropores. In other embodiments, the composite material exhibiting extremely durable intercalation of lithium comprises less than 5% micropores, less than 5% mesopores, and greater than 95% macropores.

In certain embodiments, the surface layer of the composite material exhibits a low Young's modulus, in order to absorb volume deformation associated with the uptake and intercalation of lithium ions, while not fracturing or otherwise providing additional opportunity for new SEI formation. In this context, the surface layer is sufficient to provide a composite material comprising a Young's modulus less than 100 GPa, for example less than 10 GPa, for example less than 1 GPa, for example less than 0.1 GPa.

In certain embodiments, the surface layer of the composite material exhibits a low bulk modulus, in order to absorb volume deformation associated with the uptake and intercalation of lithium ions, while not fracturing or otherwise providing additional opportunity for new SEI formation. In this context, the surface layer is sufficient to provide a composite material comprising a bulk modulus less than 100 GPa, for example less than 10 GPa, for example less than 1 GPa, for example less than 0.1 GPa.

In certain other embodiments, the surface layer of the composite material exhibits a high bulk modulus, in order to restrict volume deformation associated with the uptake and intercalation of lithium ions, thus avoiding fracturing or otherwise denying additional opportunity for new SEI formation. In this context, the surface layer is sufficient to provide a composite material comprising a bulk modulus greater than 10 GPa, for example greater than 50 GPa, for example greater than 100 GPa, for example greater than 1000 GPa.

In some embodiments, the surface area of the composite material exhibiting extremely durable intercalation of lithium can be greater than 500 m2/g. In other embodiments, the surface area of the composite material exhibiting extremely durable intercalation of lithium can be less than 300 m2/g. In some embodiments, the surface area of the composite material exhibiting extremely durable intercalation of lithium is between 200 and 300 m2/g. In some embodiments, the surface area of the composite material exhibiting extremely durable intercalation of lithium is between 100 and 200 m2/g. In some embodiments, the surface area of the composite material exhibiting extremely durable intercalation of lithium is between 50 and 100 m2/g. In some embodiments, the surface area of the composite material exhibiting extremely durable intercalation of lithium is between 10 and 50 m2/g. In some embodiments, the surface area of the composite material exhibiting extremely durable intercalation of lithium is less than 10 m2/g. In some embodiments, the surface area of the composite material exhibiting extremely durable intercalation of lithium is less than 5 m2/g. In some embodiments, the surface area of the composite material exhibiting extremely durable intercalation of lithium is less than 2 m2/g. In some embodiments, the surface area of the composite material exhibiting extremely durable intercalation of lithium is less than 1 m2/g. In some embodiments, the surface area of the composite material exhibiting extremely durable intercalation of lithium is less than 0.5 m2/g. In some embodiments, the surface area of the composite material exhibiting extremely durable intercalation of lithium is less than 0.1 m2/g.

The surface area of the composite material may be modified through activation. The activation method may use steam, chemical activation, CO2 or other gasses. Methods for activation of carbon material are well known in the art.

The volumetric and gravimetric capacity can be determined through the use of any number of methods known in the art, for example by incorporating into an electrode half-cell with lithium metal counter electrode in a coin cell. The gravimetric specific capacity is determined by dividing the measured capacity by the mass of the electrochemically active carbon materials. The volumetric specific capacity is determined by dividing the measured capacity by the volume of the electrode, including binder and conductivity additive. Methods for determining the volumetric and gravimetric capacity are described in more detail in the Examples.

The composite may contain lithium metal, either through doping or through electrochemical cycling) in the pores of the composite, for example pores within the porous carbon within the composite. Lithium plating within pores is seen as beneficial to both the capacity and cycling stability of the hard carbon. Plating within the pores can yield novel nanofiber lithium. In some cases lithium may be plated on the outside of the particle. External lithium plating is detrimental to the overall performance as explained in the examples. The presence of both internal and external lithium metal may be measured by cutting a material using a focused ion beam (FIB) and a scanning electron microscope (SEM). Metallic lithium is easily detected in contrast to hard carbon in an SEM. After cycling, and when the material has lithium inserted below 0 V, the material may be sliced and imaged. In one embodiment the material displays lithium in the micropores. In another embodiment the material displays lithium in the mesopores. In still another embodiment, the material displays no lithium plating on the surface of the material. In yet still another embodiment silicon is stored in multiple pore sizes and shapes. The material shape and pore size distribution may uniquely and preferentially promote pore plating prior to surface plating. Ideal pore size for lithium storage is explained elsewhere within this disclosure.

The particle size distribution of the composite material exhibiting extremely durable intercalation of lithium is important to both determine power performance as well as volumetric capacity. As the packing improves, the volumetric capacity may increase. In one embodiment the distributions are either Gaussian with a single peak in shape, bimodal, or polymodal (>2 distinct peaks). The properties of particle size of the composite can be described by the DO (smallest particle in the distribution), Dv50 (average particle size) and Dv100 (maximum size of the largest particle). The optimal combined of particle packing and performance will be some combination of the size ranges below.

In one embodiment the Dv0 of the composite material exhibiting extremely durable intercalation of lithium can range from 1 nm to 5 microns. In another embodiment the Dv0 of the composite ranges from 5 nm to 1 micron, or 5 nm to 500 nm, or 5 nm to 100 nm, or 10 nm to 50 nm. In another embodiment the Dv0 of the composite ranges from 500 nm to 2 microns, or 750 nm to 1 micron, or 1 microns to 2 microns. In still another embodiments, the Dv0 of the composite ranges from 2 to 5 microns or even greater than 5 microns. The particle size reduction in the above embodiments can be carried out as known in the art, for example by jet milling in the presence of various gases including air, nitrogen, argon, helium, supercritical steam, and other gases known in the art. In one embodiment the Dv50 of the composite material exhibiting extremely durable intercalation of lithium range from 5 nm to 20 microns. In another embodiment the Dv50 of the composite ranges from 5 nm to 1 micron, 5 nm to 500 nm, 5 nm to 100 nm, 10 nm to 50 nm. In another embodiment the Dv50 of the composite ranges from 500 to 2 microns, 750 nm to 1 micron, 1 microns to 2 microns. In still another embodiments, the Dv50 of the composite ranges from 2 to 20 microns, or 3 microns to 10 microns, or 4 microns to 8 microns, or greater than 20 microns.

In one embodiment, the Dv100 of the composite material exhibiting extremely durable intercalation of lithium can range from 8 nm to 100 microns. In another embodiment the Dv100 of the composite ranges from 5 nm to 1 micron, 5 nm to 500 nm, 5 nm to 100 nm, 10 nm to 50 nm. In another embodiment the Dv100 of the composite ranges from 500 to 2 microns, 750 nm to 1 micron, 1 microns to 2 microns. In still another embodiment, the Dv100 of the composite ranges from 2 to 100 microns, 5 to 50 microns, 8 to 40 microns, 10 to 35 microns, 15 to 30 microns, 20 to 30 microns, around 25 microns, greater than 100 microns.

The span (Dv50)/(Dv90-Dv10), wherein Dv10, Dv50 and Dv90 represent the particle size at 10%, 50%, and 90% of the volume distribution, can be varied from example from 100 to 10, from 10 to 5, from 5 to 2, from 2 to 1; in some embodiments the span can be less than 1. In certain embodiments, the composite comprising carbon and porous silicon material particle size distribution can be multimodal, for example, bimodal, or trimodal.

In still other embodiments the present disclosure provides a composite material exhibiting extremely durable intercalation of lithium, wherein when the composite material is incorporated into an electrode of a lithium based energy storage device the composite material has a volumetric capacity at least 10% greater than when the lithium based energy storage device comprises a graphite electrode. In some embodiments, the lithium based energy storage device is a lithium ion battery. In other embodiments, the composite material has a volumetric capacity in a lithium based energy storage device that is at least 5% greater, at least 10% greater, at least 15% greater than the volumetric capacity of the same electrical energy storage device having a graphite electrode. In still other embodiments, the composite material has a volumetric capacity in a lithium based energy storage device that is at least 20% greater, at least 30% greater, at least 40% greater, at least 50% greater, at least 200% greater, at least 100% greater, at least 150% greater, or at least 200% greater than the volumetric capacity of the same electrical energy storage device having a graphite electrode.

The composite material may be prelithiated, as known in the art. These lithium atoms may or may not be able to be separated from the carbon. The number of lithium atoms to 6 carbon atoms can be calculated by techniques known to those familiar with the art:

$$\#Li=Q\times 3.6\times MM/(C\ \%\times F)$$

Wherein Q is the lithium extraction capacity measured in mAh/g between the voltages of 5 mV and 2.0V versus lithium metal, MM is 72 or the molecular mass of 6 carbons, F is Faraday's constant of 96500, C % is the mass percent carbon present in the structure as measured by CHNO or XPS.

The composite material exhibiting extremely durable intercalation of lithium can be characterized by the ratio of lithium atoms to carbon atoms (Li:C) which may vary between about 0:6 and 2:6. In some embodiments the Li:C ratio is between about 0.05:6 and about 1.9:6. In other embodiments the maximum Li:C ratio wherein the lithium is in ionic and not metallic form is 2.2:6. In certain other embodiments, the Li:C ratio ranges from about 1.2:6 to about 2:6, from about 1.3:6 to about 1.9:6, from about 1.4:6 to about 1.9:6, from about 1.6:6 to about 1.8:6 or from about 1.7:6 to about 1.8:6. In other embodiments, the Li:C ratio is greater than 1:6, greater than 1.2:6, greater than 1.4:6, greater than 1.6:6 or even greater than 1.8:6. In even other embodiments, the Li:C ratio is about 1.4:6, about 1.5:6, about 1.6:6, about 1.6:6, about 1.7:6, about 1.8:6 or about 2:6. In a specific embodiment the Li:C ratio is about 1.78:6.

In certain other embodiments, the composite material exhibiting extremely durable intercalation of lithium comprises an Li:C ratio ranging from about 1:6 to about 2.5:6, from about 1.4:6 to about 2.2:6 or from about 1.4:6 to about 2:6. In still other embodiments, the composite materials may not necessarily include lithium, but instead have a lithium uptake capacity (i.e., the capability to uptake a certain quantity of lithium, for example upon cycling the material between two voltage conditions (in the case of a lithium ion half cell, an exemplary voltage window lies between 0 and 3 V, for example between 0.005 and 2.7 V, for example between 0.005 and 1 V, for example between 0.005 and 0.8 V). While not wishing to be bound by theory, it is believed the lithium uptake capacity of the composite materials contributes to their superior performance in lithium based energy storage devices. The lithium uptake capacity is expressed as a ratio of the atoms of lithium taken up by the composite. In certain other embodiments, the composite material exhibiting extremely durable intercalation of lithium comprise a lithium uptake capacity ranging from about 1:6 to about 2.5:6, from about 1.4:6 to about 2.2:6 or from about 1.4:6 to about 2:6.

In certain other embodiments, the lithium uptake capacity ranges from about 1.2:6 to about 2:6, from about 1.3:6 to about 1.9:6, from about 1.4:6 to about 1.9:6, from about 1.6:6 to about 1.8:6 or from about 1.7:6 to about 1.8:6. In other embodiments, the lithium uptake capacity is greater than 1:6, greater than 1.2:6, greater than 1.4:6, greater than 1.6:6 or even greater than 1.8:6. In even other embodiments, the Li:C ratio is about 1.4:6, about 1.5:6, about 1.6:6, about 1.6:6, about 1.7:6, about 1.8:6 or about 2:6. In a specific embodiment the Li:C ratio is about 1.78:6.

In certain embodiments, the composite material exhibiting extremely durable intercalation is doped with an electrochemical modifier, for example with lithium. Different methods of doping lithium may include chemical reactions, electrochemical reactions, physical mixing of particles, gas phase reactions, solid phase reactions, and liquid phase reactions. In other embodiments the lithium is in the form of lithium metal.

As discussed in more detail below, the surface functionality of the presently disclosed the composite material exhibiting extremely durable intercalation of lithium may be altered to obtain the desired electrochemical properties. One property which can be predictive of surface functionality is the pH of the composite materials. The presently disclosed composite materials comprise pH values ranging from less than 1 to about 14, for example less than 5, from 5 to 8 or greater than 8. In some embodiments, the pH of the composite materials is less than 4, less than 3, less than 2 or even less than 1. In other embodiments, the pH of the composite materials is between about 5 and 6, between about 6 and 7, between about 7 and 8 or between 8 and 9 or between 9 and 10. In still other embodiments, the pH is high and the pH of the composite materials ranges is greater than 8, greater than 9, greater than 10, greater than 11, greater than 12, or even greater than 13.

Pore size distribution of the carbon scaffold may be important to both the storage capacity of the material and the kinetics and power capability of the system as well as the ability to incorporate large amounts of electrochemical modifiers. The pore size distribution can range from micro- to meso- to macropore sized and may be either monomodal, bimodal or multimodal. Micropores, with average pore sizes less than 1 nm, may create additional storage sites as well as lithium (or sodium) ion diffusion paths. Graphite sheets typically are spaced 0.33 nm apart for lithium storage. While not wishing to be bound by theory, it is thought that large quantities of pores of similar size may yield graphite-like structures within pores with additional hard carbon-type storage in the bulk structure. Mesopores are typically below 100 nm. These pores are ideal locations for nano particle dopants, such as metals, and provide pathways for both conductive additive and electrolyte for ion and electron conduction. In some embodiments the carbon materials comprise macropores greater than 100 nm that may be especially suited for large particle doping.

Pore size distribution of the composite material exhibiting extremely durable intercalation of lithium may be important to both the storage capacity of the material and the kinetics and power capability of the system as well as the ability to incorporate large amounts of electrochemical modifiers. The pore size distribution can range from micro to meso to macro and may be either monomodal, bimodal or multimodal. In some embodiments the composite materials comprise micropores less than 100 nm which may be especially suited for lithium diffusion.

Accordingly, in one embodiment, the composite material comprises a fractional pore volume of pores at or below 1 nm that comprises at least 50% of the total pore volume, at least 75% of the total pore volume, at least 90% of the total pore volume or at least 99% of the total pore volume. In other embodiments, the composite material comprises a fractional pore volume of pores at or below 10 nm that comprises at least 50% of the total pore volume, at least 75% of the total pore volume, at least 90% of the total pore volume or at least 99% of the total pore volume. In other embodiments, the composite material comprises a fractional pore volume of pores at or below 50 nm that comprises at least 50% of the total pore volume, at least 75% of the total pore volume, at least 90% of the total pore volume or at least 99% of the total pore volume.

In another embodiment, the composite material comprises a fractional pore surface area of pores at or below 100 nm that comprises at least 50% of the total pore surface area, at least 75% of the total pore surface area, at least 90% of the total pore surface area or at least 99% of the total pore surface area. In another embodiment, the composite material comprises a fractional pore surface area of pores at or greater than 100 nm that comprises at least 50% of the total pore surface area, at least 75% of the total pore surface area, at least 90% of the total pore surface area or at least 99% of the total pore surface area.

In another embodiment, the composite material comprises pores predominantly in the range of 100 nm or lower, for example 10 nm or lower, for example 5 nm or lower. Alternatively, the composite material comprises micropores in the range of 0-2 nm and mesopores in the range of 2-100 nm. The ratio of pore volume or pore surface in the micropore range compared to the mesopore range can be in the range of 95:5 to 5:95.

The present inventors have found that the extent of disorder in the composite materials with and without electrochemical modifier may have an impact on the electrochemical properties of the carbon materials. Thus, controlling the extent of disorder in the composite materials provides a possible avenue to improve the rate capability for carbons since a smaller crystallite size may allow for lower resistive lithium ion diffusion through the amorphous structure. The present invention includes embodiments which comprise both high and low levels of disorder.

Disorder, as recorded by RAMAN spectroscopy, is a measure of the size of the crystallites found within both amorphous and crystalline structures (M. A. Pimenta, G. Dresselhaus, M. S. Dresselhaus, L. G. Can ado, A. Jorio, and R. Saito, "Studying disorder in graphite-based systems by Raman spectroscopy," Physical Chemistry Chemical Physics, vol. 9, no. 11, p. 1276, 2007). For carbon structures, crystallite sizes (La) can be calculated from the relative peak intensities of the D and G Raman shifts (Eq 1)

$$L_a(nm)=(2.4\times10^{-10})\lambda^4 \text{laser } R^{-1} \quad (1)$$

where $$R=I_D/I_G \quad (2)$$

The values for R and $L_a$ can vary in certain embodiments, and their value may affect the electrochemical properties of the carbon materials, for example the capacity of the $2^{nd}$ lithium insertion ($2^{nd}$ lithium insertion is related to first cycle efficiency since first cycle efficiency=(capacity at $1^{st}$ lithium insertion/capacity at $2^{nd}$ lithium insertion)×100). For example, in some embodiments R ranges from about 0 to about 1 or from about 0.50 to about 0.95. In other embodiments, R ranges from about 0.60 to about 0.90. In other embodiments, R ranges from about 0.80 to about 0.90. $L_a$ also varies in certain embodiments and can range from about 1 nm to about 500 nm. In certain other embodiments, $L_a$ ranges from about 5 nm to about 100 nm or from about 10 to about 50 nm. In other embodiments, $L_a$ ranges from about 15 nm to about 30 nm, for example from about 20 to about 30 nm or from about 25 to 30 nm.

In a related embodiment, the electrochemical properties of materials comprising the composite are related to the level of crystallinity as measured by X-ray diffraction (XRD). While Raman measures the size of the crystallites, XRD records the level of periodicity in the bulk structure through the scattering of incident X-rays. The present invention includes materials that are non-graphitic (crystallinity <10%) and semi-graphitic (crystallinity between 10 and 50%). The crystallinity of materials ranges from about 0% to about 99%. In some embodiments, the materials comprising the composite comprise less than 10% crystallinity, less than 5% crystallinity or even less than 1% crystallinity (i.e., highly amorphous). In other embodiments, the materials comprising the composite comprise from 10% to 50% crystallinity. In still other embodiments, the materials comprising the composite comprise less than 50% crystallinity, less than 40% crystallinity, less than 30% crystallinity or even less than 20% crystallinity.

In a related embodiment, the electrochemical properties of the materials comprising the composite are related to the level of crystallinity as measured by X-ray diffraction (XRD). The present invention includes materials that are non-crystalline (crystallinity <10%) and semi-crystalline (crystallinity between 10 and 50%) and crystalline (>50%). The crystallinity of the materials comprising the composite ranges from about 0% to about 99%. In some embodiments, the materials comprising the composite comprise less than 10% crystallinity, less than 5% crystallinity or even less than 1% crystallinity (i.e., highly amorphous). In other embodiments, the materials comprising the composite comprise from 10% to 50% crystallinity. In still other embodiments, the materials comprising the composite comprise less than 50% crystallinity, less than 40% crystallinity, less than 30% crystallinity or even less than 20% crystallinity.

In a related embodiment, the electrochemical performance of the composite is related to the empirical values, R, as calculated from Small Angle X-ray Diffraction (SAXS), wherein R=B/A and B is the height of the double layer peak and A is the baseline for the single graphene sheet as measured by SAXS.

SAXS has the ability to measure internal pores, perhaps inaccessible by gas adsorption techniques but capable of lithium storage. In certain embodiments, the R factor is below 1, comprising single layers of graphene. In other embodiments, the R factor ranges from about 0.1 to about 20 or from about 1 to 10 . . . . In yet other embodiments, the R factor ranges from 1 to 5, from 1 to 2, or from 1.5 to 2. In still other embodiments, the R factor ranges from 1.5 to 5, from 1.75 to 3, or from 2 to 2.5. Alternatively, the R factor is greater than 10. The SAXS pattern may also be analyzed by the number of peaks found between 10° and 40°. In some embodiments, the number of peaks found by SAXS at low scattering angles are 1, 2, 3, or even more than 3.

In certain embodiments, the organic content of materials comprising the composite can be manipulated to provide the desired properties, for example by contacting the materials with a hydrocarbon compound such as cyclohexane and the like. Infra-red spectroscopy (FTIR) can be used as a metric to determine the organic content of both surface and bulk structures of the materials. In one embodiment, the materials comprising the composite comprise essentially no organic material. An FTIR spectra which is essentially featureless is indicative of such embodiments. In other embodiments, the carbon materials without electrochemical modifier comprise organic material, either on the surface or within the bulk structure. In such embodiments, the FTIR spectra generally depict large hills and valleys which indicates the presence of organic content.

The organic content may have a direct relationship to the electrochemical performance and response of the material when placed into a lithium bearing device for energy storage. Materials comprising the composite with flat FTIR signals (no organics) often display a low extraction peak in the voltage profile at 0.2 V. Well known to the art, the extract voltage is typical of lithium stripping. In certain embodiments, the materials comprising the composite comprise organic content and the lithium stripping plateau is absent or near absent.

The composite material may also comprise varying amounts of carbon, oxygen, hydrogen and nitrogen as measured by gas chromatography CHNO analysis. In one embodiment, the carbon content of the composite is greater than 98 wt. % or even greater than 99.9 wt % as measured by CHNO analysis. In another embodiment, the carbon content of the composite ranges from about 10 wt % to about 99.9%, for example from about 50 to about 98 wt. % of the total mass. In yet other embodiments, the carbon content of the composite ranges 90 to 98 wt. %, 92 to 98 wt % or greater than 95% of the total mass. In yet other embodiments, the carbon content of the composite ranges from 80 to 90 wt. % of the total mass. In yet other embodiments, the carbon content of the composite ranges from 70 to 80 wt. % of the total mass. In yet other embodiments, the carbon content ranges of the composite from 60 to 70 wt. % of the total mass. In yet other embodiments, the carbon content ranges of the composite from 50 to 60 wt. % of the total mass. In yet other embodiments, the carbon content ranges of the composite from 40 to 50 wt. % of the total mass. In yet other embodiments, the carbon content ranges of the composite from 30 to 40 wt. % of the total mass. In yet other embodiments, the carbon content ranges of the composite from 20 to 30 wt. % of the total mass. In yet other embodiments, the carbon content ranges of the composite from 10 to 20 wt. % of the total mass. In yet other embodiments, the carbon content ranges of the composite from 1 to 10 wt. % of the total mass.

In another embodiment, the nitrogen content ranges from 0 to 90 wt. % based on total mass of all components in the composite material as measured by CHNO analysis. In another embodiment, the nitrogen content ranges from 1 to 10 wt. % of the total mass. In yet other embodiments, the nitrogen content ranges from 10 to 20 wt. % of the total mass. In yet other embodiments, the nitrogen content ranges from 20 to 30 wt. % of the total mass. In another embodiment, the nitrogen content is greater than 30 wt. %. In some more specific embodiments, the nitrogen content ranges from about 1% to about 6%, while in other embodiments, the nitrogen content ranges from about 0.1% to about 1%. In certain of the above embodiments, the nitrogen content is based on weight relative to total weight of all components in the composite material The carbon and nitrogen content may also be measured as a ratio of C:N (carbon atoms to nitrogen atoms). In one embodiment, the C:N ratio ranges from 1:0.001 to 0.001:1 or from 1:0.001 to 1:1. In another embodiment, the C:N ratio ranges from 1:0.001 to 1:0.01. In yet another embodiment, the C:N ratio ranges from 1:0.01 to 1:1. In yet another embodiment, the content of nitrogen exceeds the content of carbon, for example the C:N ratio can range from about 0.01:1 to about 0.1:1 or from 0.1:1 to about 0.5:1.

The composite material comprising a silicon material may also comprise varying amounts of carbon, oxygen, nitrogen, Cl, and Na, to name a few, as measured by XPS analysis. In one embodiment, the carbon content is greater than 98 wt. % as measured by XPS analysis. In another embodiment, the carbon content ranges from 50 to 98 wt. % of the total mass. In yet other embodiments, the carbon content ranges 90 to 98 wt. % of the total mass. In yet other embodiments, the carbon content ranges from 80 to 90 wt. % of the total mass. In yet other embodiments, the carbon content ranges from 70 to 80 wt. % of the total mass. In yet other embodiments, the carbon content ranges from 60 to 70 wt. % of the total mass.

In other embodiments, the carbon content ranges from 10% to 99.9%, from 10% to 99%, from 10% to 98%, from 50% to 99.9%, from 50% to 99%, from 50% to 98%, from 75% to 99.9%, from 75% to 99% or from 75% to 98% of the total mass of all components in the carbon material as measured by XPS analysis In another embodiment, the nitrogen content ranges from 0 to 90 wt. % as measured by XPS analysis. In another embodiment, the nitrogen content ranges from 1 to 75 wt. % of the total mass. In another embodiment, the nitrogen content ranges from 1 to 50 wt. % of the total mass. In another embodiment, the nitrogen content ranges from 1 to 25 wt. % of the total mass. In another embodiment, the nitrogen content ranges from 1 to 20 wt. % of the total mass. In another embodiment, the nitrogen content ranges from 1 to 10 wt. % of the total mass. In another embodiment, the nitrogen content ranges from 1 to 6 wt. % of the total mass. In yet other embodiments, the nitrogen content ranges from 10 to 20 wt. % of the total mass. In yet other embodiments, the nitrogen content ranges from 20 to 30 wt. % of the total mass. In another embodiment, the nitrogen content is greater than 30 wt. %.

The carbon and nitrogen content may also be measured as a ratio of C:N by XPS. In one embodiment, the C:N ratio of the composite ranges from 0.001:1 to 1:0.001. In one embodiment, the C:N ratio ranges from 0.01:1 to 1:0.01. In one embodiment, the C:N ratio ranges from 0.1:1 to 1:0.01. In one embodiment, the C:N ratio ranges from 1:0.5 to 1:0.001. In one embodiment, the C:N ratio ranges from 1:0.5 to 1:0.01. In one embodiment, the C:N ratio ranges from 1:0.5 to 1:0.1. In one embodiment, the C:N ratio ranges from 1:0.2 to 1:0.01. In one embodiment, the C:N ratio ranges from 1:0.001 to 1:1. In another embodiment, the C:N ratio ranges from 1:0.001 to 0.01. In yet another embodiment, the C:N ratio ranges from 1:0.01 to 1:1. In yet another embodiment, the content of nitrogen exceeds the content of carbon.

The carbon and phosphorus content of the composite may also be measured as a ratio of C:P by XPS. In one embodiment, the C:P ratio of the composite ranges from 0.001:1 to 1:0.001. In one embodiment, the C:P ratio ranges from 0.01:1 to 1:0.01. In one embodiment, the C:P ratio ranges from 0.1:1 to 1:0.01. In one embodiment, the C:P ratio ranges from 1:0.5 to 1:0.001. In one embodiment, the C:P ratio ranges from 1:0.5 to 1:0.01. In one embodiment, the C:P ratio ranges from 1:0.5 to 1:0.1. In one embodiment, the C:P ratio ranges from 1:0.2 to 1:0.01. In one embodiment, the C:P ratio ranges from 1:0.001 to 1:1. In another embodiment, the C:P ratio ranges from 1:0.001 to 0.01. In yet another embodiment, the C:P ratio ranges from 1:0.01 to 1:1. In yet another embodiment, the content of nitrogen exceeds the content of carbon.

XPS may also be used to detect individual bonds between elements. In the case of a composite, the interface between the carbon and the silicon may include an C—X bond, wherein X is the primary element that alloys with lithium (such as C—Si bond for a silicon electrochemical modifier). The presence of C—X may affect the performance of the material. This percent of C—X bonds within a composite can be characterized using XPS. In one embodiment the percent of C—X bonds as measured by XPS is between 0% and 50%. In another embodiment the percent of C—X bonds is between 0% and 10%, 0% and 5%, 0% and 3%, 0% and 2%, 0% and 1%, 1% and 2%, between 10% and 50%, or greater than 50%. In yet another embodiment, the C—X bond also produces a material in-situ that is also capable of alloying electrochemically with silicon.

The carbon material comprising the composite material can include both sp3 and sp2 hybridized carbons. The percentage of sp2 hybridization can be measured by XPS using the Auger spectrum, as known in the art. It is assumed that for materials which are less than 100% sp2, the remainder of the bonds are sp3. The carbon materials range from about 1% sp2 hybridization to 100% sp2 hybridization. Other embodiments include carbon materials comprising from about 25% to about 95% sp2, from about 50%-95% sp2, from about 50% to about 75% sp2, from about 65% to about 95% sp2 or about 65% sp2.

In certain embodiments, XPS can be examined to determine the specific nature of specific bonding structures within the silicon comprising the composite. For example, XPS can be examined in the region in the vicinity of 100 eV to ascertain details of Si 2p bonding in the silicon structure. In certain embodiments, the silicon material comprises elemental silicon exhibiting an XPS peak located at 99.4 eV. In certain embodiments, the silicon material comprises Si3N4 exhibiting an XPS peak located at 101.7 eV. In certain embodiments, the silicon comprises organic silicon exhibiting an XPS peak located at 102 eV. In certain embodiments, the silicon comprises organic silicon exhibiting an XPS peak located at 103.5 eV.

The composite material may also incorporate an electrochemical modifier selected to optimize the electrochemical performance of the non-modified composite. The electrochemical modifier may be incorporated within the pore structure and/or on the surface of the porous carbon scaffold, within the embedded silicon, or within the final layer of carbon, or conductive polymer, coating, or incorporated in any number of other ways. For example, in some embodiments, the composite materials comprise a coating of the electrochemical modifier (e.g., silicon or $Al_2O_3$) on the surface of the carbon materials. In some embodiments, the composite materials comprise greater than about 100 ppm of an electrochemical modifier. In certain embodiments, the electrochemical modifier is selected from iron, tin, silicon, nickel, aluminum and manganese.

In certain embodiments the electrochemical modifier comprises an element with the ability to lithiate from 3 to 0 V versus lithium metal (e.g. silicon, tin, sulfur). In other embodiments, the electrochemical modifier comprises metal oxides with the ability to lithiate from 3 to 0 V versus lithium metal (e.g. iron oxide, molybdenum oxide, titanium oxide). In still other embodiments, the electrochemical modifier comprises elements which do not lithiate from 3 to 0 V versus lithium metal (e.g. aluminum, manganese, nickel, metal-phosphates). In yet other embodiments, the electrochemical modifier comprises a non-metal element (e.g. fluorine, nitrogen, hydrogen). In still other embodiments, the electrochemical modifier comprises any of the foregoing electrochemical modifiers or any combination thereof (e.g. tin-silicon, nickel-titanium oxide).

The electrochemical modifier may be provided in any number of forms. For example, in some embodiments the electrochemical modifier comprises a salt. In other embodiments, the electrochemical modifier comprises one or more elements in elemental form, for example elemental iron, tin, silicon, nickel or manganese. In other embodiments, the electrochemical modifier comprises one or more elements in oxidized form, for example iron oxides, tin oxides, silicon oxides, nickel oxides, aluminum oxides or manganese oxides.

In other embodiments, the electrochemical modifier comprises iron. In other embodiments, the electrochemical modifier comprises tin. In other embodiments, the electrochemical modifier comprises silicon. In some other embodiments, the electrochemical modifier comprises nickel. In yet other embodiments, the electrochemical modifier comprises aluminum. In yet other embodiments, the electrochemical modifier comprises manganese. In yet other embodiments, the electrochemical modifier comprises $Al_2O_3$. In yet other embodiments, the electrochemical modifier comprises titanium. In yet other embodiments, the electrochemical modifier comprises titanium oxide. In yet other embodiments, the electrochemical modifier comprises lithium. In yet other embodiments, the electrochemical modifier comprises sulfur. In yet other embodiments, the electrochemical modifier comprises phosphorous. In yet other embodiments, the electrochemical modifier comprises molybdenum. In yet other embodiments, the electrochemical modifier comprises germanium. In yet other embodiments, the electrochemical modifier comprises arsenic. In yet other embodiments, the electrochemical modifier comprises gallium. In yet other embodiments, the electrochemical modifier comprises phosphorous. In yet other embodiments, the electrochemical modifier comprises selenium. In yet other embodiments, the electrochemical modifier comprises antimony. In yet other embodiments, the electrochemical modifier comprises bismuth. In yet other embodiments, the electrochemical modifier comprises tellurium. In yet other embodiments, the electrochemical modifier comprises indium.

Accordingly, in some embodiments the composite material comprises more than one carbon allotrope, including hard carbon and a second allotrope, selected from species including, but not limited to, graphite, amorphous carbon (soft and hard), diamond, C60, carbon nanotubes (e.g., single and/or multi-walled), graphene and carbon fibers. In some embodiments, the second carbon form is graphite. In other embodiments, the second form is soft carbon. The ratio of carbon material (e.g., hard carbon) to second carbon allotrope can be tailored to fit any desired electrochemical application.

In certain embodiments, the mass ratio of hard carbon to second carbon allotrope in the composite materials ranges from about 0.01:1 to about 100:1. In other embodiments, the mass ratio of hard carbon to second carbon allotrope ranges from about 1:1 to about 10:1 or about 5:1. In other embodiments, the mass ratio of hard carbon to second carbon allotrope ranges from about 1:10 to about 10:1. In other embodiments, the mass ratio of hard carbon to second carbon allotrope ranges from about 1:5 to about 5:1. In other embodiments, the mass ratio of hard carbon to second carbon allotrope ranges from about 1:3 to about 3:1. In other embodiments, the mass ratio of hard carbon to second carbon allotrope ranges from about 1:2 to about 2:1.

Multiple carbon allotropes can be combined within a single composite to further improve electrochemical performance. For example, a hard carbon can be blended with both graphite and soft carbon to change the density as well as the capacity or first cycle efficiency. The three or more carbon allotropes will have a synergistic effect, creating a unique structure and performance. In certain embodiments, the mass ratio of hard carbon to the sum of the masses for all other carbon allotropes present in the composite material ranges from about 0.01:1 to about 100:1. In other embodiments, the mass ratio of hard carbon to the sum of the masses for all other carbon allotropes in the composite material ranges from about 1:1 to about 10:1 or about 5:1. In other embodiments the mass ratio of hard carbon to the sum of the masses for all other carbon allotropes in the composite material ranges from about 1:10 to about 10:1. In other embodiments, the mass ratio of hard carbon to the sum of the masses for all other carbon allotropes in the composite material ranges from about 1:5 to about 5:1. In other embodiments, the mass ratio of hard carbon to the sum of the masses for all other carbon allotropes in the composite material ranges from about 1:3 to about 3:1. In other embodiments, the mass ratio of hard carbon to the sum of the masses for all other carbon allotropes in the composite material ranges from about 1:2 to about 2:1.

The electrochemical properties of the composite material can be modified, at least in part, by the amount of the electrochemical modifier in the material, wherein the electrochemical modifier is an alloying material such as silicon, tin, indium, aluminum, germanium, gallium. Accordingly, in some embodiments, the composite material comprises at least 0.10%, at least 0.25%, at least 0.50%, at least 1.0%, at least 5.0%, at least 10%, at least 25%, at least 50%, at least 75%, at least 90%, at least 95%, at least 99% or at least 99.5% of the electrochemical modifier. For example, in some embodiments, the composite materials comprise between 0.5% and 99.5% carbon and between 0.5% and 99.5% electrochemical modifier. In a embodiment, the composite material comprises 70%-99% silicon, for example between 75% and 95%, for example between 80% and 95%. The percent of the electrochemical modifier is calculated on weight percent basis (wt %). In some other more specific embodiments, the electrochemical modifier comprises iron, tin, silicon, nickel and manganese. In a embodiment, the composite material comprises 70%-99% silicon, for example between 75% and 95%, for example between 80% and 95%.

The unmodified carbon materials have purities not previously obtained with hard carbon materials. While not wishing to be bound by theory, it is believed that the high purity of the unmodified carbon materials contributes to the superior electrochemical properties of the same. In some embodiments, the unmodified carbon material comprises low total TXRF impurities (excluding any intentionally included electrochemical modifier). Thus, in some embodiments the total TXRF impurity content (excluding any intentionally included electrochemical modifier) of all other TXRF elements in the carbon material (as measured by proton induced x-ray emission) is less than 1000 ppm. In other embodiments, the total TXRF impurity content (excluding any intentionally included electrochemical modifier) of all other TXRF elements in the carbon material is less than 800 ppm, less than 500 ppm, less than 300 ppm, less than 200 ppm, less than 150 ppm, less than 100 ppm, less than 50 ppm, less than 25 ppm, less than 10 ppm, less than 5 ppm or less than 1 ppm.

In addition to low content of undesired TXRF impurities, the disclosed unmodified carbon materials may comprise high total carbon content. In some examples, in addition to carbon, the carbon material may also comprise oxygen, hydrogen, nitrogen and an optional electrochemical modifier. In some embodiments, the material comprises at least 75% carbon, 80% carbon, 85% carbon, at least 90% carbon, at least 95% carbon, at least 96% carbon, at least 97% carbon, at least 98% carbon or at least 99% carbon on a weight/weight basis. In some other embodiments, the carbon material comprises less than 10% oxygen, less than 5% oxygen, less than 3.0% oxygen, less than 2.5% oxygen, less than 1% oxygen or less than 0.5% oxygen on a weight/weight basis. In other embodiments, the carbon material comprises less than 10% hydrogen, less than 5% hydrogen, less than 2.5% hydrogen, less than 1% hydrogen, less than 0.5% hydrogen or less than 0.1% hydrogen on a weight/weight basis. In other embodiments, the carbon material comprises less than 5% nitrogen, less than 2.5% nitrogen, less than 1% nitrogen, less than 0.5% nitrogen, less than 0.25% nitrogen or less than 0.01% nitrogen on a weight/weight basis. The oxygen, hydrogen and nitrogen content of the disclosed carbon materials can be determined by combustion analysis. Techniques for determining elemental composition by combustion analysis are well known in the art.

The total ash content of an unmodified carbon material may, in some instances, have an effect on the electrochemical performance of a carbon material. Accordingly, in some embodiments, the ash content (excluding any intentionally included electrochemical modifier) of the carbon material ranges from 0.1% to 0.001% weight percent ash, for example in some specific embodiments the ash content (excluding any intentionally included electrochemical modifier) of the carbon material is less than 0.1%, less than 0.08%, less than 0.05%, less than 0.03%, than 0.025%, less than 0.01%, less than 0.0075%, less than 0.005% or less than 0.001%.

In other embodiments, the composite material comprising a porous silicon material comprises a total TXRF impurity content of all other elements (excluding any intentionally included electrochemical modifier) of less than 500 ppm and an ash content (excluding any intentionally included electrochemical modifier) of less than 0.08%. In further embodiments, the composite material comprises a total TXRF impurity content of all other elements (excluding any intentionally included electrochemical modifier) of less than 300 ppm and an ash content (excluding any intentionally included electrochemical modifier) of less than 0.05%. In other further embodiments, the composite material comprises a total TXRF impurity content of all other elements (excluding any intentionally included electrochemical modifier) of less than 200 ppm and an ash content (excluding any intentionally included electrochemical modifier) of less than 0.05%. In other further embodiments, the composite material comprises a total TXRF impurity content of all other elements (excluding any intentionally included electrochemical modifier) of less than 200 ppm and an ash content (excluding any intentionally included electrochemical modifier) of less than 0.025%. In other further embodiments, the composite material comprises a total TXRF impurity content of all other elements (excluding any intentionally included electrochemical modifier) of less than 100 ppm and an ash content (excluding any intentionally included electrochemical modifier) of less than 0.02%. In other further embodiments, the composite material comprises a total TXRF impurity content of all other elements (excluding any intentionally included electrochemical modifier) of less than 50 ppm and an ash content (excluding any intentionally included electrochemical modifier) of less than 0.01%.

In other embodiments, the composite material comprising a porous silicon material comprises a total TXRF impurity content of all other elements (excluding any intentionally included electrochemical modifier) of greater than 500 ppm and an ash content (excluding any intentionally included electrochemical modifier) of greater than 0.08%. In further embodiments, the composite material comprises a total TXRF impurity content of all other elements (excluding any intentionally included electrochemical modifier) of greater than 5000 ppm and an ash content (excluding any intentionally included electrochemical modifier) of greater than 0.5%. In other further embodiments, the composite material comprises a total TXRF impurity content of all other elements (excluding any intentionally included electrochemical modifier) of greater than 1% and an ash content (excluding any intentionally included electrochemical modifier) of greater than 0.5%. In other further embodiments, the composite material comprises a total TXRF impurity content of all other elements (excluding any intentionally included electrochemical modifier) of greater than 2% and an ash content (excluding any intentionally included electrochemical modifier) of greater than 1%. In other further embodiments, the composite material comprises a total TXRF impurity content of all other elements (excluding any intentionally included electrochemical modifier) of greater than 3% and an ash content (excluding any intentionally included electrochemical modifier) of greater than 2%. In other further embodiments, the composite material comprises a total TXRF impurity content of all other elements (excluding any intentionally included electrochemical modifier) of greater than 4% and an ash content (excluding any intentionally included electrochemical modifier) of greater than 3%. In other further embodiments, the composite material comprises a total TXRF impurity content of all other elements (excluding any intentionally included electrochemical modifier) of greater than 5% and an ash content (excluding any intentionally included electrochemical modifier) of greater than 4%. In other further embodiments, the composite material comprises a total TXRF impurity content of all other elements (excluding any intentionally included electrochemical modifier) of greater than 6% and an ash content (excluding any intentionally included electrochemical modifier) of greater than 5%. In other further embodiments, the composite material comprises a total TXRF impurity content of all other elements (excluding any intentionally included electrochemical modifier) of greater than 7% and an ash content (excluding any intentionally included electrochemical modifier) of greater than 6%. In other further embodiments, the composite material comprises a total TXRF impurity content of all other elements (excluding any intentionally included electrochemical modifier) of greater than 8% and an ash content (excluding any intentionally included electrochemical modifier) of greater than 7%. In other further embodiments, the composite material comprises a total TXRF impurity content of all other elements (excluding any intentionally included electrochemical modifier) of greater than 9% and an ash content (excluding any intentionally included electrochemical modifier) of greater than 8%. In other further embodiments, the composite material comprises a total TXRF impurity content of all other elements (excluding any intentionally included electrochemical modifier) of greater than 10% and an ash content (excluding any intentionally included electrochemical modifier) of greater than 9%.

The amount of individual TXRF impurities present in the disclosed composite material comprising a porous silicon material can be determined by proton induced x-ray emission. Individual TXRF impurities may contribute in different ways to the overall electrochemical performance of the disclosed composite materials. Thus, in some embodiments, the level of sodium present in the composite material is less than 1000 ppm, less than 500 ppm, less than 100 ppm, less than 50 ppm, less than 10 ppm, or less than 1 ppm. In some embodiments, the level of magnesium present in the composite material is less than 1000 ppm, less than 100 ppm, less than 50 ppm, less than 10 ppm, or less than 1 ppm. In some embodiments, the level of aluminum present in the composite material is less than 1000 ppm, less than 100 ppm, less than 50 ppm, less than 10 ppm, or less than 1 ppm. In some embodiments, the level of silicon present in the composite material is less than 500 ppm, less than 300 ppm, less than 100 ppm, less than 50 ppm, less than 20 ppm, less than 10 ppm or less than 1 ppm. In some embodiments, the level of phosphorous present in the composite material is less than 1000 ppm, less than 100 ppm, less than 50 ppm, less than 10 ppm, or less than 1 ppm. In some embodiments, the level of sulfur present in the composite material is less than 1000 ppm, less than 100 ppm, less than 50 ppm, less than 30 ppm, less than 10 ppm, less than 5 ppm or less than 1 ppm. In some embodiments, the level of chlorine present in the composite material is less than 1000 ppm, less than 100 ppm, less than 50 ppm, less than 10 ppm, or less than 1 ppm. In some embodiments, the level of potassium present in the composite material is less than 1000 ppm, less than 100 ppm, less than 50 ppm, less than 10 ppm, or less than 1 ppm. In other embodiments, the level of calcium present in the composite material is less than 100 ppm, less than 50 ppm, less than 20 ppm, less than 10 ppm, less than 5 ppm or less than 1 ppm. In some embodiments, the level of chromium present in the composite material is less than 1000 ppm, less than 100 ppm, less than 50 ppm, less than 10 ppm, less than 5 ppm, less than 4 ppm, less than 3 ppm, less than 2 ppm or less than 1 ppm. In other embodiments, the level of iron present in the composite material is less than 50 ppm, less than 20 ppm, less than 10 ppm, less than 5 ppm, less than 4 ppm, less than 3 ppm, less than 2 ppm or less than 1 ppm. In other embodiments, the level of nickel present in the composite material is less than 20 ppm, less than 10 ppm, less than 5 ppm, less than 4 ppm, less than 3 ppm, less than 2 ppm or less than 1 ppm. In some other embodiments, the level of copper present in the composite material is less than 140 ppm, less than 100 ppm, less than 40 ppm, less than 20 ppm, less than 10 ppm, less than 5 ppm, less than 4 ppm, less than 3 ppm, less than 2 ppm or less than 1 ppm. In yet other embodiments, the level of zinc present in the composite material is less than 20 ppm, less than 10 ppm, less than 5 ppm, less than 2 ppm or less than 1 ppm. In yet other embodiments, the sum of all other TXRF impurities (excluding any intentionally included electrochemical modifier) present in the composite material is less than 1000 ppm, less than 500 μm, less than 300 ppm, less than 200 ppm, less than 100 ppm, less than 50 ppm, less than 25 ppm, less than 10 ppm or less than 1 ppm. As noted above, in some embodiments other impurities such as hydrogen, oxygen and/or nitrogen may be present in levels ranging from less than 10% to less than 0.01%.

In some embodiments, the unmodified composite material comprising a porous silicon material comprises undesired TXRF impurities near or below the detection limit of the proton induced x-ray emission analysis. For example, in some embodiments the unmodified composite material comprises less than 50 ppm sodium, less than 15 ppm magnesium, less than 10 ppm aluminum, less than 8 ppm silicon, less than 4 ppm phosphorous, less than 3 ppm sulfur, less than 3 ppm chlorine, less than 2 ppm potassium, less than 3 ppm calcium, less than 2 ppm scandium, less than 1 ppm titanium, less than 1 ppm vanadium, less than 0.5 ppm chromium, less than 0.5 ppm manganese, less than 0.5 ppm iron, less than 0.25 ppm cobalt, less than 0.25 ppm nickel, less than 0.25 ppm copper, less than 0.5 ppm zinc, less than 0.5 ppm gallium, less than 0.5 ppm germanium, less than 0.5 ppm arsenic, less than 0.5 ppm selenium, less than 1 ppm bromine, less than 1 ppm rubidium, less than 1.5 ppm strontium, less than 2 ppm yttrium, less than 3 ppm zirconium, less than 2 ppm niobium, less than 4 ppm molybdenum, less than 4 ppm, technetium, less than 7 ppm rubidium, less than 6 ppm rhodium, less than 6 ppm palladium, less than 9 ppm silver, less than 6 ppm cadmium, less than 6 ppm indium, less than 5 ppm tin, less than 6 ppm antimony, less than 6 ppm tellurium, less than 5 ppm iodine, less than 4 ppm cesium, less than 4 ppm barium, less than 3 ppm lanthanum, less than 3 ppm cerium, less than 2 ppm praseodymium, less than 2 ppm, neodymium, less than 1.5 ppm promethium, less than 1 ppm samarium, less than 1 ppm europium, less than 1 ppm gadolinium, less than 1 ppm terbium, less than 1 ppm dysprosium, less than 1 ppm holmium, less than 1 ppm erbium, less than 1 ppm thulium, less than 1 ppm ytterbium, less than 1 ppm lutetium, less than 1 ppm hafnium, less than 1 ppm tantalum, less than 1 ppm tungsten, less than 1.5 ppm rhenium, less than 1 ppm osmium, less than 1 ppm iridium, less than 1 ppm platinum, less than 1 ppm silver, less than 1 ppm mercury, less than 1 ppm thallium, less than 1 ppm lead, less than 1.5 ppm bismuth, less than 2 ppm thorium, or less than 4 ppm uranium.

In some embodiments, the unmodified composite material comprising a porous silicon material comprises undesired TXRF impurities near or below the detection limit of the proton induced x-ray emission analysis. In some specific embodiments, the unmodified composite material comprises less than 100 ppm sodium, less than 300 ppm silicon, less than 50 ppm sulfur, less than 100 ppm calcium, less than 20 ppm iron, less than 10 ppm nickel, less than 140 ppm copper, less than 5 ppm chromium and less than 5 ppm zinc as measured by TXRF. In other specific embodiments, the composite material comprises less than 50 ppm sodium, less than 30 ppm sulfur, less than 100 ppm silicon, less than 50 ppm calcium, less than 10 ppm iron, less than 5 ppm nickel, less than 20 ppm copper, less than 2 ppm chromium and less than 2 ppm zinc.

In other specific embodiments, the unmodified composite material comprising a porous silicon material comprises less than 50 ppm sodium, less than 50 ppm silicon, less than 30 ppm sulfur, less than 10 ppm calcium, less than 2 ppm iron, less than 1 ppm nickel, less than 1 ppm copper, less than 1 ppm chromium and less than 1 ppm zinc.

In some other specific embodiments, the unmodified composite material comprising a porous silicon material comprises less than 100 ppm sodium, less than 50 ppm magnesium, less than 50 ppm aluminum, less than 10 ppm sulfur, less than 10 ppm chlorine, less than 10 ppm potassium, less than 1 ppm chromium and less than 1 ppm manganese.

In certain embodiments, the composite material comprising a porous silicon material comprises carbon and two or more different electrochemical modifiers. In embodiments, the composite material comprises silicon and one or more of the following species (or combinations thereof): phosphorus, nitrogen, sulfur, boron or aluminum. In certain embodiments, the composite material comprises carbon, silicon and 1-20% of a Group 13 element or combination thereof. In other certain embodiments, the composite material comprises carbon, silicon and 1-20% of a Group 15 element, or combination thereof. In other certain embodiments, the composite material comprises carbon, silicon and 1-20% of lithium, sodium, or potassium, or combinations thereof. In other certain embodiments, the composite material comprises carbon, silicon and 1-20% of lithium, sodium, or potassium, or combinations thereof.

The particle size of the composite material may expand upon lithiation as compared to the non-lithiated state. For example, the expansion factor, defined as ratio of the average particle size of particles of composite material comprising a porous silicon material upon lithiation divided by the average particle size under non-lithiated conditions. As described in the art, this expansion factor can be relative large for previously known, non-optimal silicon-containing materials, for example about 4 (corresponding to a 400% volume expansion upon lithiation). The current inventors have discovered composite materials comprising a porous silicon material that can exhibit a lower extent of expansion, for example, the expansion factor can vary from 3.5 to 4, from 3.0 to 3.5, from 2.5 to 3.0, from 2.0 to 2.5, from 1.5 to 2.0, from 1.0 to 1.5.

It is envisioned that composite materials in certain embodiments will comprise a fraction of trapped pore volume, namely, void volume non-accessible to nitrogen gas as probed by nitrogen gas sorption measurement. Without being bound by theory, this trapped pore volume is important in that it provides volume into which silicon can expand upon lithiation.

Accordingly, the composite materials comprises herein may comprise a ratio of trapped pore volume to measured pore volume (as determined by nitrogen gas sorption) between 0.01:1 to 100:1. In certain embodiments, the composite materials comprise a ratio of trapped pore volume to measured pore volume between 0.01:1 and 0.05:1. In certain embodiments, the composite materials comprise a ratio of trapped pore volume to measured pore volume between 0.05:1 and 0.1:1. In certain embodiments, the composite materials comprise a ratio of trapped pore volume to measured pore volume between 0.1:1 and 0.2:1. In certain embodiments, the composite materials comprise a ratio of trapped pore volume to measured pore volume between 0.2:1 and 0.5:1. In certain embodiments, the composite materials comprise a ratio of trapped pore volume to measured pore volume between 0.5:1 and 1:1. In certain embodiments, the composite materials comprise a ratio of trapped pore volume to measured pore volume between 1:1 and 2:1. In certain embodiments, the composite materials comprise a ratio of trapped pore volume to measured pore volume between 2:1 and 5:1. In certain embodiments, the composite materials comprise a ratio of trapped pore volume to measured pore volume between 5:1 and 10:1. In certain embodiments, the composite materials comprise a ratio of trapped pore volume to measured pore volume between 10:1 and 20:1. In certain embodiments, the composite materials comprise a ratio of trapped pore volume to measured pore volume between 20:1 and 50:1. In certain embodiments, the composite materials comprise a ratio of trapped pore volume to measured pore volume between 50:1 and 100:1.

In certain embodiments, the ratio of trapped void volume to the silicon volume comprising the composite particle is between 0.1:1 and 10:1. For example, the ratio of trapped void volume to the silicon volume comprising the composite particle is between 1:1 and 5:1, or 5:1 to 10:1. In embodiments, the ratio of ratio trapped void volume to the silicon volume comprising the composite particle is between 2:1 and 5:1, or about 3:1, in order to efficiently accommodate the maximum extent of expansion of silicon upon lithiation.

EXAMPLES

Example 1. Performance Model of Novel Composite Materials

A full cell model was developed to simulate the approximate size and energy of an 18650-type cell. LCO was chosen as the default cathode. The model accounts for material properties (density, packing, volume expansion), electrochemical performance characteristics (operating voltage, capacity, irreversible capacity), and cell level changes (required electrolyte, void volume). Table 1 compares the cell level properties from a commercially available cell and the output from the model. Similar values are calculated using the model, providing confidence in the model's ability to represent system level changes.

TABLE 1

Validation of performance model for a commercial cell.

| Component | Standard Commercial Cell | Model Prediction |
|---|---|---|
| Cell type | Stacked Pouch Cell | Stacked Pouch Cell |
| Anode | Unknown | Graphite |
| Cathode | Unknown | LCO |
| Cell capacity | 3.28 Ah | 3.55 Ah (calculated) |
| Operating Voltage | 3.7 V | 3.7 V (calculated) |
| Cell energy | 199 Wh/kg<br>435 Wh/L | 174 Wh/kg (calculated)<br>437 Wh/L (calculated) |

Next, the values in Table 2 demonstrate cell level performance changes when the anode is modified to include the novel composite materials disclosed herein. At a cell level, there is a considerable increase (~43%) in volumetric energy density, though limited change in Wh/kg in part due to additional SEI losses. Without being bound by theory, prelithiation increase the gravimetric energy density further.

TABLE 2

Performance model applied to novel composite materials.

| Component | Standard Commercial Cell | Novel Composite: 650 mAh/g anode | Novel composite: 1200 mAh/g anode |
|---|---|---|---|
| Anode | Graphite | 30% Si-C + graphite | >70% Si-C + graphite |
| Cathode | LCO | LCO | LCO |
| Cell capacity | 3.55 Ah | 4.20 Ah | 5.08 Ah |
| Operating Voltage | 3.7 V | 3.6 V | 3.6 V |
| Cell energy | 174 Wh/kg<br>437 Wh/L | 189 Wh/kg<br>510 Wh/L | 215 Wh/kg<br>619 Wh/L |

Example 2. Examples of Porous Carbon Scaffold Materials

The variety of various porous carbon scaffold materials were obtained for study. A listing of the physicochemical attributes of the carbon is listed in Table 3.

Carbon 1 was a commercial carbon; in addition to the characteristics reported in Table 1, the Dv100 was 11.62 microns, the Dv10 was 0.6 micron, tap density was 0.27 g/cm3, the pH was 5.3, the ash content was 0.016%, and the sum all impurities detected by PIXE was as follows: silicon=48.680 ppm, calcium=12.910 ppm, iron=22.830 ppm, nickel=3.604 ppm, chromium=5.521.

Carbon 2 was a commercial carbon; in addition to the characteristics reported in Table 1, the Dv100 was 18.662 microns, the Dv10 was 1.2 micron, the span for particle size was 1.194, the uniformity for particle size distribution was 0.367, the tap density was 0.2347 g/cm3, the pH was 6.709, the ash content was 0.005%, and the sum all impurities detected by PIXE was as follows: calcium=20.5 ppm, iron=4.14 ppm, zinc=2.24 ppm, titanium=6.7 ppm.

Carbon 3 was a commercial carbon; in addition to the characteristics reported in Table 1, the Dv100 was 21.2 microns, the Dv10 was 3.8 micron, the span for particle size was 1.261, the uniformity for particle size distribution was 0.387, the tap density was 0.52/cm3, the pH was 9.418, the ash content was 0.075%, and the sum all impurities detected by PIXE was as follows: silicon=29.012 ppm, iron=3.183 ppm, zinc=0.555, potassium=6.952 ppm.

Carbon 4 was produced as follows from a resorcinol formaldehyde resin. First, 388 g of de-ionized water was mixed with 26 mL of glacial acetic acid, and 156 g of resorcinol in a 1L beaker. The solution was mixed on a stir plate until all of the resorcinol is dissolved. The solution is continuously mixed and 2.2 g of ammonium acetate was added and allowed to dissolve. Next, 212 mL of formaldehyde solution (37 wt % formaldehyde in water) was added to the stirring solution. The solution was allowed to stir for 5-10 minutes. The final solution was then poured into 1L polypropylene bottles and placed at 85° C. for 24 hours. The resulting cured and solid resin was then freeze dried to remove all excess water, acid and formaldehyde to create a cryolyogel, which was then pyrolyzed according to methods described herein.

Carbon 5 and Carbon 6 were commercial carbons.

Carbon 7 was a commercial carbon; in addition to the characteristics reported in Table 1, the Dv100 was 35.2 microns, the Dv10 was 2.69 micron, the span for particle size was 1.765, the uniformity for particle size distribution was 0.539, the tap density was 1.015-1.020 g/cm3, and the pH was 3.099.

Carbon 8 was a commercial carbon.

Carbon 9 was produced as follows from a Urea Citric Acid resin. First 400 g of pre-dried urea was mixed with 200 g of pre-dried citric acid. The mixture was then ground together into a very fine powder. The powder mixture was poured into a curing vessel and placed at 140° C. for 24 hours. The resulting cured and solid resin, was then pyrolyzed according to methods described herein.

Carbon 10 was a commercial carbon; in addition to the characteristics reported in Table 1, the Dv100 was 18.6 microns, the Dv10 was 2.48 micron, the span for particle size was 1.348, the uniformity for particle size distribution was 0.406, the tap density was 0.32 g/cm3, and the pH was 7.616.

Carbon 11 was graphite.

Carbon 12 was a commercial carbon. Carbon 13 was commercial carbon 1 that was subsequently heated to 1100 C for 1 hour under 5 mol % H2 gas in argon.

Carbon 14 was a hard carbon produced in a solvent-free process employing a polyol and an organic acid according to the procedures described herein.

Carbon 15 was a hard carbon produced employing an epoxy compound and phosphoric acid according to the procedures described herein.

TABLE 3

| Carbon | SSA (m2/g) | PV (cm3/g) | Dv, 50 (micron) | Pore Distribution % micropores, % mesopores, % macropores |
|---|---|---|---|---|
| 1 | 726 | 0.835 | 3.78 | 28, 70, 2 |
| 2 | 1707 | 1.283 | 7.727 | 46, 54, 0 |
| 3 | 1744 | 0.72 | 7.22 | 94, 4, 1 |
| 4 | 677-749 | 1.097-1.14 | <38 um | 11, 80, 9 |
| 5 | Aggregates of nm sized particles. Therefore, difficult to ascertain due to agglomerates | | | |
| 6 | 1635 | 1.35 | <38 um | 25, 74, 0 |
| 7 | 10.03 | 0.00085 | 8.76 | 0, 0, 100 |
| 8 | 186 | 0.089 | <38 um | 86, 10, 3 |
| 9 | 39 | 0.044 | <38 um | 11, 40, 49 |
| 10 | 1678 | 1.22 | 6.31 | 47, 53, 0 |
| 11 | 1.3 | 0.003 | 14.7 | N/A |
| 12 | 697 | 0.67 | 5.3 | 34, 66, 0 |
| 13 | 679 | 0.544 | 3.8 | 48, 52, 0 |
| 14 | 39 | 0.044 | N/A | 11, 39, 50 |
| 15 | 14 | 0.010 | 11.3 | 41, 30, 29 |

Example 3. Production of Various Composite Materials Via Silicon Deposition on Porous Silicon Scaffold A variety of different composite material were produced according to current disclosure, in this example, the silicon was embedded within a porous carbon scaffold via a chemical vapor deposition technique employing silane gas, as generally described herein. For this specific example, samples were processed in a tube furnace with 2 mol % silane gas flow mixed with nitrogen gas, and held for various times and temperatures as noted. A summary of sample processing is presented in Table 4.

Summary of composite samples produced according to Example 3.

| Composite Sample # | Porous Carbon | Set Temp. (° C.) | Flow rate (sccm) | Pressure (Torr) | Silane dwell time (min) | Total wt % gain | wt % silicon in Si—C |
|---|---|---|---|---|---|---|---|
| 1 | 1 | 550 | ~50 | 760 | 30 | 0.7 | 1% |
| 2 | 2 | 550 | ~50 | 760 | 30 | 6 | 6% |
| 3 | 1 | 550 | 550 | 550 | 60 | 8 | 7% |
| 4 | 2 | 550 | ~100 | 760 | 60 | 29 | 22% |
| 5 | 1 | 550 | ~100 | 760 | 90 | 11 | 10% |
| 6 | 2 | 550 | ~100 | 760 | 90 | 46 | 32% |
| 7 | 5 | 550 | ~100 | 760 | 60 | 33 | 25% |
| 8 | 4 | 550 | ~100 | 760 | 90 | 44 | 31% |
| 9 | 2 | 550 | ~100 | 760 | 90 | 154 | N/A |
| 10 | 4 | 550 | ~100 | 760 | 90 | 279 | N/A |
| 11 | 2 | 500 | ~100 | 760 | 90 | 64 | N/A |
| 12 | 4 | 500 | ~100 | 760 | 90 | 101 | N/A |
| 13 | 4 | 550 | ~200 | 760 | 120 | 190 | N/A |
| 14 | 4 | 550 | ~200 | 760 | 120 | 162 | 62% |
| 15 | 4 | 500 | ~200 | 760 | 120 | 127 | 56% |
| 16 | 1 | 500 | ~200 | 760 | 120 | 33 | 25% |
| 17 | 4 | 550 | ~200 | 760 | 120 | 134 | 57% |
| 18 | 1 | 550 | ~200 | 760 | 120 | 35 | 26% |
| 19 | 4 | 450 | ~200 | 760 | 120 | -3 | 0% |
| 20 | 1 | 450 | ~200 | 760 | 120 | -2 | 0% |
| 21 | 4 | 480 | ~200 | 760 | 120 | 56 | 36% |
| 22 | 1 | 480 | ~200 | 760 | 120 | 11 | 10% |
| 23 | 4 | 500 | ~200 | 760 | 120 | 63 | 38% |
| 24 | 6 | 500 | ~200 | 760 | 120 | 52 | 34% |
| 25 | 7 | 500 | ~200 | 760 | 120 | 2 | 2% |
| 26 | 8 | 500 | ~200 | 760 | 120 | 3 | 3% |
| 27 | 6 | 500 | ~200 | 760 | 120 | 54 | 35% |
| 28 | 8 | 500 | ~200 | 760 | 120 | 8 | 7% |
| 29 | 7 | 500 | ~200 | 760 | 120 | 2 | 2% |
| 30 | 9 | 500 | ~200 | 760 | 120 | 34 | 25% |
| 31 | 3 | 500 | ~200 | 760 | 120 | 26 | 21% |
| 32 | 10 | 500 | ~200 | 760 | 120 | 116 | 54% |
| 33 | 9 | 500 | ~200 | 760 | 150 | 57 | 36% |
| 34 | 3 | 500 | ~200 | 760 | 150 | 81 | 45% |
| 35 | 4 | 500 | ~200 | 760 | 90 | 98 | 49% |
| 36 | 10 | 500 | ~200 | 760 | 90 | 41 | 29% |
| 37 | 6 | 500 | ~200 | 760 | 150 | 113 | 53% |
| 38 | 8 | 500 | ~200 | 760 | 150 | 4 | 4% |
| 39 | 4 | 500 | ~200 | 760 | 120 | 116 | 51% |
| 40 | 10 | 500 | ~200 | 760 | 120 | 58 | 23% |
| 41 | 9 | 500 | ~200 | 760 | 188 | 72 | 42% |
| 42 | 7 | 500 | ~200 | 760 | 188 | 7 | 7% |
| 43 | 4 | 500 | 300 | 760 | 110 | 154 | 59% |
| 44 | 10 | 500 | 300 | 760 | 110 | 173 | 38% |
| 45 | 10 | 500 | 300 | 760 | 120 | 122 | 55% |
| 46 | 10 | 500 | 300 | 760 | 120 | 134 | 57% |
| 47 | 10 | 500 | 300 | 760 | 120 | 130 | 57% |
| 48 | 10 | 500 | 300 | 760 | 90 | 92 | 48% |
| 49 | 10 | 500 | 300 | 760 | 60 | 57 | 36% |
| 50 | 10 | 480 | 300 | 760 | 120 | 109 | 52% |
| 51 | 10 | 470 | 300 | 760 | 120 | 5 | 5% |
| 52 | 10 | 475 | 300 | 760 | 120 | 92 | 48% |
| 53 | 10 | 520 | 300 | 760 | 90 | 94 | 48% |
| 54 | 10 | 475 | 300 | 760 | 120 | 85 | 46% |
| 55 | 11 | 475 | 300 | 760 | 90 | 1.5 | 1% |
| 56 | 10 | 475 | 300 | 760 | 120 | 118 | 54% |

-continued

| Composite Sample # | Porous Carbon | Set Temp. (° C.) | Flow rate (sccm) | Pressure (Torr) | Silane dwell time (min) | Total wt % gain | wt % silicon in Si—C |
|---|---|---|---|---|---|---|---|
| Summary of composite samples produced according to Example 3. | | | | | | | |
| 57 | 10 | 475 | 300 | 760 | 120 | 92 | 48% |
| 58 | 10 | 475 | 300 | 760 | 120 | 118 | 54% |
| 59 | 10 | 475 | 300 | 760 | 120 | 134 | 57% |
| 60 | 4 | 475 | 380 | 760 | 90 | 95 | 49% |
| 61 | 12 | 475 | 380 | 760 | 90 | 81 | 45% |

Example 4

Production of various composite materials via silicon deposition on porous silicon scaffold followed by chemical vapor deposition to create a carbon layer surrounding the particle.

Certain samples from the previous example were further processed to create a surface carbon layer via chemical vapor deposition, also accomplished in a tube furnace, employing propane gas at elevated temperature for a certain period of time, as noted. The preparation data are summarized in Table 5.

TABLE 5

| Sample | Propane Set Temp. | Propane Set Temp. |
|---|---|---|
| Summary of composite samples produced according to Example 4. | | |
| 9 | 850 | 30 |
| 10 | 850 | 30 |
| 11 | 800 | 15 |
| 12 | 800 | 15 |
| 13 | 800 | 10 |
| 14 | 800 | 15 |
| 39 | 750 | 30 |
| 40 | 750 | 30 |
| 41 | 750 | 30 |
| 42 | 750 | 30 |
| 43 | 750 | 10 |
| 44 | 750 | 10 |
| 57 | 750 | 30 |
| 58 | 800 | 30 |
| 59 | 800 | 30 |

Example 5. Physicochemical properties of various composite materials

The surface area, pore volume, and pore volume distribution of various samples according to the above examples were determined by nitrogen sorption as described within this disclosure. Table 6 summarizes the data.

TABLE 6

| Composite Sample | SSA (m2/g) | PV (cm3/g) | Pore volume distribution % micropores, % mesopore, % macropores |
|---|---|---|---|
| 1 | 623 | 0.495 | 42, 58, 0 |
| 2 | 1359 | 1.02 | 45, 55, 0 |
| 3 | 516 | 0.44 | 38, 62, 0 |
| 4 | 1158 | 0.86 | 45, 55, 0 |

TABLE 6-continued

| Composite Sample | SSA (m2/g) | PV (cm3/g) | Pore volume distribution % micropores, % mesopore, % macropores |
|---|---|---|---|
| 5 | 423 | 0.386 | 34, 66, 1 |
| 6 | 910 | 0.665 | 46, 54, 0 |
| 7 | 73 | 0.12 | 5, 49, 45 |
| 8 | 342 | 0.66 | 6, 83, 11 |
| 9 | 10 | 0.016 | 11, 82, 7 |
| 10 | 27 | 0.065 | 3, 88, 9 |
| 11 | 193 | 0.362 | 8, 92, 0 |
| 12 | 187 | 0.42 | 4, 91, 6 |
| 13 | 80 | 0.199 | 3, 89, 8 |
| 14 | 95 | 0.229 | 4, 84, 13 |
| 15 | 150 | 0.28 | 7, 86, 7 |
| 16 | 291 | 0.208 | 50, 49, 1 |
| 17 | 117 | 0.201 | 9, 81, 10 |
| 18 | 282 | 0.204 | 49, 50, 1 |
| 19 | 576 | 1.06 | 8, 83, 10 |
| 20 | 592 | 0.493 | 29, 60, 0 |
| 21 | 296 | 0.547 | 8, 80, 13 |
| 22 | 475 | 0.371 | 42, 57, 1 |
| 23 | 285 | 0.512 | 8, 81, 11 |
| 24 | 222 | 0.233 | 28, 72, 0 |
| 25 | N/A | N/A | N/A |
| 26 | N/A | N/A | N/A |
| 27 | 211 | 0.249 | 22, 78, 0 |
| 28 | 1.5 | 0.003 | 11, 0, 89 |
| 29 | N/A | N/A | N/A |
| 30 | 4.7 | 0.0068 | 5, 42, 53 |
| 31 | 980 | 0.417 | 94, 4, 2 |
| 32 | 309 | 0.243 | 42, 58, 0 |
| 33 | 1.9 | 0.0014 | 2, 32, 65 |
| 34 | 191 | 0.085 | 90, 7, 3 |
| 35 | 250 | 0.44 | 8, 75, 17 |
| 36 | 927 | 0.719 | 43, 57, 0 |
| 37 | 2.4 | 0.0017 | 6, 34, 60 |
| 38 | 0.28 | 0.001 | 0, 43, 57 |
| 39 | 127 | 0.315 | 4, 81, 15 |
| 40 | 399 | 0.433 | 25, 75, 0 |
| 41 | 2.5 | 0.0035 | 1, 53, 46 |
| 42 | 0.36 | 0.0007 | 3, 0, 97 |
| 43 | 106 | 0.25 | 3, 87, 10 |
| 44 | 562 | 0.471 | 39, 61, 0 |
| 45 | 314 | 0.254 | 41, 59, 0 |
| 46 | 254 | 0.211 | 39, 61, 0 |
| 47 | 282 | 0.231 | 40, 60, 0 |
| 48 | 507 | 0.416 | 40, 60, 0 |
| 49 | 688 | 0.55 | 41, 59, 0 |
| 50 | 357 | 0.311 | 36, 64, 0 |
| 51 | N/A | N/A | N/A |
| 52 | 406 | 0.36 | 35, 65, 0 |
| 53 | 443 | 0.35 | 42, 58, 0 |
| 54 | 474 | 0.404 | 37, 63, 0 |
| 55 | 2 | 0.002 | 8, 45, 43 |
| 56 | 240 | 0.214 | 35, 65, 0 |
| 57 | 182 | 0.226 | 19, 81, 0 |
| 58 | 15 | 0.026 | 6, 90, 5 |
| 59 | 12 | 0.02 | 8, 86, 6 |
| 60 | 283 | 0.43 | 7, 66, 27 |
| 61 | 75 | 0.056 | 47, 50, 3 |

Example 6. Electrochemical Properties of Various Composite Materials

A variety of composites were produced according to the above examples. Said samples were studied for their electrochemical properties. In Table 7 presents the data for the material tested an as anode in a half cell, wherein said anode comprises active material, binder, and conductive carbon comprised 60%, 20%, and 20% of the electrode mass respectively. These samples were assembled into half-cells, and tested for five cycles at a rate of C/10, and further cycles at C/5. The electrochemical testing data are summarized in Table 7. Unless otherwise stated, the average Coulombic efficiency and capacity retention are reported over cycle 7 to cycle 25, capacity is reported for cycle 6.

TABLE 7

Electrochemical characterization of various composite samples.

| Composite Sample | First cycle efficiency | Capacity | Avg Coulombic efficiency |
|---|---|---|---|
| 1 | N/A | N/A | N/A |
| 2 | N/A | N/A | N/A |
| 3 | N/A | N/A | N/A |
| 4 | 24% | 468 | 0.9873 |
| 5 | N/A | N/A | N/A |
| 6 | 25% | 554 | 0.9926 |
| 7 | N/A | N/A | N/A |
| 8 | 27% | 554 | 0.9653 (cycles 7-10) |
| 9 | 40% | 144 | 0.9938 |
| 10 | 46% | 334 | N/A |
| 11 | 24% | 239 | 0.9930 |
| 12 | 41% | 795 | 0.9854 |
| 13 | 69% | 1772 | 0.9900 |
| 14 | 60% | 1268 | 0.9942 |
| 15 | 70% | 1895 | 0.9854 (cycles 7-15) |
| 16 | 33% | 440 | N/A |
| 17 | 74% | 2026 | 0.9834 |
| 18 | 57% | 854 | 0.9935 (cycles 7-20) |
| 19 | N/A | N/A | N/A |
| 20 | N/A | N/A | N/A |
| 21 | 42% | 1007 | 0.9791 (CE 7-20) |
| 22 | 26% | 294 | 0.9794 |
| 23 | N/A | N/A | N/A |
| 24 | N/A | N/A | N/A |
| 25 | N/A | N/A | N/A |
| 26 | N/A | N/A | N/A |
| 27 | 49% | 713 | 0.9945 |
| 28 | N/A | N/A | N/A |
| 29 | N/A | N/A | N/A |
| 30 | 62% | 724 | 0.9916 |
| 31 | N/A | N/A | N/A |
| 32 | 63% | 1392 | 0.9946 (CE 7-10) |
| 33 | 76% | 1194 | 0.9824 (CE 7-10) |
| 34 | N/A | N/A | N/A |
| 35 | 58% | 1453 | 0.9735 (CE 7-10) |
| 36 | 23% | 415 | 0.9749 (CE 7-10) |
| 37 | 82% | 2082 | 0.9808 (CE 7-10) |
| 38 | N/A | N/A | N/A |
| 39 | 66% | 1754 | N/A |
| 40 | 30% | 439 | N/A |
| 41 | 78 | 1489 | 96.22 |
| 42 | N/A | N/A | N/A |
| 43 | 68 | 2028 | 98.02 |
| 44 | 48 | 920 | 99.34 |
| 45 | 69 | 1410 | 98.6 |
| 46 | 73 | 1856 | 97.85 |
| 47 | 73 | 1631 | 98.16 |
| 48 | 63 | 1514 | 99.05 |
| 49 | 40 | 754 | N/A |
| 50 | 67 | 1519 | 99.16 |
| 51 | N/A | N/A | N/A |
| 52 | 54 | 1042 | 99.52 |
| 53 | 59 | 1178 | 98.78 |
| 54 | 51 | 974 | 99.34 |
| 55 | N/A | N/A | N/A |
| 56 | 68 | 1593 | 99.42 |
| 57 | 50 | 756 | 99.53 |
| 58 | 68 | 1177 | 99.26 |
| 59 | 67 | 1099 | 99.36 |
| 60 | N/A | N/A | N/A |
| 61 | 73 | 1650 | 99.31 |

N/A refers that the information is either not available or pending.

Example 7. Electrochemical Characterization of Various Composite Materials in Blends with Graphite A variety of composites were produced according to the above examples. A selected number of said samples were studied for their electrochemical properties. In Table 8 presents the data for the material tested an as anode in a half cell, wherein said anode comprises active material, binder, and conductive carbon comprised 80%, 10%, and 10% of the electrode mass respectively. The active material was further comprised of graphite, with the % of graphite and % of sample adjusted in order to achieve an approximate capacity in the range of 500-800 mAh/g. For sample 13, the electrode was comprised of 24% of sample 13 and 76% graphite. For sample 14, the electrode was comprised of 30% of sample 14 and 70% graphite. For sample 15, the electrode was comprised of 19% of sample 15 and 81% graphite. For sample 32, the electrode was comprised of 24% of sample 32 and 76% graphite. For sample 33, the electrode was comprised of 27% of sample 33 and 73% graphite. For sample 35, the electrode was comprised of 24% of sample 35 and 76% graphite. These samples were assembled into half-cells, and tested for five cycles at a rate of C/10, and further cycles at C/5. The electrochemical testing data are summarized in Table 8. Unless otherwise stated, the average Coulombic efficiency and capacity retention are reported over cycle 7 to cycle 25, capacity is reported for cycle 6.

TABLE 8

Electrochemical characterization of various composite samples in graphite blends.

| Composite Sample | First cycle efficiency | Capacity | Avg Coulombic efficiency |
|---|---|---|---|
| 13 | 76% | 647 | 0.9919 |
| 14 | 69% | 596 | 09961 |
| 15 | 78% | 626 | 0.9913 (cycles 7 to 20) |
| 32 | 79% | 515 | N/A |
| 33 | 73% | 595 | N/A |
| 35 | 65% | 538 | N/A |
| 50 | 72 | 603 | 99.77 |

Example 8. Filling of Pores of Microporous Carbon Materials Via Silicon Deposition Microporous carbon (Carbon 3) was examined for its pore volume distribution before and after either 120 min (Sample 31) or 150 min (Sample 34) treatment with silane to create composite materials comprising silicon and carbon. The pore volume distributions of these samples are depicted in FIG. 1. As can be seen, there was a substantial decrease in the pore volume in the micropore range, consistent with filling of the micropores within the carbon scaffold with silicon.

Figure 2:
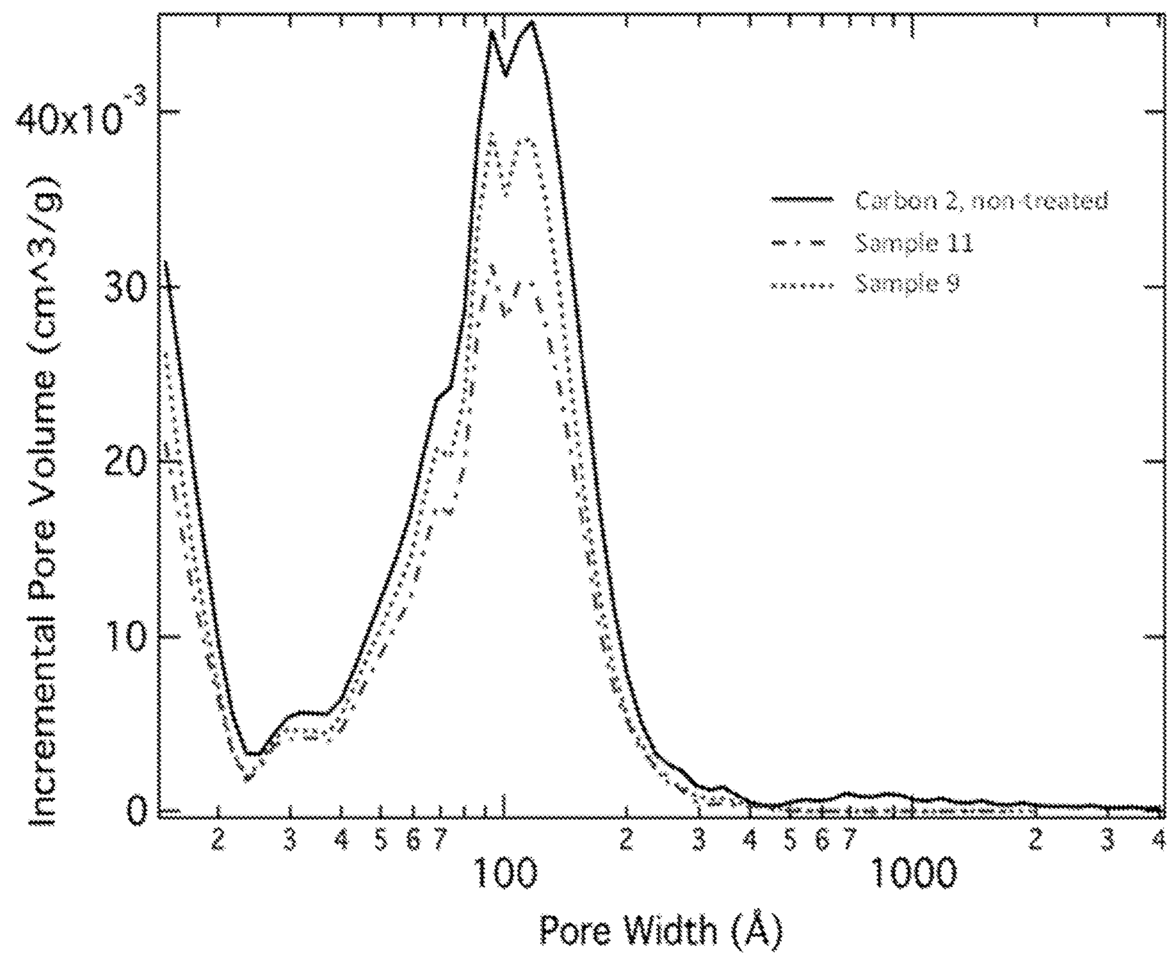
FIG. 2. Pore volume distribution for mixed micro-, meso-, and macropoous carbon scaffold and silicon-containing composites derived from same.

Example 9. Filling of Pores of Mixed Micro-, Meso, and Macroporous Carbon Materials Via Silicon Deposition A carbon with mixed micro-, meso-, and macroporous nature (Carbon 2) was examined for its pore volume distribution before and after either 60 min (Sample 11) or 90 min treatment (Sample 9) with silane to create composite materials comprising silicon and carbon. The pore volume distributions of these samples are depicted in FIG. 2. As can be seen, there was a substantial decrease in the pore volume in the micropore range, mesopore range, and macropore range, consistent with filling of the micropores, mesopores, and macropores within the carbon scaffold with silicon.

Figure 3:
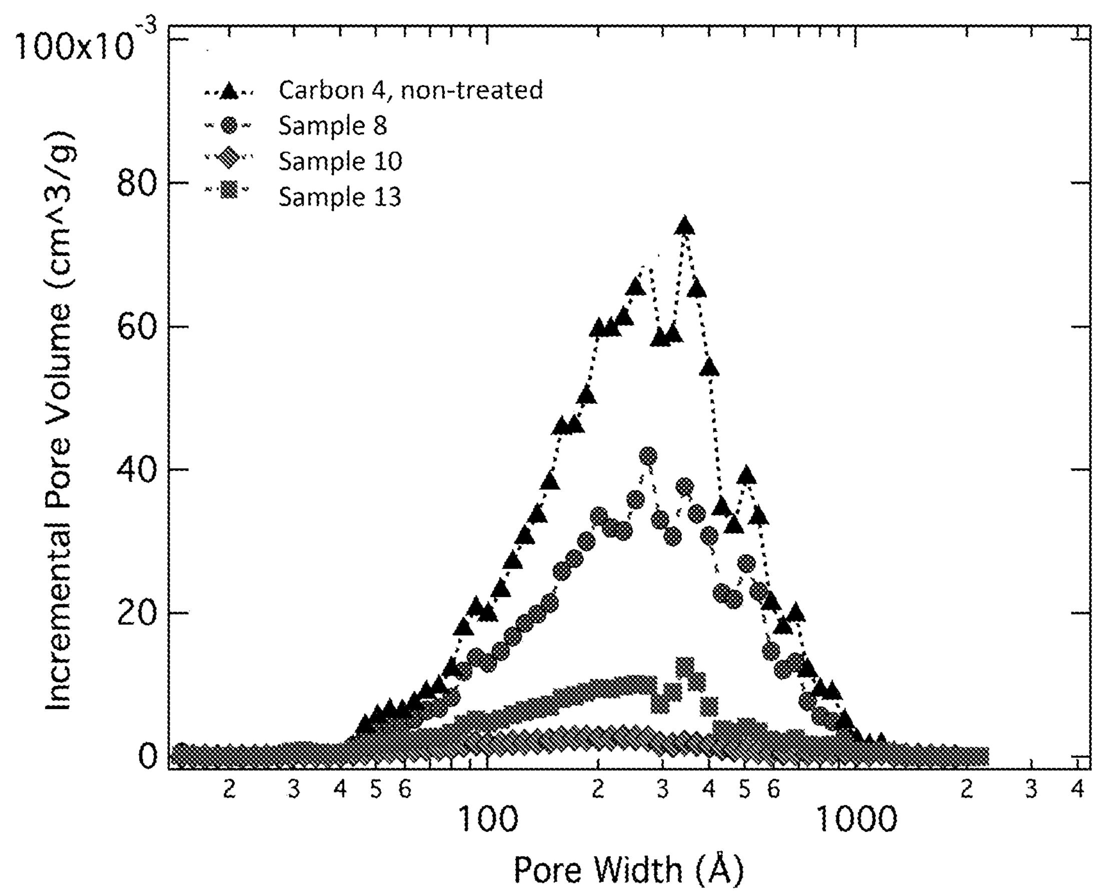
FIG. 3. Pore volume distribution for macropoous carbon scaffold and silicon-containing composites derived from same.

Example 10. Filling of Pores of Macroporous Carbon Materials Via Silicon Deposition A carbon with macroporous nature (Carbon 4) was examined for its pore volume distribution before and after either 90 min treatment with silane (Sample 8), or after 90 min treatment with silane and an additional 30 min treatment with propane (Sample 10), or after 120 min treatment with silane and an additional 10 min treatment with propane (Sample 13) to create composite materials comprising silicon and carbon. The pore volume distributions of these samples are depicted in FIG. 3. As can be seen, there was a substantial decrease in the pore volume in the macropore range, consistent with filling of the macropores within the carbon scaffold with silicon. Additionally, with the subsequent propane treatment (layering of additional carbon of the particle surface), there was additional loss in macropore volume, without being bound by theory, this observation is consistent with the CVD carbon coating providing for capping off of macropores with reduction in macropore volume.

Accordingly, it is envisioned that composite materials in certain embodiments will comprise a fraction of trapped pore volume, namely, void volume non-accessible to nitrogen gas as probed by nitrogen gas sorption measurement. Without being bound by theory, this trapped pore volume is important in that it provides volume into which silicon can expand upon lithiation.

Example 11

Capping off of pores within the porous carbon scaffold via CVD Carbon coating porous materials by thermal chemical vapor deposition will cap micropores rather than fill pores with carbon. This is best observed by carbon CVD on a purely microporous carbon (Carbon 3). As seen in the table below, the material's specific surface area drops from 1720 $m^2/g$ down to 6 $m^2/g$. The pore volume also decreases to a negligible value. The evidence for capping is seen in the nitrogen pycnometry data, the pellet density and the acetone pyncnometry. Pellet was measured by compressing powder in a die at a pressure of 2000 kg/cm2.

Figure 4:
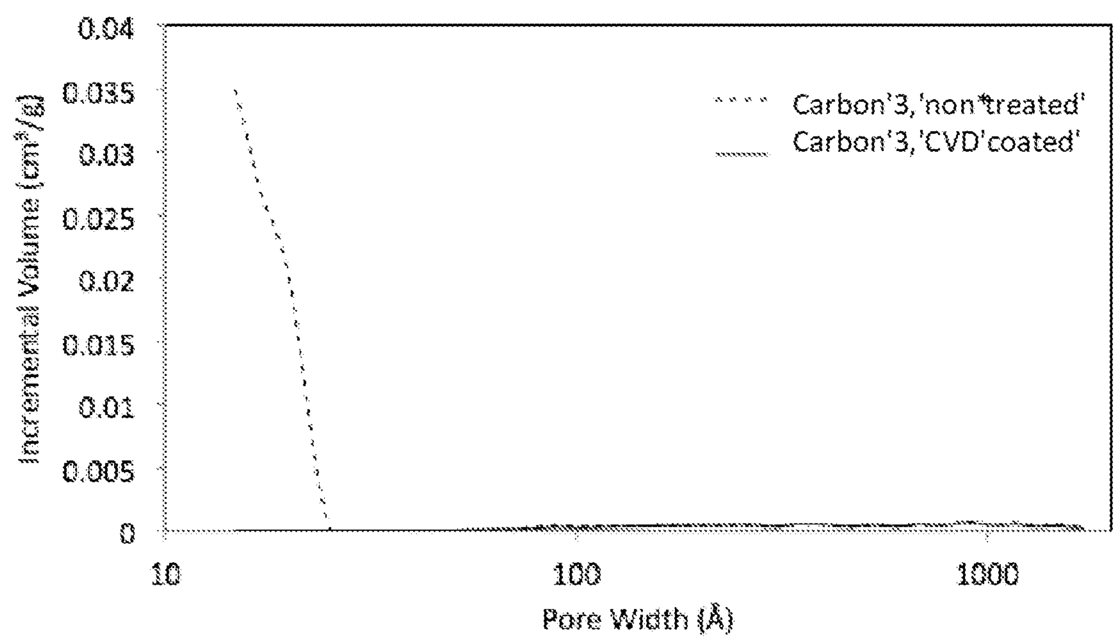
FIG. 4. Pore volume distribution for microporous carbon before and after CVD treatment to cap off micropores.

Acetone pyncnometry was measured by submerging the powder in acetone and measuring liquid displacement. The starting apparent skeletal density is 2.24 g/cc for a pure microporous carbon. After CVD of carbon on the material, the apparent skeletal density drops to 1.49 g/cc, suggesting void space creation in the material. The data are summarized in Table 9 and shown graphically in the pore volume distributions in FIG. 4.

TABLE 9

Example of capping micropore in carbon scaffold particle.

| Metric | Material | |
|---|---|---|
| | Carbon 3, Non-treated | Carbon 3, CVD coated |
| BET Pore Volume (cc/g) | 0.739 | 0.010 |
| BET Specific Surface Area (m2/g) | 1720 | 6 |
| N2 Pycnometry Density | 2.24 | 1.49 |
| Acetone Pycnometry | 2.17 | 1.45 |
| Pellet Density (2000 kg/cm2) | 0.67 | 0.91 |

Example 12. Electrochemical Characterization of Composite Material in Full Cell Coin Cell The electrochemical performance of composite samples were examined for the material as an anode comprising 80% active material, 10% conductive carbon, and 10% binder, wherein the active further comprises 30% of the sample to be tested and 70% graphite.

Full cell coin cell were constructed as follows. The anode and cathode were paired by collecting the half cell absolute 5th cycle insertion (anode) and first cycle extraction (cathode) capacities, and matching electrodes such that a 5-15% excess anode ratio was satisfied. Coin cells were constructed using LiNiCoAlO anode. After fabrication, the cells were electrochemically formed with 5 charge/discharge sequences from 2.0-4.2 V. The first two sequences were performed at C/10 current with a C/20 hold at 4.2 V, and the following three sequences were performed at C/5, again with a C/20 hold. For evaluation of cycle stability, the cells were cycled from 2.0-4.2 V at C/2 with a C/20 hold Example 13. Calculation for Mean Free Path for Deposition Gas The mean free path (MFP) was calculated for a variety of different temperatures, pressures, and gases according to gas kinetic theory as known in the art, for either 150 pm sized or 300 pm sized molecule (Table 10). Additional calculations are envisioned as known in the art.

TABLE 10

Example of mean free path calculation for deposition gas.

| Gas Molecule Size (pm) | Temperature (C.) | Pressure (kpa) | MFP (nm) |
|---|---|---|---|
| 150 | 400 | 10.1 | 2301 |
| 150 | 400 | 101 | 231 |
| 150 | 500 | 10.1 | 2643 |
| 150 | 500 | 101 | 264 |
| 150 | 600 | 10.1 | 2985 |
| 150 | 600 | 101 | 298 |
| 300 | 400 | 10.1 | 575 |
| 300 | 400 | 101 | 58 |
| 300 | 500 | 10.1 | 661 |
| 300 | 500 | 101 | 66 |
| 300 | 600 | 10.1 | 746 |
| 300 | 600 | 101 | 75 |
| 150 | 400 | 1.01 | 92000 |
| 150 | 400 | 101 | 920 |
| 150 | 500 | 1.01 | 105700 |
| 150 | 500 | 101 | 1057 |
| 150 | 600 | 1.01 | 119400 |
| 150 | 600 | 101 | 1194 |
| 300 | 400 | 1.01 | 23010 |
| 300 | 400 | 101 | 230 |

TABLE 10-continued

| Example of mean free path calculation for deposition gas. | | | |
|---|---|---|---|
| Gas Molecule Size (pm) | Temperature (C.) | Pressure (kpa) | MFP (nm) |
| 300 | 500 | 1.01 | 26430 |
| 300 | 500 | 101 | 264 |
| 300 | 600 | 1.01 | 29850 |
| 300 | 600 | 101 | 299 |

Example 14

Expansion Measurements of Various Anode Materials

Anodes were made following the procedures generally described herein. The anode material to be tested was typically diluted with graphite to achieve in the range of 400-700 mAh/g. The percent graphite in the blend for each sample is described below, and in such cases the electrode formulation generally consisted of 80% active materials (the material in graphite blend), 10% conductivity enhancer such as SuperP, and 10% binder, such as SBR-CMC. In certain cases, the material was tested in the absence of graphite, and such cases typically were comprised of 60% activate material, 20% conductivity enhancer, and 20% binder in the anode formulation. In certain cases, the anode was comprised of 90% activate material, 5% conductivity enhancer, and 5% binder in the anode formulation. The electrode used was 1M LiPF6 EC:DEC+10% FEC, and the lithium metal was used as a cathode to construct the half cell coin cell. The cells were tested electrochemically as generally described herein. The voltage was cycled from 0.8 V to 0.005 V at a C/10 rate for 5 cycles followed by 25 cycles at C/5 rate. After the cycling, the coin cells were brought to a 100% state of charge for a final time, then dissembled, and the anode thickness was measured compared to the starting thickness before electrochemical testing. The different types of samples produced were: graphite-based, carbon composited nano silicon, carbon composited nano-featured silicon, carbon composited silicon oxide (SiOx), and a carbon silicon composite produced via silane deposition on a porous carbon scaffold followed by a final carbon coating achieved via hydrocarbon chemical vapor deposition (C—Si—C composited). Samples were produced according to general procedures described elsewhere herein. Also included are some samples comprising bare nanosilicon, that is not composited with carbon. Unless otherwise stated, the capacity, either gravimetric or volumetric, refers to the capacity of the non-lithiated material. These samples are summarized in the Table 11 below.

Figure 5:
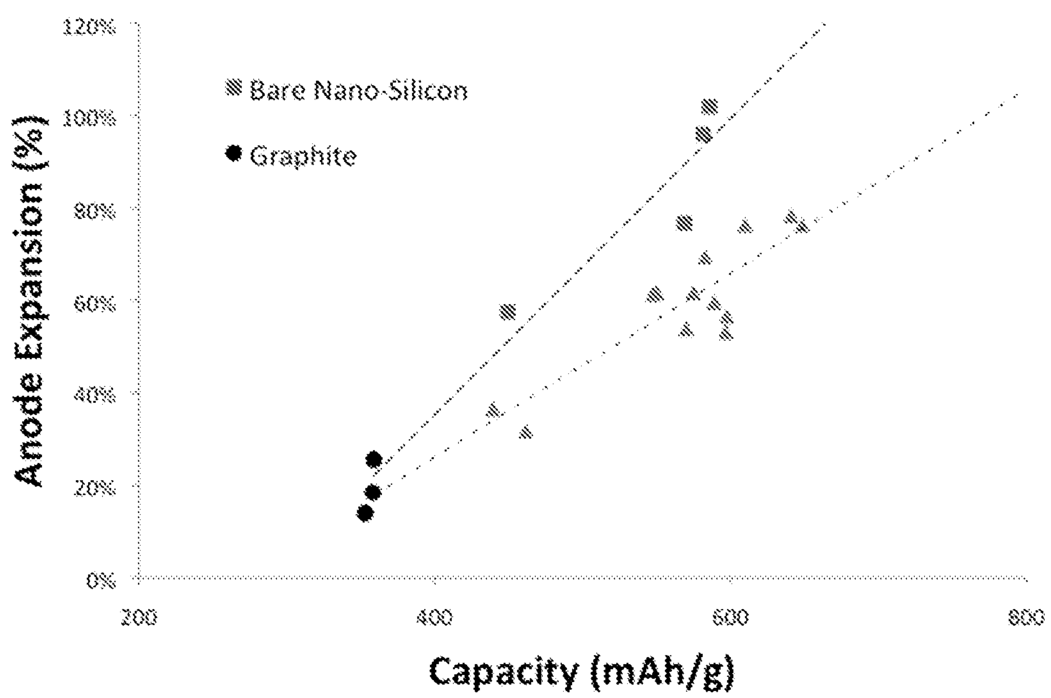
FIG. 5. Data for anode expansion vs. the gravimetric capacity for bare carbon vs carbon-composited nanosilicon.
Figure 6:
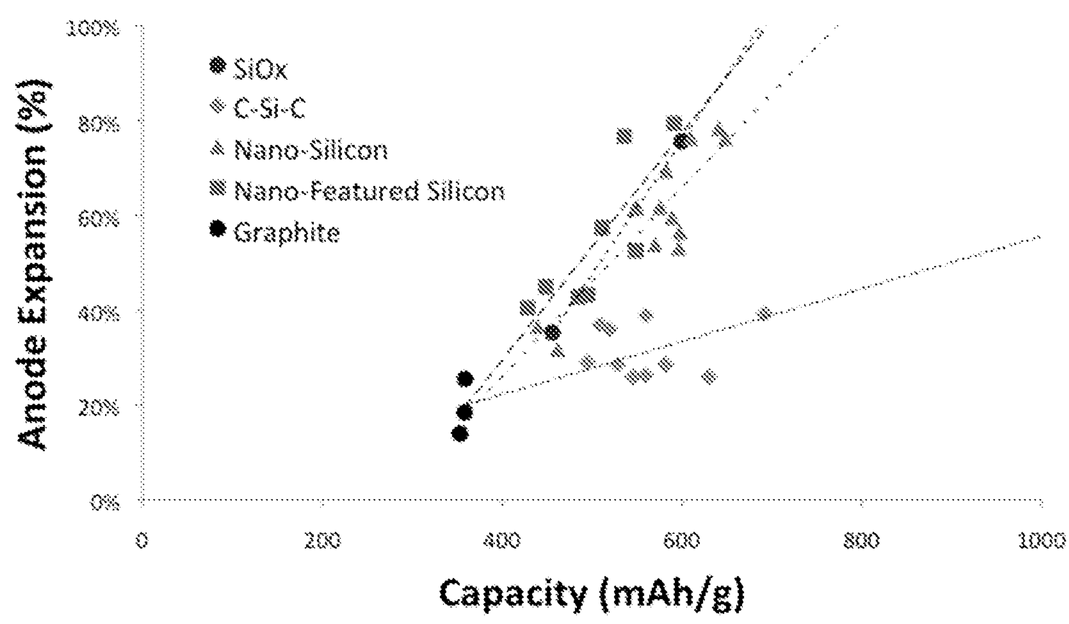
FIG. 6. Anode expansion vs. gravimetric capacity data for sample carbon silicon composites.
Figure 7:
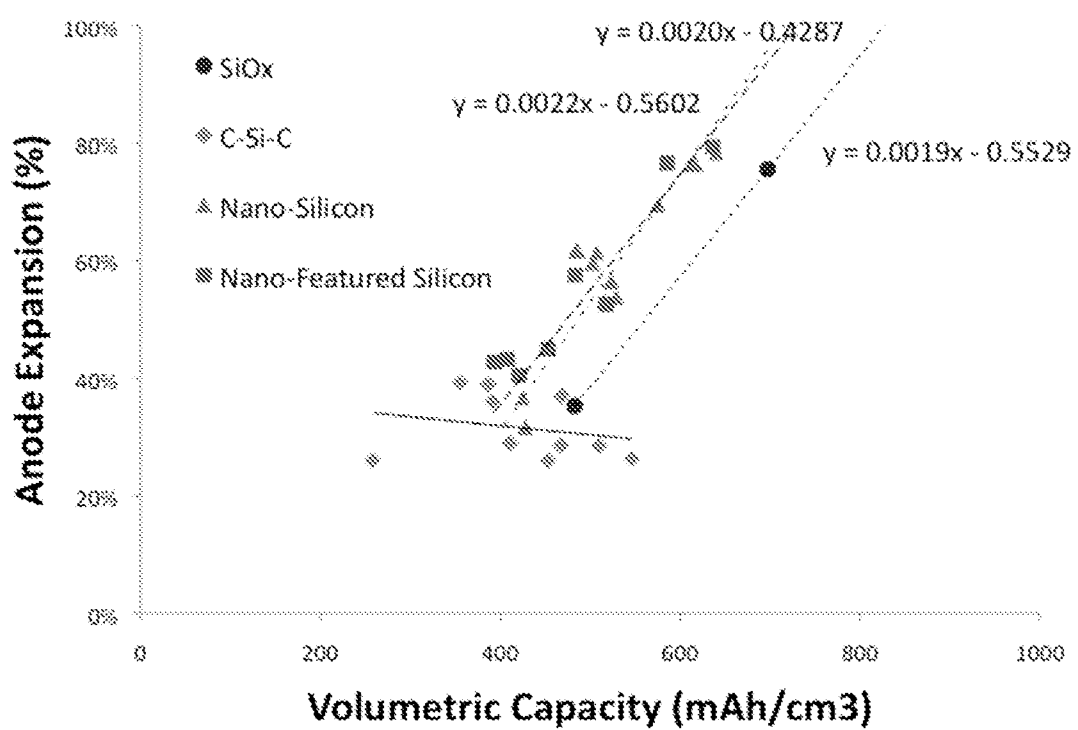
FIG. 7. Anode expansion vs. volumetric capacity data for sample carbon silicon composites.

The data for anode expansion vs. the gravimetric capacity are shown in FIG. 5 for non-composited (i.e., so-called bare) nanosilicon vs. the same nanosilicon in a silicon carbon composite material. As can be seen, the bare material expands drastically with increasing gravimetric capacity in the blend of nano silicon with graphite. In contrast, when the nanosilicon was composited with carbon, there was a dramatically lowered expansion for the blend of carbon-composited nano silicon with graphite. FIG. 6 shows the anode expansion vs. the gravimetric capacity for a variety of different samples. The data are shown in FIG. 7 in terms of anode expansion vs the volumetric capacity (in the non-lithiated state). The carbon composited nanosilicon samples, the carbon composited nanofeatured silicon samples, and the carbon composited silicon oxide (SiOx) samples all showed similar expansion with increasing gravimetric capacity in their respective blends with graphite. In contrast, the surprising, unexpected finding was a dramatically lower expansion for samples comprising a carbon silicon composite produced via silane deposition on a porous carbon scaffold followed by a final carbon coating achieved via hydrocarbon chemical vapor deposition (C—Si—C).

TABLE 11

Summary of Samples for Example 14

| Material | Anode Formulation (wt %:wt %:wt %) Active:CE:Binder | % Graphite in Active | Anode Active Material Density (g/cm3) | Anode Density (including CE and Binder) (g/cm3) | First Cycle Efficiency (%) | Capacity @ Cycle 6 (mAh/g) | Coulombic Efficiency (average cycles 7-25) | Expansion at 100% State of Charge (%) | Volumetric Capacity, delithiated anode basis (mAh/cm3) | Volumetric Capacity, lithiated anode basis (mAh/cm3) |
|---|---|---|---|---|---|---|---|---|---|---|
| Graphite sample 1 | 80:10:10 | 100 | 0.95 | 1.188 | 85.6% | 358 | 0.9994 | 18% | 340 | 302 |
| Graphite sample 2 | 90:05:05 | 100 | 1.146 | 1.274 | 88.0% | 353 | Not det. | 14% | 405 | 310 |
| Graphite sample 3 | 90:05:05 | 100 | 1.336 | 1.485 | 90.5% | 359 | 0.9996 | 26% | 480 | 286 |
| Carbon-composited silicon oxide Sample 1 | 80:10:10 | 61 | 1.163 | 1.453 | 67.8% | 600 | 0.9949 | 76% | 697 | 342 |
| Carbon-composited silicon oxide Sample 2 | 80:10:10 | 91 | 1.059 | 1.323 | 78.2% | 456 | 0.9977 | 35% | 483 | 337 |
| Carbon composite nano-silicon Sample 1 | 80:10:10 | 91 | 0.927 | 1.159 | 81.9% | 462 | 0.9986 | 32% | 428 | 351 |
| Carbon composite nano-silicon Sample 1 | 80:10:10 | 91 | 0.967 | 1.209 | 80.3% | 439 | 0.9968 | 37% | 425 | 322 |

TABLE 11-continued

Summary of Samples for Example 14

| Material | Anode Formulation (wt %:wt %:wt %) Active:CE:Binder | % Graphite in Active | Anode Active Material Density (g/cm3) | Anode Density (including CE and Binder) (g/cm3) | First Cycle Efficiency (%) | Capacity @ Cycle 6 (mAh/g) | Coulombic Efficiency (average cycles 7-25) | Expansion at 100% State of Charge (%) | Volumetric Capacity, delithiated anode basis (mAh/cm3) | Volumetric Capacity, lithiated anode basis (mAh/cm3) |
|---|---|---|---|---|---|---|---|---|---|---|
| Carbon composited nano-silicon Sample 3 | 80:10:10 | 73 | 0.928 | 1.16 | 73.6% | 570 | 0.9928 | 54% | 529 | 371 |
| Carbon composited nano-silicon Sample 4 | 80:10:10 | 71 | 0.987 | 1.234 | 75.2% | 583 | 0.9968 | 69% | 575 | 344 |
| Carbon composited nano-silicon Sample 5 | 80:10:10 | 70 | 0.998 | 1.248 | 73.4% | 641 | 0.9933 | 78% | 640 | 359 |
| Carbon composited nano-silIcon Sample 6 | 80:10:10 | 70 | 0.927 | 1.159 | 74.0% | 547 | 0.9952 | 61% | 507 | 339 |
| Carbon composited nano-silicon Sample 7 | 80:10:10 | 70 | 0.833 | 1 | 73.1% | 589 | 0.9952 | 60% | 502 | 369 |
| Carbon composited nano-silicon Sample 8 | 80:10:10 | 70 | 0.864 | 1 | 73.9% | 597 | 0.9955 | 53% | 515 | 389 |
| Carbon composited nano-silicon Sample 9 | 80:10:10 | 70 | 0.052 | 1.19 | 74.4% | 648 | 0.9955 | 76% | 617 | 368 |
| Carbon composited nano-silicon Sample 10 | 80:10:10 | 58 | 0.876 | 1.095 | 75.6% | 597 | 0.9964 | 57% | 523 | 382 |
| Carbon composited nano-silicon Sample 11 | 80:10:10 | 70 | 0.845 | 1 | 72.7% | 575 | 0.9945 | 62% | 486 | 356 |
| Carbon composited nano-silicon Sample 12 | 80:10:10 | 70 | 0.88 | 1.1 | 71.7% | 550 | 0.9945 | 62% | 484 | 340 |
| Carbon composited nano-silicon Sample 13 | 80:10:10 | 70 | 1.004 | 1.255 | 73.7% | 610 | 0.9948 | 76% | 612 | 346 |
| Carbon composited nano featured silicon Sample 1 | 80:10:10 | 85 | 0.824 | 1.03 | 79.0% | 495 | 0.9924 | 43% | 408 | 346 |
| Carbon composited nano featured silicon Sample 2 | 80:10:10 | 70 | 1.01 | 1.263 | 73.2% | 448 | 0.9955 | 45% | 453 | 309 |
| Carbon composited nano featured silicon Sample 3 | 80:10:10 | 70 | 1.092 | 1.365 | 74.3% | 536 | 0.9955 | 77% | 585 | 303 |
| Carbon composited nano featured silicon Sample 4 | 80:10:10 | 70 | 1.075 | 1.344 | 73.8% | 592 | 0.9937 | 79% | 636 | 330 |
| Carbon composited nano featured silicon Sample 5 | 80:10:10 | 85 | 0.812 | 1.015 | 81.2% | 484 | 0.9948 | 43% | 393 | 339 |
| Carbon composited | 80:10:10 | 70 | 0.944 | 1.18 | 74.9% | 549 | 0.9943 | 53% | 518 | 359 |

TABLE 11-continued

Summary of Samples for Example 14

| Material | Anode Formulation (wt %:wt %:wt %) Active:CE:Binder | % Graphite in Active | Anode Active Material Density (g/cm3) | Anode Density (including CE and Binder) (g/cm3) | First Cycle Efficiency (%) | Capacity @ Cycle 6 (mAh/g) | Coulombic Efficiency (average cycles 7-25) | Expansion at 100% State of Charge (%) | Volumetric Capacity, delithiated anode basis (mAh/cm3) | Volumetric Capacity, lithiated anode basis (mAh/cm3) |
|---|---|---|---|---|---|---|---|---|---|---|
| nano featured silicon Sample 6 | | | | | | | | | | |
| Carbon composited nano featured silicon Sample 7 | 80:10:10 | 70 | 0.946 | 1.182 | 74.5% | 511 | 0.9939 | 58% | 483 | 324 |
| Carbon composited nano featured silicon Sample 8 | 80:10:10 | 89.4 | 0.983 | 1.229 | 80.9% | 428 | 0.9978 | 41% | 421 | 305 |
| C—Si—C composited Sample 1 | 80:10:10 | 70 | 0.754 | 0.942 | 77.8% | 519 | 0.9973 | 36% | 392 | 382 |
| C—Si—C composited Sample 2 | 80:10:10 | 70 | 0.975 | 1.22 | 80.0% | 560 | 0.9985 | 26% | 546 | 443 |
| C—Si—C composited Sample 3 | 60:20:20 | 0 | 0.514 | 0.514 | 66.4% | 692 | 1 | 39% | 356 | 497 |
| C—Si—C composited Sample 4 | 80:10:10 | 76 | 0.877 | 1.096 | 73.0% | 582 | 0.9976 | 29% | 510 | 452 |
| C—Si—C composited Sample 5 | 80:10:10 | 76 | 0.884 | 1.105 | 71.1% | 528 | 0.9977 | 29% | 467 | 411 |
| C—Si—C composited Sample 6 | 80:10:10 | 65 | 0.83 | 1.038 | 76.6% | 495 | 0.9997 | 29% | 411 | 384 |
| C—Si—C composited Sample 7 | 80:10:10 | 65 | 0.83 | 1.038 | Not Det. | 546 | 0.9997 | 26% | 453 | 433 |
| C—Si—C composited Sample 8 | 80:10:10 | 58 | 0.41 | 0.513 | 79.4% | 530 | Not Det. | 26% | 258 | 500 |
| C—Si—C composited Sample 9 | 80:10:10 | 70 | 0.92 | 1.15 | 89.1% | 509 | 0.9997 | 37% | 468 | 372 |
| C—Si—C composited Sample 10 | 80:10:10 | 70 | 0.69 | 0.863 | 80.0% | 566 | Not Det. | 39% | 301 | 407 |
| Bare Nano Silicon Sample 1 | 80:10:10 | 93 | 0.947 | 1.184 | 76.6% | 449 | 0.9951 | 58% | 426 | 285 |
| Bare Nano Silicon Sample 2 | 80:10:10 | 74 | 0.769 | 0.962 | 67.4% | 569 | 0.9893 | 77% | 438 | 322 |
| Bare Nano Silicon Sample 3 | 80:10:10 | 78 | 0.823 | 1.029 | 75.4% | 581 | 0.9934 | 96% | 479 | 297 |
| Bare Nano Silicon Sample 4 | 80:10:10 | 75 | 0.892 | 1.116 | 74.9% | 586 | 0.9933 | 102% | 523 | 290 |

Without being bound by theory, the lower expansion for the C—Si—C samples translates into reduced propensity for material cracking an unstable SEI formation upon cycling in a battery. It is envisioned from the data the C—Si—C composite can exhibit, for example when blended with graphite or another suitable matrix or when tested as a pure material, an anode expansion of less than 30% and a gravimetric capacity of greater than 400 mAh/g. In certain embodiments, the C—Si—C composite can exhibit an anode expansion of less than 30% and a gravimetric capacity of greater than 500 mAh/g. In certain embodiments, the C—Si—C composite can exhibit an anode expansion of less than 30% and a gravimetric capacity of greater than 600 mAh/g. In certain embodiments, the C—Si—C composite can exhibit an anode expansion of less than 30% and a gravimetric capacity of greater than 800 mAh/g. In certain embodiments, the C—Si—C composite can exhibit an anode expansion of less than 30% and a gravimetric capacity of greater than 1000 mAh/g.

In further embodiments, the C—Si—C composite can exhibit, for example when blended with graphite or another suitable matrix or when tested as a pure material, an anode expansion of less than 40% and a gravimetric capacity of greater than 500 mAh/g. In further embodiments, the C—Si—C composite can exhibit an anode expansion of less than 40% and a gravimetric capacity of greater than 600 mAh/g. In further embodiments, the C—Si—C composite can exhibit an anode expansion of less than 40% and a gravimetric capacity of greater than 800 mAh/g. In further embodiments, the C—Si—C composite can exhibit an anode expansion of less than 40% and a gravimetric capacity of greater than 1000 mAh/g.

In other embodiments, the C—Si—C composite can exhibit, for example when blended with graphite or another suitable matrix or when tested as a pure material, an anode expansion of less than 50% and a gravimetric capacity of greater than 800 mAh/g. In other embodiments, the C—Si—C composite can exhibit, for example when blended with graphite or another suitable matrix or when tested as a pure material, an anode expansion of less than 60% and a gravimetric capacity of greater than 1000 mAh/g.

In some embodiments, the C—Si—C composite can exhibit, for example when blended with graphite or another suitable matrix or when tested as a pure material, an anode expansion of less than 20% and a gravimetric capacity of greater than 500 mAh/g. In further embodiments, the C—Si—C composite can exhibit an anode expansion of less than 20% and a gravimetric capacity of greater than 600 mAh/g. In further embodiments, the C—Si—C composite can exhibit an anode expansion of less than 20% and a gravimetric capacity of greater than 800 mAh/g. In further embodiments, the C—Si—C composite can exhibit an anode expansion of less than 20% and a gravimetric capacity of greater than 1000 mAh/g.

Without being bound by theory, the lower expansion for the C—Si—C samples translates into reduced propensity for material cracking an unstable SEI formation upon cycling in a battery. It is envisioned from the data the C—Si—C composite can exhibit, for example when blended with graphite or another suitable matrix or when tested as a pure material, an anode expansion of less than 30% and a volumetric capacity of greater than 400 mAh/cm3. In certain embodiments, the C—Si—C composite can exhibit an anode expansion of less than 30% and a volumetric capacity of greater than 500 mAh/cm3. In certain embodiments, the C—Si—C composite can exhibit an anode expansion of less than 30% and a volumetric capacity of greater than 600 mAh/cm3. In certain embodiments, the C—Si—C composite can exhibit an anode expansion of less than 30% and a volumetric capacity of greater than 800 mAh/cm3. In certain embodiments, the C—Si—C composite can exhibit an anode expansion of less than 30% and a volumetric capacity of greater than 1000 mAh/cm3.

In further embodiments, the C—Si—C composite can exhibit, for example when blended with graphite or another suitable matrix or when tested as a pure material, an anode expansion of less than 40% and a volumetric capacity of greater than 400 mAh/cm3. In certain embodiments, the C—Si—C composite can exhibit an anode expansion of less than 40% and a volumetric capacity of greater than 500 mAh/cm3. In certain embodiments, the C—Si—C composite can exhibit an anode expansion of less than 40% and a volumetric capacity of greater than 600 mAh/cm3. In certain embodiments, the C—Si—C composite can exhibit an anode expansion of less than 40% and a volumetric capacity of greater than 800 mAh/cm3. In certain embodiments, the C—Si—C composite can exhibit an anode expansion of less than 40% and a volumetric capacity of greater than 1000 mAh/cm3.

In further embodiments, the C—Si—C composite can exhibit, for example when blended with graphite or another suitable matrix or when tested as a pure material, an anode expansion of less than 50% and a volumetric capacity of greater than 400 mAh/cm3. In certain embodiments, the C—Si—C composite can exhibit an anode expansion of less than 50% and a volumetric capacity of greater than 500 mAh/cm3. In certain embodiments, the C—Si—C composite can exhibit an anode expansion of less than 50% and a volumetric capacity of greater than 600 mAh/cm3. In certain embodiments, the C—Si—C composite can exhibit an anode expansion of less than 50% and a volumetric capacity of greater than 800 mAh/cm3. In certain embodiments, the C—Si—C composite can exhibit an anode expansion of less than 50% and a volumetric capacity of greater than 1000 mAh/cm3.

Example 15

Examples of Reactor Types Suitable for Producing Silicon-Impregnated Scaffold The creation of the silicon impregnated scaffold can be accomplished in a variety of reactor types. In some cases, the porous scaffold is a porous carbon scaffold. In some cases, the silicon containing precursor is a gas, for example silane or disilane gas, or a mixture of silicon containing and non-silicon containing (e.g., nitrogen, argon, etc.) gases. In some cases the silicon containing precursor is a liquid, or mixture of liquid and gas. For example, the silicon containing precursor can be trisilane liquid, tetrasilane liquid, or mixtures of such liquids and silicon containing gases such as silane or disilane. The reaction conditions inside the reactor can be varied. For example, the reaction vessel temperature at one or more steps in the process can be controlled to accomplish the decomposition of the silicon containing precursor into silicon. Exemplary ranges of temperature in this regard are 300 to 600 C, for example 300 to 500 C, for example 300 to 400 C, for example 400 to 600 C, for example 400 to 500 C, for example 500 to 600 C. Additionally, the reaction vessel temperature at one or more steps in the process can be controlled to accomplish the decomposition of the hydrocarbon material into carbon. Exemplary ranges of temperature in this regard are 400 to 900 C, for example 400 to 800 C, for example 400 to 700 C, for example 400 to 600 C, for example 400 to 500 C, for example 500 to 900 C, for example 500 to 800 C, for example 500 to 700 C, for example 500 to 600 C, for example 600 to 900 C, for example 600 to 800 C, for example 600 to 700 C, for example 700 to 900 C, for example 700 to 800 C, for example 800 to 900 C. In specific other embodiments, the reaction vessel temperature at one or more steps in the process can be controlled to accomplish the decomposition of the hydrocarbon material into carbon and decomposition of the silicon containing precursor into silicon. Exemplary ranges of temperature in this regard are 400 to 600 C, for example 400 to 500 C, for example 500 to 600 C.

Additionally, the pressure in the reaction vessel can be varied, for example, can be below, equal to, or above atmospheric pressure. In certain embodiments, the temperature and pressure are such that at one or more steps in the process, the silicon containing precursor (or mixtures thereof) exist in a supercritical state. In certain embodiments, the temperature and pressure are such that at one or more steps in the process, the hydrocarbon material (or mixtures thereof) exist in a supercritical state.

A variety of reactor types and configurations can be employed to carry out the current invention. Such reactors include, but are not limited to, tube furnace, fluid bed reactor, rotary kiln reactor, elevator kiln, and roller hearth kilns. In yet further embodiments, the reactor type can comprise, but is not limited to, batch reactors, continuous stirred-tank reactors, plug flow reactors, semi-batch reactors, packed bed reactors, oscillatory baffled reactors, membrane reactors, and tubular reactors.

Example 16

Production of Silicon Carbon Composites from Silane Decomposition on Catalyst-Doped Porous Carbon Materials In certain embodiments the porous carbon scaffold is doped with one or more catalysts. The presence of a catalyst within the porous carbon facilitated the subsequent production of the silicon carbon composite. Without being bound by theory, the presence of catalyst(s) within the pores of the porous carbon provides a site for the silicon-containing reactant, for example the silicon-containing gas, for example silane, to deposit and decompose into the silicon portion of the silicon carbon composite. Importantly, the presence of catalyst(s) within the porous carbon allows for preferential deposition of silicon within the pores of the carbon, as opposed to the outside surface of the carbon particle, or outside the carbon particle itself (for example, on hot reactor walls or other non-carbon surfaces within the compositing reactor). Methods for producing catalyst-doped porous carbon are known in the art, and include admixing of carbon and catalyst, suspension of carbon particles in a solution of catalyst followed by collection of carbon particles and drying, and incorporation of catalyst within the polymer resin from which the porous carbon was produced. Suitable catalysts in this regard include, but are not limited to, nickel, copper, iron, manganese, gold, aluminum, tin, palladium, platinum ruthenium, rhodium, iridium, and combinations thereof. Without being bound by theory, in the case of a metal catalyst, this catalytic effect can proceed via an alloying reaction as in the case of nickel and gold or a hydrogenation effect (such as platinum or nickel) wherein the Si—H bond is more easily cleaved on the metal surface. Suitable precursors for the above catalysts include their salts and other oxidized forms such as their corresponding oxides, halide salts, nitrates, carbonate, carboxylates, sulfates, and the like, and combinations thereof. The level of catalyst within the porous carbon scaffold can be varied, for example from 0.1 to 20%, for example from 0.5% to 10%, for example from 1% to 5%, for example from 1% to 4%. In some embodiments, the catalyst can be removed after the production of the silicon carbon composite, for example by dissolution in media that dissolved the catalyst, but does not dissolve carbon and does not dissolve silicon.

The carbon scaffold can be functionalized with transition metals such as Fe, Ni, Co, Al, Sn, Cu, Mn, Au, Ag, Mg, Ge, Pd, Cr, Mo, Pb, Ga, etc. so as to catalyze the deposition of silicon at lower temperatures than the typical thermal decomposition of the silicon precursor. This would effectively avoid silicon deposition on reactor walls (non-carbon surfaces), improve utilization of the silicon precursor, and improve overall homogeneity of the silicon species on the carbon surface. Depending on the specific catalytic properties of the metal different silicon structures may result. In the case of gold, VLS growth takes place resulting in precipitated silicon nanowires at a low reported temperature of 360° C. (versus ~450° C. needed for silane decomposition to silicon). However other metals (e.g., Ni and Co) may undergo different mechanisms when operating at a low deposition temperature below its silicon eutectic point. This could instead facilitate decomposition via a hydrogenation catalytic effect thereby cleaving the Si—H or Si—X (X=Cl, Br, F, or I) bond and forming silicon at a temperature below the purely thermal decomposition of the precursor.

In a certain embodiment the catalyst-doped porous carbon scaffolds were prepared by suspending carbon particles in aqueous solutions of various metal acetate salts to achieve a target catalyst loading of ~2 wt % after subsequent reduction of the metal catalyst and subsequent silicon deposition using 1.25 mol % $SiH_4/N_2$ gas at a reduced temperature of 430° C. (vs. standard temp of 450° C.) for 2.5 h. The porous carbon employed comprised a mixed micro- and mesoporous structure and a (Dv50) of approximately 20 μm. The data for the carbon scaffolds and the resulting silicon carbon scaffolds are presented in Table 12.

As can be seen, the porous scaffolds that were treated with the catalyst exhibited a reduced pore volume, indicating the catalyst indeed deposited within the porosity of the carbon scaffold. Also as can be seen, all of the silicon carbon composites produced from catalyst-doped porous carbon scaffolds exhibited lower surface area and pore volume compared to the starting, non-catalyst-doped carbon scaffold. These data indicated the utility of the catalyst in promoting the deposition of silicon from decomposition of the silane gas. Also, there was a trend for higher silicon loading for the catalyst-doped silicon carbon scaffold, particularly for when the catalyst was nickel or manganese. The silicon carbon composite produced from the nickel-doped porous carbon was tested electrochemically in a lithium ion half cell as generally described herein. The silicon carbon composite produced from the nickel-doped porous carbon exhibited a first cycle efficiency of 72%, a maximum gravimetric capacity of 1362 mAh/g, and an average Coulombic efficiency of 99.85%, and a capacity retention of 93% at cycle 20. This electrochemical performance demonstrates the utility of the concept of catalyst doping of the porous carbon towards improving utility, scalability, performance, cost or other aspects of the current invention that can be reduced to practice.

TABLE 12

Physicochemical data for various porous carbons and silicon carbon composites according to Example 16.

| Sample Description | Surface Area (m2/g) | Total Pore Volume (cm3/g) | TGA Weight % Silicon |
|---|---|---|---|
| Non-catalyst doped carbon scaffold | 654 | 0.610 | Not applicable |
| Silicon carbon composite made from Non-catalyst doped carbon scaffold | Not measured | | 6% |
| Ni-doped carbon scaffold | 672 | 0.645 | Not applicable |
| Cu-doped carbon scaffold | 667 | 0.630 | Not applicable |
| Mn-doped carbon scaffold | 690 | 0.655 | Not applicable |
| Fe-doped carbon scaffold | 682 | 0.659 | Not applicable |
| Silicon carbon composite produced from Ni-doped carbon scaffold | 340 | 0.313 | 22% |
| Silicon carbon composite produced from Cu-doped carbon scaffold | 543 | 0.523 | 7% |
| Silicon carbon composite produced from Mn-doped carbon scaffold | 399 | 0.378 | 17% |
| Silicon carbon composite produced from Fe-doped carbon scaffold | 562 | 0.539 | 6% |

Example 17

Production of Silicon Carbon Composites from Disilane, Trisilane, or Tetrasilane Decomposition on Catalyst-Doped Porous Carbon Materials The carbon scaffold is loaded into a vessel containing water then stirred and dispersed for a period of time. While stirring, the metal salt is added (e.g., nickel acetate) and allowed to stir for a period of time to facilitate carbon capillary pore uptake of the metal salt. The amount of metal salt in solution is controlled such that a desired M:C ratio (e.g., 2 wt %) can be achieved. Next, a molar excess amount of a reducing agent is added (e.g., NaBH4). During this process the metal is chemically reduced and simultaneously distributed within the carbon pores. At the same time reduction byproducts are generated (e.g., sodium acetate, borate, etc.), which can be removed by rinsing and drying. Lastly, an additional reduction/annealing step by heat treating in a reducing atmosphere (e.g., 5 mol % H2/Ar) is conducted to remove remaining volatiles. In a certain embodiment, the subsequent silicon deposition is carried out with chemical vapor deposition using silane gas as the silicon precursor on the obtained M/C composite material in a furnace at atmospheric pressure and a temperature of ~430° C. yielding the desired Si/C composite. In a certain embodiment, the silicon containing precursor is disilane, trisilane, or tetrasilane, or a mixture thereof, and combined with the metal catalyst doped porous carbon material, and the temperature is raised to achieve decomposition of the silicon containing precursor into silicon that subsequently resides within the porosity of the porous carbon material. The reactor vessel can be below, equal to, or above atmospheric pressure. The reactor vessel temperature can be elevated, example between 150 and 450 C, for example between 200 and 450 C, for example between 300 and 450 C. In certain embodiments, the silicon containing precursor is liquid trisilane or tetrasilane, or a liquid mixture comprising one or more of the following: silane, disilane, trisilane, and tetrasilane. In this embodiment, the pressure can be between 1 and 760 mTorr, and the temperature can be between 300 and 450 C. In certain other embodiments, the silicon containing precursor is a liquid comprising one or more of the following: monochlorosilane, dichlorosilane, trichlorosilane, and tetrachlorosilane. In this embodiment, the pressure can be between 1 and 760 mTorr, and the temperature can be between 300 and 1100 C.

Example 18

Production of Silicon Carbon Composites at or Near the Critical Point of the Silicon-Containing Precursor In certain embodiments, a silicon carbon composite is produced from a porous carbon scaffold and a silicon-containing precursor, wherein the silicon-containing precursor is silane, disilane, trisilane, or tetrasilane, and the temperature and pressure within the reaction vessel correspond to the critical point of the silicon containing precursor. In the specific embodiment wherein the silicon containing precursor is silane, the critical point of silane corresponds to approximately a pressure of 48.4 bar and a temperature of 269.7K. Without being bound by theory, supercritical gases are known to possess unique properties since there is no longer a distinct difference between liquid and gas phases. These materials can easily penetrate solids like gases and are able to dissolve other materials like liquids. Accordingly, there is a strong preference for gas molecules to adsorb at the surface of high surface area carbons. The methane on the surface takes on an even higher density as molecules pack onto monolayers and multilayers with very high density. Controlling the silane gas adsorption behavior of silane at various temperatures and pressures allows for controlling the density of the silane inside carbon pores, provided that the pores are large enough to accommodate the size of the gas molecule. Accordingly, this allows for high silane utilization because silane is preferentially adsorbed on the carbon rather than on the reactor walls. In gas mixtures comprising silane at pressure at or near the critical point, the silane may have a strong preference forming a high density layer at the carbon surface while the carrier gas exists as a sub-critical gas elsewhere in the reactor. In certain embodiments, the gas is pure silane, at or near the critical point of pure silane. In certain other embodiments, the gas is a mixture of silane with an inert carriers gas, and the gas mixture is at or near the critical point of the mixture. The process and reactor described herein are designed to take advantage of this effect by handling carbon, silane, and carrier gas at a temperature where silane can decompose but at a pressure where the silane has a strong preference for the surface of our carbon material.

It is known that silane gas decomposing on the surface of a carbon material will eventually block the open pores unless silane is allowed to penetrate the pores as a gas before decomposing into a solid. There is a need to allow silane gas to penetrate the pores before reaching a decomposition condition. One way to achieve this result is to move the carbon material in the presence of silane gas in and out of a thermal zone where decomposition occurs. An auger system or other physical conveyance could be used to move carbon substrate material in and out of hot zone under flowing silane. While the material is in a cool zone below the silane decomposition temperature, the silane gas could be allowed to penetrate the pores of the carbon. As the material with silane in the pores is conveyed into the hot zone, the silane would decompose. The material could then be conveyed out of the hot zone such that silane gas could again reach the surface and the process can be repeated. Various methods of material conveyance can be envisioned such as fluidized bed, conveyors, lifters, rotary tubes, etc. Other methods to control the manipulation of the silane decomposition reaction can be used including the presence of catalysts at the surface of the carbon (described elsewhere within this disclosure) or microwave radiation to heat the surface of the carbon above and below the decomposition temperature (also described elsewhere within this disclosure). In certain embodiments, the carbon is heated in a oscillatory fashion via microwave heating, with the carbon temperature being cycled over a range, for example from 350 to 550 C, for example from 375 to 525 C, for example from 400 to 500 C, for example from 425 to 475 C. In certain embodiments, the gas is provided as a continuous flow of a silicon-containing gas, for example silane gas. In other embodiments, the gas is provided as a continuous flow of a silicon-containing gas and an inert carrier gas, for example a mixture of silane gas and nitrogen gas. In the latter embodiment, the silane within the mixture can comprise various levels, for example from 0.1 to 90%, for example from 0.5% to 50%, for example from 1.0% to 25%, for example from 1.0% to 10%, for example from 1.0% to 5.0%.

The total pressure of the mixture can be varied, for example the pressure can be at or below atmospheric pressure. For example, the pressure can be in the range of 0.001 bar to 1.5 bar, for example, 0.005 bar to 1.1 bar, for example from 0.01 bar to 1.013 bar, for example from 0.01 bar to 0.5 bar, for example from 0.01 bar to 0.25 bar, for example from 0.01 bar to 0.1 bar, for example from 0.01 bar to 0.05 bar, for example from 0.01 bar to 0.02 bar.

In certain other embodiments, the total pressure of the mixture can be at or above atmospheric, for example at or near the critical point of the mixture. For example, the pressure can be in the range of 1 bar to 100 bar, for example from 10 bar to 60 bar, for example from 45 bar to 55 bar.

In certain other embodiments, the total pressure of the mixture is cycled. For example, the pressure can be cycled between 0.001 bar and 100 bar, for example between 0.001 and 2 bar, example between 0.01 and 1.5 bar, for example between 0.05 and 1.1 bar, for example between 0.1 and 1.013 bar. In certain embodiments, the composition of the gas mixture is also cycled, for example, during the period where in the temperature is at the low end of the cycle, the gas mixture comprises the silicon-containing precursor, and during the period where in the temperature is at the low end of the cycle, the gas mixture is devoid of the silicon-containing precursor.

In certain other embodiments, the total pressure of the mixture is cycled. For example, the pressure can be cycled between 1 bar and 100 bar, for example between 10 and 60 bar, example between 45 and 55 bar. In certain embodiments, the composition of the gas mixture is also cycled, for example, during the period where in the temperature is at the low end of the cycle, the gas mixture comprises the silicon-containing precursor, and during the period where in the temperature is at the low end of the cycle, the gas mixture is devoid of the silicon-containing precursor.

In certain embodiments, the silicon carbon composite is passivated prior to exposure to air, in order to achieve an oxygen-rich layer on any silicon surfaces that have access to the gas phase. This passivation step is required since it is known in the art that freshly formed silicon (e.g., never been exposed to oxygen) is pyrophoric. For this reason, the formed composite should be passivated under air in a gradual way before removing it from the reactor to avoid hazardous conditions. In certain instances, passivation at room temperature has not been adequate and after some time after air has diffused into the powder bed or into the porous structure of a composite, the silicon-oxygen reaction has created an exothermic condition in an unexpected manner. One way to avoid this, may be to conduct the air passivation at elevated temperatures to improve gas diffusion through the particle bed and into the pores of the composite. This should be done at a low enough temperature so as to prevent large scale oxidation of the fresh silicon which would reduce lithium capacity but at a high enough temperature to improve diffusion and ensure complete passivation. In other methods alternate oxidizing agents could be used to control this reaction such as CO2, CO, and other species as known in the art.

Embodiments of the present invention include, but are not limited to, the following:

Embodiment 1. A method for producing a composite material comprising a porous carbon scaffold and silicon, comprising the following steps:

a. mixing polymer precursors materials and storing the resulting mixture for a period of time at sufficient temperature to allow for polymerization of the precursors;
b. carbonizing the resulting polymer material to create a porous carbon material;
c. subjecting the porous carbon material to elevated temperature in the presence of a silicon-containing precursor and a hydrocarbon material that decomposes at a higher temperature than the silicon containing precursor;
d. elevating the temperature to decompose the silicon containing precursor, resulting in a silicon impregnated carbon materials; and
e. further elevating the temperature to decompose the hydrocarbon material, resulting in a carbon-coated, silicon impregnated carbon material.

Embodiment 2. A method for producing a composite material comprising a porous carbon scaffold and silicon, comprising the following steps:

a. mixing polymer precursors materials and storing the resulting mixture for a period of time at sufficient temperature to allow for polymerization of the precursors;
b. carbonizing the resulting polymer material to create a porous carbon material;
c. subjecting the porous carbon material to elevated temperature in the presence of a silicon-containing precursor and a hydrocarbon material that decomposes at a similar temperature compared to the silicon containing precursor; and
d. elevating the temperature to simultaneously decompose the silicon containing precursor into silicon and decomposethe hydrocarbon material into carbon, resulting in a carbon-coated, silicon impregnated carbon material.

Embodiment 3. A method for producing a porous silicon material comprising the following steps:

a) providing a porous disposable scaffold;
b) impregnating silicon within the porous disposable scaffold via decomposition of a silicon containing precursor material; and
c) thermally decomposing or dissolving the porous disposable scaffold, thereby producing a porous silicon material substantially free of the porous disposable scaffold.

Embodiment 4. The method of any one of embodiments 1 through 3 wherein the impregnation of silicon is accomplished by processing in a reactor at a temperature between 450 and 700 C in the presence of a silicon-containing gas.

Embodiment 5. The method of any one of embodiments 1 through 3 wherein the impregnation of silicon is accomplished by processing in a reactor at a temperature between 450 and 600 C in the presence of silane.

Embodiment 6. The method of any one of embodiments 1 to 3, wherein the silicon containing precursor is silane, disilane, trisilane, tetrasilane, or a combination thereof.

Embodiment 7. The method of any one of embodiments 1 to 2, wherein the hydrocarbon material is methane, ethane, propane, butane, pentane, heptane, hexane, cyclohexane, octane, nonane or decane, or a combination thereof.

Embodiment 8. The method of any one of embodiments 1 to 7, wherein the reaction vessel pressure is below atmospheric pressure.

Embodiment 9. The method of any one of embodiments 1 to 7, wherein the reaction vessel pressure is at atmospheric pressure.

Embodiment 10. The method of any one of embodiments 1 to 7, wherein the reaction vessel pressure is above atmospheric pressure.

Embodiment 11. The method of any one of embodiments 1 to 7, wherein at one or more steps the reaction vessel pressure and temperature are such that the silicon containing precursor is in the supercritical state.

Embodiment 12. The method of any one of embodiments 1 to 2, wherein at one or more steps the reaction vessel pressure and temperature are such that the hydrocarbon material is in the supercritical state.

Embodiment 13. The method of any one of embodiments 1 to 7, where the reactor type is a tube furnace, fluid bed reactor, rotary kiln reactor, elevator kiln, or roller hearth kiln.

Embodiment 14. The method of any one of embodiments 1 to 7, where the reactor type comprises a batch reactor, continuous stirred-tank reactor, plug flow reactor, semi-batch reactor, packed bed reactor, oscillatory baffled reactor, membrane reactor, or tubular reactor.

Embodiment 15. A method for producing a composite material comprising a porous carbon scaffold and silicon comprising the following steps:

a. mixing polymer precursors materials and storing the resulting mixture for a period of time at sufficient temperature to allow for polymerization of the precursors;
b. carbonizing the resulting polymer material to create a porous carbon material;
c. subjecting the porous carbon material to the presence of a silicon containing precursor and cycling the temperature over a range, wherein the lower end of the range is below the decomposition temperature of the silicon containing precursor, and the upper end of the range is above the decomposition temperature of the silicon containing precursor.

Embodiment 16. The method of embodiment 15, wherein the silicon containing precursor is silane.

Embodiment 17. A method for producing a composite material comprising a porous carbon scaffold and silicon, comprising the following steps:

a. mixing polymer precursors materials and storing the resulting mixture for a period of time at sufficient temperature to allow for polymerization of the precursors;
b. carbonizing the resulting polymer material to create a porous carbon material; and
c. subjecting the porous carbon material to the presence of a silicon containing precursor and cycling the pressure over a range, wherein the lower end of the range is below the critical pressure of the silicon containing precursor, and the upper end of the range is above the critical pressure of the silicon containing precursor.

Embodiment 18. The method of embodiment 17, wherein the silicon containing precursor is silane.

Embodiment 19. The method of any one of embodiments 1-18, further comprising contacting the porous scaffold with a catalyst prior to contacting the scaffold with the silicon-containing precursor.

Embodiment 20. The method of embodiment 19, wherein the catalyst is aluminum, nickel or manganese, or combinations thereof.

All of the U.S. patents, U.S. patent application publications, U.S. patent applications, foreign patents, foreign patent applications and non-patent publications referred to in this specification, including U.S. Provisional Patent Application No. 62/469,424, filed Mar. 9, 2017, to which the present application claims priority are incorporated herein by reference, in their entireties to the extent not inconsistent with the present description. Aspects of the embodiments can be modified, if necessary to employ concepts of the various patents, applications and publications to provide yet further embodiments. These and other changes can be made to the embodiments in light of the above-detailed description.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for producing a composite material comprising a porous carbon scaffold and silicon, comprising the following steps:

a. mixing polymer precursors and storing the resulting mixture for a period of time at sufficient temperature to allow for polymerization of the precursors to form a polymer material;
b. carbonizing the resulting polymer material to create a porous carbon material;
c. subjecting the porous carbon material to elevated temperature in a reaction vessel in the presence of a silicon-containing precursor and a hydrocarbon material that decomposes at a higher temperature than the silicon containing precursor;
d. elevating the temperature to between 300° C. and 500° C. to decompose the silicon containing precursor, thereby impregnating silicon into pores of the porous carbon material, resulting in a silicon impregnated carbon material;
e. further elevating the temperature to decompose the hydrocarbon material, resulting in a carbon-coated, silicon impregnated carbon material, wherein the impregnating of the silicon into the pores of the porous carbon material reduces a pore volume of the silicon impregnated carbon material relative to a pore volume of the porous carbon material;
f. doping the silicon impregnated carbon material with lithium, wherein the ratio of lithium atoms to carbon atoms is between 0.05:6 and about 1.9:6.

2. The method of claim 1, wherein the doping with lithium is accomplished by a chemical reaction or electrochemical reaction.

3. The method of claim 1, further comprising activating the porous carbon material after carbonizing, the activating at a temperature of 950° C. in the presence of steam or carbon dioxide.

4. The method of claim 1, wherein the silicon is impregnated into the pores of the porous carbon material by processing in a reactor at a temperature between 300° C. and 500° C. in the presence of a silicon-containing gas.

5. The method of claim 1, wherein the silicon containing precursor is silane, disilane, trisilane, tetrasilane, or a combination thereof.

6. The method of claim 1, wherein the hydrocarbon material is methane, ethane, propane, butane, pentane, heptane, hexane, cyclohexane, octane, nonane, decane, or a combination thereof.

7. The method of claim 1, wherein the reaction vessel pressure is below atmospheric pressure.

8. The method of claim 1, wherein the reaction vessel pressure is at atmospheric pressure.

9. The method of claim 1, wherein the reaction vessel pressure is above atmospheric pressure.

10. The method of claim 1, wherein the reaction vessel is a tube furnace, fluid bed reactor, rotary kiln reactor, elevator kiln, or roller hearth kiln.

11. The method of claim 1, wherein the reaction vessel comprises a batch reactor, continuous stirred-tank reactor, plug flow reactor, semi-batch reactor, packed bed reactor, oscillatory baffled reactor, membrane reactor, or tubular reactor.

12. The method of claim 1, further comprising contacting the porous carbon material with a catalyst prior to contacting the porous carbon material with the silicon-containing precursor.

13. The method of claim 12, wherein the catalyst is aluminum, nickel or manganese, or combinations thereof.

14. The method of claim 1, wherein at one or more of steps c, d and e, the reaction vessel pressure and temperature are such that the hydrocarbon material is in the supercritical state.

15. The method of claim 1, wherein silicon embedded within the porous carbon material occupies between 20% and 80% of the total available pore volume within the porous carbon material.

16. The method of claim 1, wherein greater than 95% of the total pore volume of the porous carbon material resides in pores having a diameter of 1 nm or less.

17. The method of claim 1, wherein greater than 95% of the total pore volume of the porous carbon material resides in pores having a diameter of 10 nm or less.

18. The method of claim 1, further comprising activating the porous carbon material after carbonizing, the activating at a temperature of 950° C. in the presence of steam or carbon dioxide.

19. A method for producing a composite material comprising a porous carbon scaffold and silicon, comprising the following steps:

a. mixing polymer precursors and storing the resulting mixture for a period of time at sufficient temperature to allow for polymerization of the precursors to form a polymer material;

b. carbonizing the resulting polymer material to create a porous carbon material subjecting the porous carbon material to elevated temperature in the presence of a silicon-containing precursor and a hydrocarbon material that decomposes at a similar temperature compared to the silicon containing precursor;

c. elevating the temperature to simultaneously decompose the silicon containing precursor into silicon and decompose the hydrocarbon material into carbon, resulting in a carbon-coated, silicon impregnated carbon material, wherein impregnation of the silicon into pores of the porous carbon material reduces a pore volume of the carbon-coated, silicon impregnated carbon material relative to a pore volume of the porous carbon material; and d. doping the silicon impregnated carbon material with lithium, wherein the ratio of lithium atoms to carbon atoms is between 0.05:6 and about 1.9:6.

20. The method of claim 19, wherein greater than 95% of the total pore volume of the porous carbon material resides in pores having a diameter of 10 nm or less.

* * * * *